United States Patent
Hasegawa et al.

(10) Patent No.: US 7,050,275 B2
(45) Date of Patent: May 23, 2006

(54) EXCHANGE COUPLED FILM HAVING IMPROVED CURRENT-CARRYING RELIABILITY AND IMPROVED RATE OF CHANGE IN RESISTANCE AND MAGNETIC SENSING ELEMENT USING SAME

(75) Inventors: Naoya Hasegawa, Niigata-ken (JP); Masamichi Saito, Niigata-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 558 days.

(21) Appl. No.: 10/079,292

(22) Filed: Feb. 20, 2002

(65) Prior Publication Data

US 2002/0191356 A1 Dec. 19, 2002

(30) Foreign Application Priority Data

Feb. 20, 2001 (JP) ............................ 2001-042908
Mar. 22, 2001 (JP) ............................ 2001-081820

(51) Int. Cl.
*G11B 5/127* (2006.01)
*G11B 5/33* (2006.01)

(52) U.S. Cl. ............................................. 360/324.11
(58) Field of Classification Search .............. 360/324, 360/324.1, 324.11, 324.12; 428/679, 666, 428/667
See application file for complete search history.

(56) References Cited

U.S. PATENT DOCUMENTS

| | | | |
|---|---|---|---|
| 5,731,936 A * | 3/1998 | Lee et al. ............. | 360/327.22 |
| 5,958,611 A * | 9/1999 | Ohta et al. ............. | 360/324.11 |
| 6,046,892 A | 4/2000 | Aoshima et al. ............. | 360/113 |
| 6,141,191 A | 10/2000 | Lee et al. ................ | 360/324.1 |
| 6,222,707 B1 | 4/2001 | Huai et al. ................ | 360/324.1 |
| 6,258,468 B1 | 7/2001 | Mahvan et al. ............. | 428/679 |
| 6,387,548 B1 | 5/2002 | Hasegawa et al. | |
| 6,456,469 B1 * | 9/2002 | Gill ........................ | 360/324.11 |
| 6,498,707 B1 | 12/2002 | Gao et al. | |
| 6,577,477 B1 | 6/2003 | Lin | |
| 6,678,128 B1 | 1/2004 | Saito et al. | |
| 6,879,472 B1 | 4/2005 | Saito et al. | |

FOREIGN PATENT DOCUMENTS

| | | | |
|---|---|---|---|
| JP | 9-82524 | | 3/1997 |
| JP | 10214716 A | * | 8/1998 |
| JP | 11191647 A | * | 7/1999 |
| JP | 2000-31562 | | 1/2000 |
| JP | 2000-150235 | | 5/2000 |

* cited by examiner

*Primary Examiner*—Angel Castro
*Assistant Examiner*—Christopher R. Magee
(74) *Attorney, Agent, or Firm*—Brinks Hofer Gilson & Lione

(57) ABSTRACT

A seed layer having a chromium content in the range of 35 to 60 atomic percent and a thickness of 10 to 200 Å is deposited to have a single phase of the face-centered cubic structure by optimizing the sputtering conditions, etc. The surface of the seed layer maintaining the face-centered cubic structure exhibits improved wettability, and the rate of change in resistance $\Delta R/R$ can thereby be improved.

33 Claims, 21 Drawing Sheets

EXCHANGE COUPLED FILM HAVING IMPROVED CURRENT-CARRYING RELIABILITY AND IMPROVED RATE OF CHANGE IN RESISTANCE AND MAGNETIC SENSING ELEMENT USING SAME

This application claims the benefit of priority to Japanese Patent Applications 2001-0429028, filed on Feb. 20, 2001 and 2001-081820, filed on Mar. 22, 2001.

BACKGROUND OF THE INVENTION

1. Field of the Invention

The present invention relates to an exchange coupled film which includes a seed layer, an antiferromagnetic layer, and a ferromagnetic layer deposited in that order from the bottom and in which the magnetization direction of the ferromagnetic layer is pinned in a predetermined direction by an exchange coupling magnetic field produced at the interface between the antiferromagnetic layer and the ferromagnetic layer, and to a magnetic sensing element, such as a spin-valve thin-film element or anisotropic magnetoresistive (AMR) element, using the exchange coupled film. More particularly, the invention relates to an exchange coupled film in which current-carrying reliability (electromigration resistance) and the rate of change in resistance can be appropriately improved even if the recording density is increased, and to a magnetic sensing element using such an exchange coupled film.

2. Description of the Related Art

FIG. 18 is a partial sectional view of a conventional spin-valve thin-film element, viewed from a surface facing a recording medium.

As shown in FIG. 18, an antiferromagnetic layer 30, a pinned magnetic layer 31, a nonmagnetic interlayer 32, a free magnetic layer 33, and a protective layer 7 are deposited in that order on a seed layer 14 which is, for example, composed of a NiFeCr alloy.

In such a spin-valve thin-film element, an exchange coupling magnetic field is produced at the interface between the antiferromagnetic layer 30 and the pinned magnetic layer 31 by annealing, and the magnetization of the pinned magnetic layer 31 is pinned in the height direction (in the Y direction in the drawing).

In the spin-valve thin-film element shown in FIG. 18, hard bias layers 5 are formed at both sides of a laminate including the seed layer 14 to the protective layer 7, and the magnetization of the free magnetic layer 33 is aligned in the track width direction (in the X direction in the drawing) by a longitudinal bias magnetic field from the hard bias layers 5.

As shown in FIG. 18, electrode layers 8 are disposed on the hard bias layers 5. Although a sensing current from one of the electrode layers 8 needs to flow through three layers, i.e., the pinned magnetic layer 31, the nonmagnetic interlayer 32, and the free magnetic layer 33, the sensing current is also shunted to the seed layer 14 and the antiferromagnetic layer 30 in this structure.

By providing the seed layer 14 under the antiferromagnetic layer 30, the {111} orientations of the individual layers formed on the seed layer 14 are improved, and the crystal grain size in the planar direction of the layers (in the X-Y planar direction) is considered to be increased, and therefore, an improvement in current-carrying reliability, for example, electromigration resistance, an improvement in the rate of change in resistance ($\Delta R/R$), and an improvement in the soft magnetic properties of the free magnetic layer 33 are expected.

In order to improve the {111} orientations of the individual layers formed on the seed layer 14 and to increase the crystal grain size in the planar direction, the seed layer 14 must have a face-centered cubic structure (fcc structure) and the surface of the seed layer 14 must have satisfactory wettability. If the surface of the seed layer 14 has satisfactory wettability, when the antiferromagnetic layer 30 is deposited on the seed layer 14 by sputtering, the atoms of the antiferromagnetic material constituting the antiferromagnetic layer 30 do not easily aggregate, and the orientation in the planar direction of the antiferromagnetic layer 30 can be more strongly aligned to the {111} plane which is the closest-packed plane.

Although the higher Cr content in the seed layer 14 is considered to be preferable in order to improve the wettability, if the Cr content becomes excessive, a body-centered cubic structure (bcc structure) starts to appear in the crystal structure in addition to the face-centered cubic structure (fcc structure), and therefore, the {111} orientations of the individual layers on the seed layer 14 are degraded, resulting in a degradation in current-carrying reliability and a decrease in the rate of change in resistance.

In the known art, by setting the Cr content in the seed layer 14 at 35 atomic percent or less, or at 40 atomic percent or less, the crystal structure of the seed layer 14 is kept in the face-centered cubic structure.

However, as the recording density is increased, spin-valve thin-film elements are further miniaturized, and thereby the density of the sensing current flowing in the spin-valve thin-film elements is increased. Consequently, electromigration may occur, the rate of change in resistance may be decreased due to an increase in resistance, and noise may occur.

In order to overcome the problems described above, it is effective to improve the wettability of the surface of the seed layer 14 so that the {111} orientations of the individual layers on the seed layer 14 are further improved, and to increase the crystal grain size in the planar direction so that the electric conductivity is improved. For that purpose, the Cr content in the seed layer 14 must be increased more than which has been conventionally set. However, if the Cr content is set at 35 to 40 atomic percent or more, the body-centered cubic structure (bcc structure) appears in the crystal structure of the seed layer 14 in addition to the face-centered cubic structure.

If the body-centered cubic structure is mixed with the face-centered cubic structure in the seed layer 14, the {111} orientations of the individual layers deposited on the seed layer 14 cannot be improved, and the crystal grain size cannot be increased, resulting in a decrease in the electric conductivity. Consequently, it is not possible to produce a spin-valve thin-film element which is suitable for increasing the recording density using the conventional seed layer 14.

SUMMARY OF THE INVENTION

Objects of the present invention are to provide an exchange coupled film in which the wettability of a seed layer can be improved while the crystal structure of the seed layer is kept in a face-centered cubic structure by appropriately adjusting the composition and thickness of the seed layer, and thus the current-carrying reliability and the rate of change in resistance can be improved, and to provide a magnetic sensing element using the exchange coupled film.

Other objects of the present invention are to provide an exchange coupled film having a multi-layered seed layer in which the wettability of the seed layer can be improved while the crystal structure of the seed layer is kept in a face-centered cubic structure by appropriately adjusting the composition and thickness of the seed layer, and thus the current-carrying reliability and the rate of change in resistance can be improved, to provide a magnetic sensing element using the exchange coupled film, to provide a method for making the exchange coupled film, and to provide a method for making the magnetic sensing element.

In one aspect of the present invention, an exchange coupled film includes a nonmagnetic seed layer, an antiferromagnetic layer, and a ferromagnetic layer deposited in that order from the bottom, the magnetization of the ferromagnetic layer being directed in a predetermined direction by an exchange coupling magnetic field produced at the interface between the antiferromagnetic layer and the ferromagnetic layer. The seed layer contains α and Cr, α being at least one of Fe, Ni, and Co, and the Cr content is 35 to 60 atomic percent. The thickness of the seed layer is 10 to 200 Å, and the crystal structure of the seed layer is a face-centered cubic structure.

In the exchange coupled film of the present invention, since the Cr content in the seed layer is high at 35 to 60 atomic percent, the wettability at the surface of the seed layer can be improved.

Wettability is improved when the surface energy increases so that the surface becomes active. In order to improve the wettability, it is important to increase the Cr content in the seed layer. Other important factors are the temperature of the surface of a substrate for forming the seed layer, the distance between the substrate and a target, the Ar pressure, the sputtering rate, etc. in the process of forming the seed layer.

If the Cr content in the seed layer is low and the surface of the seed layer has unsatisfactory wettability, as shown in FIG. 5, the atoms sputtered to the surface of the seed layer do not move sufficiently over the surface and easily aggregate to form nuclei. The formation of such nuclei can be observed by an electron microscope.

When the nuclei are formed and the atoms are deposited so as to form a so-called "island structure", the orientation in the planar direction (i.e., a direction parallel to the layer surface) of an antiferromagnetic layer formed on the seed layer by sputtering is not easily brought close to the {111} orientation corresponding to the closest-packed plane.

In contrast, if the Cr content in the seed layer is high and the surface of the seed layer has satisfactory wettability, as shown in FIG. 6, the atoms sputtered to the surface of the seed layer move sufficiently over the surface and do not aggregate. In such a case, the orientation in the planar direction of an antiferromagnetic layer formed on the seed layer is easily brought close to the {111} orientation corresponding to the closest-packed plane.

In the present invention, since the surface of the seed layer has satisfactory wettability, the orientations in the planar direction of the individual layers formed on the seed layer can be more strongly aligned to the {111} plane which is the closest-packed plane.

In the exchange coupled film of the present invention, the crystal structure of the seed layer is a face-centered cubic structure (fcc structure).

FIG. 9 is a ternary equilibrium diagram of a NiFeCr alloy, which shows the relationships between the contents of the individual elements and the crystal structures of the NiFeCr alloy. As shown in FIG. 9, in the case of a bulk alloy, a borderline indicated by a dotted chain line extends from a point of 40 atomic percent on the axis of the Cr content in a direction in which the Fe content is increased and the Ni content is decreased. In a zone at the left side of the borderline in which the Cr content is low, the crystal structure of the NiFeCr alloy is a face-centered cubic structure (fcc structure), and in a zone at the right side of the borderline in which the Cr content is high, a body-centered cubic structure (bcc structure) is also present in the crystal structure of the NiFeCr alloy in addition to the face-centered cubic structure.

As is obvious from the diagram, when the atomic ratio of Ni to Fe is 8:2, with a Cr content of 35 atomic percent being a borderline, if the Cr content is less than 35 atomic percent, the crystal structure of the NiFeCr alloy only includes the face-centered cubic structure, and if the Cr content is more than 35 atomic percent, the crystal structure of the NiFeCr alloy includes a mixed phase of the face-centered cubic structure and the body-centered cubic structure.

Strictly speaking, there is a difference in the state between the case of the bulk alloy and the case of a sputtered thin film. In the case of the sputtered thin film, the state may be brought close to the nonequilibrium state. Therefore, even if the body-centered cubic structure is present in addition to the face-centered cubic structure at a certain compositional ratio in the case of the bulk alloy, the sputtered thin film does not necessarily have such a state. In order to adjust the compositional ratio in the sputtered thin film based on the known equilibrium diagram in the case of the bulk alloy, it has been the practice to set the Cr content at 35 atomic percent or less (particularly when the atomic ratio of Ni to Fe is 8:2), or at 40 atomic percent or less, so that the body-centered cubic structure is not mixed in the crystal structure.

In contrast, in the present invention, the Cr content is high at 35 to 60 atomic percent, and if the equilibrium diagram in the bulk alloy (FIG. 9) is taken into consideration, the crystal structure in this range obviously has a mixture of the face-centered cubic structure and the body-centered cubic structure. However, in the present invention, even in such a range, the crystal structure can be composed of the face-centered cubic structure only. The reason for this is closely related to the thickness of the seed layer.

In the present invention, the thickness of the seed layer is in the range of 10 to 200 Å. If the thickness of the seed layer is set at more than 200 Å, even if the Cr content is 35 atomic percent, the body-centered cubic structure starts to appear. However, if the thickness of the seed layer is set at 200 Å or less and the Cr content is adjusted within the range of 35 to 60 atomic percent, the crystal structure can be just composed of the face-centered cubic structure.

This is because the thickness of the seed layer is small. By decreasing the thickness of the seed layer as described above, even in the nonequilibrium state, since the energy is not very high, the equilibrium state occurring in the case of the bulk alloy is unlikely to occur and a metastable state is brought about, and thus the crystal structure can be appropriately kept in the face-centered cubic structure.

However, as will be described below with reference to a graph, it is necessary to decrease the thickness of the seed layer as the Cr content is increased in order to obtain the metastable state so that the crystal structure is composed of the face-centered cubic structure only.

Even if the thickness of the seed layer is less than 10 Å, although the crystal structure can be kept in the face-centered cubic structure, since the {111} orientation of the seed layer becomes insufficient, the crystal orientations of the individual layers formed on the seed layer cannot be appropriately {111} oriented. Therefore, the lower limit of the thickness of the seed layer is set at 10 Å in the present invention.

As described above, in the present invention, by setting the Cr content of the seed layer at 35 to 60 atomic percent, the wettability of the surface of the seed layer is improved, and also, by adjusting the thickness within the range of 10 to 200 Å, the crystal structure of the seed layer can be just composed of the face-centered cubic structure. Consequently, the orientations in the planar direction of the individual layers deposited on the seed layer can be satisfactorily {111} oriented, and the crystal grain size in the planar direction of the layers can be increased.

As the crystal grain size increases, the resistance decreases, resulting in a decrease in Joule heat. Since the {111} plane which is the closest-packed plane is preferred to be oriented parallel to the layer surface, diffusion does not easily occur between the adjoining layers. As a result, electromigration resistance can be improved and current-carrying reliability can be improved.

Since the resistance is decreased, electric conductivity is improved, and therefore, in the magnetic sensing element described below, it is possible to improve the rate of change in resistance ($\Delta R/R$), the change in conductivity ($\Delta G$), and the soft magnetic properties of the free magnetic layer.

In the exchange coupled film of the present invention, preferably, the Cr content is 40 to 60 atomic percent, and the thickness of the seed layer is 10 to 170 Å.

Preferably, the Cr content is 45 to 60 atomic percent, and the thickness of the seed layer is 10 to 130 Å.

More preferably, the Cr content is 40 to 50 atomic percent, and the thickness of the seed layer is 10 to 170 Å.

More preferably, the Cr content is 45 to 55 atomic percent, and the thickness of the seed layer is 10 to 130 Å.

By setting the Cr content and thickness within the ranges described above, as will be confirmed by testing described below, the rate of change in resistance ($\Delta R/R$) and the change in conductivity ($\Delta G$) can be further improved, the average crystal grain size can be further increased, and the heat resistance temperature can be further improved.

In each of the preferable Cr contents, by appropriately adjusting the thickness within the range described above, the crystal structure can be just composed of the face-centered cubic structure.

Preferably, the thickness of the seed layer is 80 Å or less.

More preferably, the thickness of the seed layer is 60 Å or less.

By setting the thickness at 80 Å or less, or 60 Å or less, the crystal structure can be just composed of the face-centered cubic structure reliably, and also the shunt loss of the sensing current can be more appropriately decreased.

In the exchange coupled film of the present invention, preferably, the seed layer is composed of a NiFeCr alloy or a NiCr alloy.

Preferably, the composition of the seed layer is represented by $(Ni_{100-x}Fe_x)$—Cr, and the atomic ratio x satisfies the relationship $0 \leq x \leq 70$. More preferably, the atomic ratio x satisfies the relationship $0 \leq x \leq 50$. Most preferably, the atomic ratio x satisfies the relationship $0 \leq x \leq 30$.

In the exchange coupled film of the present invention, preferably, an underlayer composed of at least one element selected from the group consisting of Ta, Hf, Nb, Zr, Ti, Mo, and W is formed under the seed-layer. Consequently, the crystal structure of the seed layer can be appropriately set to be the face-centered cubic structure.

Preferably, the seed layer is formed by sputtering. Consequently, the seed layer does not have the same equilibrium state as that of the bulk alloy, and even if the Cr content is 35 atomic percent or more, a metastable state is formed, and the crystal structure is easily set to be the face-centered cubic structure.

In the exchange coupled film of the present invention, the average crystal grain size in a direction parallel to the layer surface in each layer formed on the seed layer is preferably 100 Å or more, more preferably, 150 Å or more, and most preferably, 170 Å or more.

In the exchange coupled film of the present invention, preferably, the grain boundaries formed in the antiferromagnetic layer and the grain boundaries formed in the ferromagnetic layer which appear in a cross section of the exchange coupled film parallel to the thickness direction are at least partially discontinuous at the interface between the antiferromagnetic layer and the ferromagnetic layer.

In the exchange coupled film of the present invention, preferably, the grain boundaries formed in the antiferromagnetic layer and the grain boundaries formed in the seed layer which appear in a cross section of the exchange coupled film parallel to the thickness direction are at least partially discontinuous at the interface between the antiferromagnetic layer and the seed layer.

In the exchange coupled film of the present invention, preferably, equivalent crystal planes represented as {111} planes in the antiferromagnetic layer and the ferromagnetic layer are preferentially oriented as crystal planes parallel to the interface between the antiferromagnetic layer and the ferromagnetic layer, and at least some of the equivalent crystal axes in the crystal planes are directed in different directions between the antiferromagnetic layer and the ferromagnetic layer.

In the exchange coupled film of the present invention, preferably, equivalent crystal planes represented as {111} planes in the antiferromagnetic layer and the seed layer are preferentially oriented as crystal planes parallel to the interface between the antiferromagnetic layer and the seed layer, and at least some of the equivalent crystal axes in the crystal planes are directed in different directions between the antiferromagnetic layer and the seed layer.

Preferably, the antiferromagnetic layer is composed of X and Mn, where X is at least one element selected from the group consisting of Pt, Pd, Ir, Rh, Ru, and Os.

The antiferromagnetic layer may be composed of an X—Mn—X' alloy, where X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb, and rare-earth elements.

In such a case, preferably, the X—Mn—X' alloy is either an interstitial solid solution in which atoms of X' enter interstices in a space lattice composed of X and Mn or a substitutional solid solution in which atoms of X' are substituted for some atoms at the lattice points of a crystal lattice composed of X and Mn.

Preferably, the X content or the X+X' content is 45 to 60 atomic percent.

In another aspect of the present invention, a magnetic sensing element includes a seed layer, an antiferromagnetic layer, a pinned magnetic layer, a nonmagnetic interlayer, and a free magnetic layer deposited in that order from the bottom, the magnetization of the free magnetic layer being aligned in a direction substantially perpendicular to the magnetization direction of the pinned magnetic layer. The seed layer, the antiferromagnetic layer, and the pinned magnetic layer constitute the exchange coupled film described above.

In another aspect of the present invention, a magnetic sensing element includes a seed layer, an antiferromagnetic exchange bias layer, a free magnetic layer, a nonmagnetic interlayer, a pinned magnetic layer, and an antiferromagnetic layer deposited in that order from the bottom, the magnetization of the free magnetic layer being aligned in a direction substantially perpendicular to the magnetization direction of the pinned magnetic layer. The seed layer, the exchange bias layer, and the free magnetic layer constitute the exchange coupled film described above.

In another aspect of the present invention, a magnetic sensing element includes a free magnetic layer; an upper nonmagnetic interlayer disposed over the free magnetic layer; a lower nonmagnetic interlayer disposed under the free magnetic layer; an upper pinned magnetic layer disposed over the upper nonmagnetic interlayer; a lower pinned magnetic layer disposed under the lower nonmagnetic interlayer; an upper antiferromagnetic layer disposed over the upper pinned magnetic layer; a lower antiferromagnetic layer disposed under the lower pinned magnetic layer; and a seed layer disposed under the lower antiferromagnetic layer, the magnetization of the free magnetic layer being aligned in a direction substantially perpendicular to the magnetization direction of the pinned magnetic layers. The seed layer, the lower antiferromagnetic layer, and the lower pinned magnetic layer constitute the exchange coupled film described above.

In another aspect of the present invention, a magnetic sensing element includes a seed layer, an antiferromagnetic exchange bias layer, a magnetoresistive layer, a nonmagnetic layer, and a soft magnetic layer deposited in that order from the bottom. The seed layer, the exchange bias layer, and the magnetoresistive layer constitute the exchange coupled film described above.

Since the exchange coupled films are used in the magnetic sensing elements, electromigration resistance and current-carrying reliability can be improved. Furthermore, the rate of change in resistance ($\Delta R/R$) can be improved, and thermal noise can be reduced.

Moreover, it is possible to decrease the in-plane crystal magnetic anisotropy energy K when the magnetization rotates in the free magnetic layer or the magnetoresistive layer. Consequently, the coercive force Hc which is proportional to the in-plane crystal magnetic anisotropy energy K can also be decreased, and the magnetization of the free magnetic layer can be rotated with good sensitivity to an external magnetic field.

In the present invention, even if magnetic sensing elements are further miniaturized as the recording density is increased, the effects described above can be appropriately achieved, and it is possible to produce magnetic sensing elements suitable for increasing the recording density.

In another aspect of the present invention, an exchange coupled film includes a nonmagnetic or partially ferromagnetic seed layer, an antiferromagnetic layer, and a ferromagnetic layer deposited in that order from the bottom, the magnetization of the ferromagnetic layer being directed in a predetermined direction by an exchange coupling magnetic field produced at the interface between the antiferromagnetic layer and the ferromagnetic layer. The seed layer contains α and Cr, α being at least one of Fe, Ni, and Co. The Cr content at the interface with the antiferromagnetic layer is 40 atomic percent or more and is higher than the Cr content at another surface of the seed layer opposite to the antiferromagnetic layer. The seed layer has a region in which the Cr content gradually increases toward the antiferromagnetic layer. The crystal structure of the seed layer at the interface with the antiferromagnetic layer is a face-centered cubic structure.

In the exchange coupled film of the present invention, since the Cr content at the interface with the antiferromagnetic layer is 40 atomic percent or more, the wettability at the surface of the seed layer can be improved.

Wettability is improved when the surface energy increases so that the surface becomes active. In order to improve the wettability, it is important to increase the Cr content in the seed layer. Other important factors are the temperature of the surface of a substrate for forming the seed layer, the distance between the substrate and a target, the Ar pressure, the sputtering rate, etc., in the process of forming the seed layer.

If the Cr content in the seed layer is low and the surface of the seed layer has unsatisfactory wettability, as shown in FIG. 5, the atoms sputtered to the surface of the seed layer do not move sufficiently over the surface and easily aggregate to form nuclei. The formation of such nuclei can be observed by an electron microscope.

When the nuclei are formed and the atoms are deposited so as to form a so-called "island structure", the orientation in the planar direction (i.e., a direction parallel to the layer surface) of an antiferromagnetic layer formed on the seed layer by sputtering is not easily brought close to the {111} orientation corresponding to the closest-packed plane.

In contrast, if the Cr content in the seed layer is high and the surface of the seed layer has satisfactory wettability, as shown in FIG. 6, the atoms sputtered to the surface of the seed layer move sufficiently over the surface and do not aggregate. In such a case, the orientation in the planar direction of an antiferromagnetic layer formed on the seed layer is easily brought close to the {111} orientation corresponding to the closest-packed plane.

In the present invention, since the surface of the seed layer has satisfactory wettability, the orientations in the planar direction of the individual layers formed on the seed layer can be more strongly aligned to the {111} plane which is the closest-packed plane.

In the exchange coupled film of the present invention, the crystal structure of the seed layer at the interface with the antiferromagnetic layer is a face-centered cubic structure (fcc structure). In the present invention, even if the Cr content at the surface of the seed layer is 40 atomic percent or more, the crystal structure can be just composed of the face-centered cubic structure. This is because the seed layer has the region in which the Cr content gradually increases toward the antiferromagnetic layer, and the Cr content of the seed layer at the surface opposite to the antiferromagnetic layer is smaller than the Cr content of the seed layer at the interface with the antiferromagnetic layer.

In order to produce a so-called "composition gradient", as will be described below with reference to a production method, the seed layer is formed so as to have a layered structure including an upper sublayer and a lower sublayer, and the Cr content in the lower sublayer is set to be lower than the Cr content in the upper sublayer. In the lower sublayer with the lower Cr content, the face-centered cubic structure can be satisfactorily maintained. On the other hand, in the upper sublayer deposited on the lower sublayer, even if the Cr content is 40 atomic percent or more, the face-centered cubic structure is easily formed under the influence of the crystal structure of the lower sublayer, and the crystal structure can be just composed of the face-centered cubic structure without a body-centered cubic structure in spite of a Cr content of 40 atomic percent or more. However, it is important to decrease the thickness of the upper sublayer, and for example, the thickness of the upper sublayer is set at 20 Å or less. Since the thickness of the upper sublayer is decreased, the crystal structure of the upper sublayer is influenced by the crystal structure of the lower sublayer as an underlayer. The equilibrium state occurring in the case of the bulk alloy is unlikely to occur and a metastable state is brought about, and thus the crystal structure can be appropriately kept in the face-centered cubic structure.

After the upper sublayer and the lower sublayer are formed as described above, annealing is performed in order to produce an exchange coupling magnetic field between the antiferromagnetic layer and the ferromagnetic layer. By the annealing treatment, diffusion may occur between the upper sublayer and the lower sublayer, resulting in a substantially single seed layer including the upper sublayer and the lower sublayer. In such a case, the compositional analysis of the seed layer shows that the seed layer has a region in which the Cr content (at %) gradually increases toward the antiferromagnetic layer and the Cr content of the seed layer at the surface opposite to the antiferromagnetic layer is smaller than the Cr content of the seed layer at the interface with the antiferromagnetic layer.

As described above, in the present invention, since the Cr content of the seed layer at the interface with the antiferromagnetic layer is 40 atomic percent or more, the wettability is improved, and also, since the crystal structure of the seed layer at the interface with the antiferromagnetic layer is the face-centered cubic structure, the orientations in the planar direction of the individual layers deposited on the seed layer can be satisfactorily {111} oriented, and the crystal grain size in the planar direction of the layers can be increased.

As the crystal grain size increases, the resistance decreases, resulting in a decrease in Joule heat. Since the {111} plane which is the closest-packed plane is preferentially oriented parallel to the layer surface, diffusion does not easily occur between the adjoining layers. As a result, electromigration resistance can be improved and current-carrying reliability can be improved.

Since the resistance is decreased, electric conductivity is improved, and therefore, in the magnetic sensing element described below, it is possible to improve the rate of change in resistance ($\Delta R/R$), the change in conductivity ($\Delta G$), and the soft magnetic properties of the free magnetic layer. Thermal noise can also be reduced.

In the exchange coupled film of the present invention, preferably, the Cr content of the seed layer at the interface with the antiferromagnetic layer is 40 to 70 atomic percent, and more preferably, 45 to 60 atomic percent.

In the exchange coupled film of the present invention, preferably, the Cr content of the seed layer at the surface opposite to the antiferromagnetic layer is 20 to 45 atomic percent, and more preferably, 20 to 40 atomic percent.

In the exchange coupled film of the present invention, preferably, the seed layer is composed of a NiFeCr alloy or a NiCr alloy.

Preferably, the composition of the seed layer is represented by $(Ni_{100-x}Fe_x)$—Cr, and the atomic ratio x satisfies the relationship $0\%\leq x\leq 70$. More preferably, the atomic ratio x satisfies the relationship $0\%\leq x\leq 50$. Most preferably, the atomic ratio x satisfies the relationship $0\%\leq x\leq 30$.

In the exchange coupled film of the present invention, preferably, the thickness of the seed layer is 23 to 80 Å, and more preferably, 25 to 50 Å.

In another aspect of the present invention, an exchange coupled film includes a nonmagnetic or partially ferromagnetic seed layer, an antiferromagnetic layer, and a ferromagnetic layer deposited in that order from the bottom, the magnetization of the ferromagnetic layer being directed in a predetermined direction by an exchange coupling magnetic field produced at the interface between the antiferromagnetic layer and the ferromagnetic layer. The seed layer has a layered structure including a nonmagnetic or partially ferromagnetic upper sublayer and a nonmagnetic or partially ferromagnetic lower sublayer, each containing α and Cr, α being at least one of Fe, Ni, and Co. The Cr content in the upper sublayer is 40 atomic percent or more, and the crystal structure at the interface with the antiferromagnetic layer is a face-centered cubic structure. The Cr content in the upper sublayer is higher than the Cr content in the lower sublayer, and the thickness of the upper sublayer is smaller than the thickness of the lower sublayer.

This exchange coupled film has the same structure as that of the exchange coupled film previously described apart from the fact that this exchange coupled film has a seed layer with a two-layered structure while the seed layer of the previously described exchange coupled film has a single-layered structure, and the same effects can be achieved.

That is, in the seed layer of this exchange coupled film, the lower sublayer, which has a lower Cr content than the upper sublayer, appropriately maintains the face-centered cubic structure, and the upper sublayer, which has a Cr content of 40 atomic percent or more, has the face-centered cubic structure. Therefore, the orientations in the planar direction of the individual layers deposited on the seed layer can be satisfactorily {111} oriented, and the crystal grain size in the planar direction of the layers can be increased.

Consequently, electromigration resistance can be improved and current-carrying reliability can be improved. In the magnetic sensing element described below, it is possible to improve the rate of change in resistance ($\Delta R/R$), the change in conductivity ($\Delta G$), and the soft magnetic properties of the free magnetic layer.

In the exchange coupled film of the present invention, preferably, the Cr content of the upper sublayer is 40 to 70 atomic percent, and more preferably, 45 to 60 atomic percent.

In the exchange coupled film of the present invention, preferably, the Cr content of the lower sublayer is 20 to 45 atomic percent, and more preferably, 20 to 40 atomic percent.

Preferably, each of the upper sublayer and the lower sublayer is composed of a NiFeCr alloy or a NiCr alloy.

Preferably, the composition of each of the upper sublayer and the lower sublayer is represented by $(Ni_{100-x}Fe_x)$—Cr, and the atomic ratio x satisfies the relationship $0\%\leq x\leq 70$. More preferably, the atomic ratio x satisfies the relationship $0\%\leq x\leq 50$. Most preferably, the atomic ratio x satisfies the relationship $0\%\leq x\leq 30$.

The lower sublayer may be composed of a NiFe alloy.

Preferably, the thickness of the upper sublayer is 3 to 20 Å, and more preferably, 5 to 10 Å.

Preferably, the thickness of the lower sublayer is 20 to 60 Å, and more preferably, 20 to 40 Å.

In the exchange coupled film of the present invention, at least one nonmagnetic or partially ferromagnetic intermediate sublayer may be formed between the upper sublayer and the lower sublayer, and preferably, the intermediate sublayer contains α and Cr, α being at least one of Fe, Ni, and Co, the Cr content of the intermediate sublayer being lower than the Cr content of the upper sublayer.

In the exchange coupled film of the present invention, preferably, an underlayer composed of at least one element selected from the group consisting of Ta, Hf, Nb, Zr, Ti, Mo, and W is formed under the seed layer. Consequently, the crystal structure of the seed layer can be appropriately set to be the face-centered cubic structure.

Preferably, the seed layer is formed by sputtering. Consequently, the seed layer does not have the same equilibrium state as that of the bulk alloy, and even if the Cr content is 40 atomic percent or more, a metastable state is formed, and the crystal structure is easily set to be the face-centered cubic structure.

In the exchange coupled film of the present invention, preferably, the average crystal grain size in a direction parallel to the layer surface in each layer formed on the seed layer is 100 Å or more, and more preferably, 150 Å or more.

In the exchange coupled film of the present invention, preferably, the grain boundaries formed in the antiferromagnetic layer and the grain boundaries formed in the ferromagnetic layer which appear in a cross section of the exchange coupled film parallel to the thickness direction are at least partially discontinuous at the interface between the antiferromagnetic layer and the ferromagnetic layer.

In the exchange coupled film of the present invention, preferably, the grain boundaries formed in the antiferromagnetic layer and the grain boundaries formed in the seed layer which appear in a cross section of the exchange coupled film parallel to the thickness direction are at least partially discontinuous at the interface between the antiferromagnetic layer and the seed layer.

In the exchange coupled film of the present invention, preferably, equivalent crystal planes represented as {111} planes in the antiferromagnetic layer and the ferromagnetic layer are preferentially oriented as crystal planes parallel to the interface between the antiferromagnetic layer and the ferromagnetic layer, and at least some of the equivalent crystal axes in the crystal planes are directed in different directions between the antiferromagnetic layer and the ferromagnetic layer.

In the exchange coupled film of the present invention, preferably, equivalent crystal planes represented as {111} planes in the antiferromagnetic layer and the seed layer are preferentially oriented as crystal planes parallel to the interface between the antiferromagnetic layer and the seed layer, and at least some of the equivalent crystal axes in the crystal planes are directed in different directions between the antiferromagnetic layer and the seed layer.

Preferably, the antiferromagnetic layer is composed of X and Mn, where X is at least one element selected from the group consisting of Pt, Pd, Ir, Rh, Ru, and Os.

The antiferromagnetic layer may be composed of an X—Mn—X' alloy, where X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb, and rare-earth elements.

In such a case, preferably, the X—Mn—X' alloy is either an interstitial solid solution in which atoms of X' enter interstices in a space lattice composed of X and Mn or a substitutional solid solution in which atoms of X' are substituted for some atoms at the lattice points of a crystal lattice composed of X and Mn.

Preferably, the X content or the X+X' content is 45 to 60 atomic percent.

In another aspect of the present invention, a magnetic sensing element includes a seed layer, an antiferromagnetic layer, a pinned magnetic layer, a nonmagnetic interlayer, and a free magnetic layer deposited in that order from the bottom, the magnetization of the free magnetic layer being aligned in a direction substantially perpendicular to the magnetization direction of the pinned magnetic layer. The seed layer, the antiferromagnetic layer, and the pinned magnetic layer constitute the exchange coupled film described above.

In another aspect of the present invention, a magnetic sensing element includes a seed layer, an antiferromagnetic exchange bias layer, a free magnetic layer, a nonmagnetic interlayer, a pinned magnetic layer, and an antiferromagnetic layer deposited in that order from the bottom, the magnetization of the free magnetic layer being aligned in a direction substantially perpendicular to the magnetization direction of the pinned magnetic layer. The seed layer, the exchange bias layer, and the free magnetic layer constitute the exchange coupled film described above.

In another aspect of the present invention, a magnetic sensing element includes a free magnetic layer; an upper nonmagnetic interlayer disposed over the free magnetic layer; a lower nonmagnetic interlayer disposed under the free magnetic layer; an upper pinned magnetic layer disposed over the upper nonmagnetic interlayer; a lower pinned magnetic layer disposed under the lower nonmagnetic interlayer; an upper antiferromagnetic layer disposed over the upper pinned magnetic layer; a lower antiferromagnetic layer disposed under the lower pinned magnetic layer; and a seed layer disposed under the lower antiferromagnetic layer, the magnetization of the free magnetic layer being aligned in a direction substantially perpendicular to the magnetization direction of the pinned magnetic layers. The seed layer, the lower antiferromagnetic layer, and the lower pinned magnetic layer constitute the exchange coupled film described above.

In another aspect of the present invention, a magnetic sensing element includes a seed layer, an antiferromagnetic exchange bias layer, a magnetoresistive layer, a nonmagnetic layer, and a soft magnetic layer deposited in that order from the bottom. The seed layer, the exchange bias layer, and the magnetoresistive layer constitute the exchange coupled film described above.

Since the exchange coupled films are used in the magnetic sensing elements, electromigration resistance and current-carrying reliability can be improved. Furthermore, the rate of change in resistance ($\Delta R/R$) can be improved, and thermal noise can be reduced.

Moreover, it is possible to decrease the coercive force Hc of the free magnetic layer or the magnetoresistive layer. Consequently, the in-plane crystal magnetic anisotropy energy K which is proportional to the coercive force Hc can also be decreased, and the magnetization of the free magnetic layer can be rotated with good sensitivity to an external magnetic field.

In the present invention, even if magnetic sensing elements are further miniaturized as the recording density is increased, the effects described above can be appropriately achieved, and it is possible to produce magnetic sensing elements suitable for increasing the recording density.

In another aspect of the present invention, a first method for making an exchange coupled film, which includes a seed layer, an antiferromagnetic layer, and a ferromagnetic layer deposited in that order from the bottom, the magnetization of the ferromagnetic layer being directed in a predetermined direction by an exchange coupling magnetic field produced at the interface between the antiferromagnetic layer and the ferromagnetic layer, includes:

step (A) of forming a lower sublayer of the seed layer by sputtering at a thickness of 20 to 60 Å, the lower sublayer being composed of a NiFeCr alloy or NiCr alloy with a Cr content of 20 to 45 atomic percent;

step (B) of forming an upper sublayer of the seed layer on the lower sublayer by sputtering at a thickness of 3 to 20 Å, the upper sublayer being composed of a NiFeCr alloy or NiCr alloy with a higher Cr content than the lower sublayer and with a Cr content of 40 to 70 atomic percent; and step (C) of depositing the antiferromagnetic layer and the ferromagnetic layer in that order on the seed layer, and performing annealing treatment to produce the exchange coupling magnetic field at the interface between the antiferromagnetic layer and the ferromagnetic layer so that the ferromagnetic layer is magnetized in the direction of the magnetic field.

In step (A), the lower sublayer composed of the NiFeCr alloy or NiCr alloy with a Cr content of 20 to 45 atomic percent is formed by sputtering at a thickness of 20 to 60 Å.

By setting the Cr content at 20 to 45 atomic percent, the crystal structure of the lower sublayer can be the face-centered cubic structure (fcc structure) appropriately. By setting the thickness of the lower sublayer at a certain level, the crystal structure of the lower sublayer can be the face-centered cubic structure appropriately. However, if the thickness is too large, the amount of the sensing current shunted to the lower sublayer is increased and the body-centered cubic structure is easily mixed in the crystal structure. In this method, the Cr content in the lower sublayer may be 40 to 45 atomic percent. It has been described that, if the Cr content exceeds 40 atomic percent, the body-centered cubic structure starts to be mixed in the crystal structure. However, by decreasing the thickness of the lower sublayer as small as possible, even if the Cr content is 40 atomic percent or more in which the body-centered cubic structure is mixed in the case of the bulk alloy, since energy is not very high, a metastable state is formed, and thus the crystal structure can be just composed of the face-centered cubic structure. From this viewpoint, the thickness of the lower sublayer is set at 20 to 60 Å. Additionally, if an underlayer formed of Ta or the like is placed under the lower sublayer, the crystal structure of the lower sublayer can be just composed of the face-centered cubic structure more appropriately, and the {111} orientation can be improved.

In step (B), the upper sublayer composed of the NiFeCr alloy or NiCr alloy with a higher Cr content than the lower sublayer and with a Cr content of 40 to 70 atomic percent is formed on the lower sublayer by sputtering at a thickness of 3 to 20 Å.

By setting the Cr content at 40 to 70 atomic percent, the wettability at the surface of the upper sublayer can be improved.

Moreover, in the method of the present invention, since the thickness of the upper sublayer is significantly small at 3 to 20 Å, the crystal structure of the upper sublayer is influenced by the crystal structure of the lower sublayer. Since the upper sublayer is formed by sputtering, the equilibrium state occurring in the case of the bulk alloy is unlikely to occur and a metastable state is brought about, and thus the crystal structure of the upper sublayer can be the face-centered cubic structure even if the Cr content is 40 atomic percent or more.

In step (C), the antiferromagnetic layer and the ferromagnetic layer are formed on the upper sublayer by sputtering. As described above, since the upper sublayer of the seed layer has a surface with improved wettability and the face-centered cubic structure, the orientations in the planar direction of the antiferromagnetic layer and the ferromagnetic layer can be brought closer to the {111} orientation corresponding to the closest-packed plane, and the crystal grain size in the planar direction can be increased.

As described above, the wettability of the surface of the seed layer can be improved reliably by a simple method, and the crystal structure of the seed layer can be kept in the face-centered cubic structure.

In the method of the present invention, preferably, the Cr content of the upper sublayer is 45 to 60 atomic percent.

Preferably, the thickness of the upper sublayer is 5 to 10 Å.

Preferably, the Cr content of the lower sublayer is 20 to 40 atomic percent.

Preferably, the composition of each of the upper sublayer and the lower sublayer is represented by $(Ni_{100-x}Fe_x)$—Cr, and the atomic ratio x satisfies the relationship $0\% \leq x \leq 70$. More preferably, the atomic ratio x satisfies the relationship $0\% \leq x \leq 50$. Most preferably, the atomic ratio x satisfies the relationship $0 \leq 23 \ x \leq 30$.

The method of the present invention may include, in place of step (A), step (D) of forming a lower sublayer of the seed layer by sputtering at a thickness of 20 to 60 Å, the lower sublayer being composed of a NiFe alloy.

The lower sublayer of the seed layer may be composed of the NiFe alloy which does not contain Cr. Since Cr is not contained, the crystal structure of the lower sublayer can be easily and reliably set to be the face-centered cubic structure.

Preferably, the thickness of the lower sublayer is 20 to 40 Å.

In another aspect of the present invention, a second method for making an exchange coupled film, which includes a seed layer, an antiferromagnetic layer, and a ferromagnetic layer deposited in that order from the bottom, the magnetization of the ferromagnetic layer being directed in a predetermined direction by an exchange coupling magnetic field produced at the interface between the antiferromagnetic layer and the ferromagnetic layer, includes:

step (E) of forming the seed layer composed of a NiFeCr alloy or NiCr alloy by sputtering at a thickness of 23 to 80 Å so that the Cr content gradually increases from the lower surface to the upper surface of the seed layer, with a Cr content at the lower surface of 20 to 45 atomic percent and with a Cr content at the upper surface of 40 to 70 atomic percent; and step (F) of depositing the antiferromagnetic layer and the ferromagnetic layer in that order on the seed layer, and performing annealing treatment to produce the exchange coupling magnetic field at the interface between the antiferromagnetic layer and the ferromagnetic layer so that the ferromagnetic layer is magnetized in the direction of the magnetic field.

In the second method, unlike the first method previously described, the seed layer does not have a two-layered structure, and the seed layer is formed by sputtering as a single layer. In such a case, sputtering is performed so that the Cr content gradually increases from the lower surface to the upper surface of the seed layer. For that purpose, for example, a NiFe target and a Cr target are prepared and sputtering is performed while the electric power supplied to the Cr target is gradually increased as the thickness increases.

In this method, the wettability of the surface of the seed layer can also be improved reliably by a simple method, and the crystal structure of the seed layer can be kept in the face-centered cubic structure.

Preferably, the composition of the seed layer is represented by $(Ni_{100-x}Fe_x)$—Cr, and the atomic ratio x satisfies the relationship $0\% \leq x \leq 70$. More preferably, the atomic ratio x satisfies the relationship 0%≦x≦50. Most preferably, the atomic ratio x satisfies the relationship 0%≦x≦30.

Preferably, the seed layer is formed by sputtering at a thickness of 25 to 50 Å.

Preferably, an underlayer composed of at least one element selected from the group consisting of Ta, Hf, Nb, Zr, Ti, Mo, and W is formed under the seed layer. Consequently, the crystal structure of the seed layer can be the face-centered cubic structure more reliably, and the preferred orientation of the {111} plane can be improved.

Preferably, the antiferromagnetic layer is formed by sputtering using an antiferromagnetic material containing X and Mn, where X is at least one element selected from the group consisting of Pt, Pd, Ir, Rh, Ru, and Os.

The antiferromagnetic layer may be formed by sputtering using an X—Mn—X' alloy, where X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb, and rare-earth elements.

Preferably, the X content or the X+X' content is 45 to 60 atomic percent.

In another aspect of the present invention, a method for making a magnetic sensing element includes depositing a seed layer, an antiferromagnetic layer, a pinned magnetic layer, a nonmagnetic interlayer, and a free magnetic layer in that order from the bottom, in which the exchange coupled film described above is used for the seed layer, the antiferromagnetic layer, and the pinned magnetic layer.

In another aspect of the present invention, a method for making a magnetic sensing element includes depositing a seed layer, an antiferromagnetic exchange bias layer, a free magnetic layer, a nonmagnetic interlayer, a pinned magnetic layer, and an antiferromagnetic layer in that order from the bottom, in which the exchange coupled film described above is used for the seed layer, the exchange bias layer, and the free magnetic layer.

In another aspect of the present invention, a method for making a magnetic sensing element includes depositing a seed layer, a lower antiferromagnetic layer, a lower pinned magnetic layer, a lower nonmagnetic interlayer, a free magnetic layer, an upper nonmagnetic interlayer, an upper pinned magnetic layer, an upper antiferromagnetic layer, in which the exchange coupled film described above is used for the seed layer, the lower antiferromagnetic layer, and the lower pinned magnetic layer.

In another aspect of the present invention, a method for making a magnetic sensing element includes depositing a seed layer, an antiferromagnetic exchange bias layer, a magnetoresistive layer, a nonmagnetic layer, and a soft magnetic layer, in which the exchange coupled film described above is used for the seed layer, the exchange bias layer, and the magnetoresistive layer.

In either method for making a magnetic sensing element, the wettability of the seed layer can be improved reliably by a simple method, and the crystal structure of the seed layer can be kept in the face-centered cubic structure.

Consequently, the orientations in the planar direction of the individual layers formed on the seed layer can be satisfactorily brought close to the {111} orientation corresponding to the closest-packed plane, and the crystal grain size in the planar direction of the layers can be increased.

Therefore, in the present invention, it is possible to produce magnetic sensing elements suitable for increasing the recording density in which current-carrying reliability, such as electromigration resistance, the rate of change in resistance, and the soft magnetic properties of free magnetic layers can be appropriately improved.

DESCRIPTION OF THE PREFERRED EMBODIMENTS

First Embodiment

Figure 1:
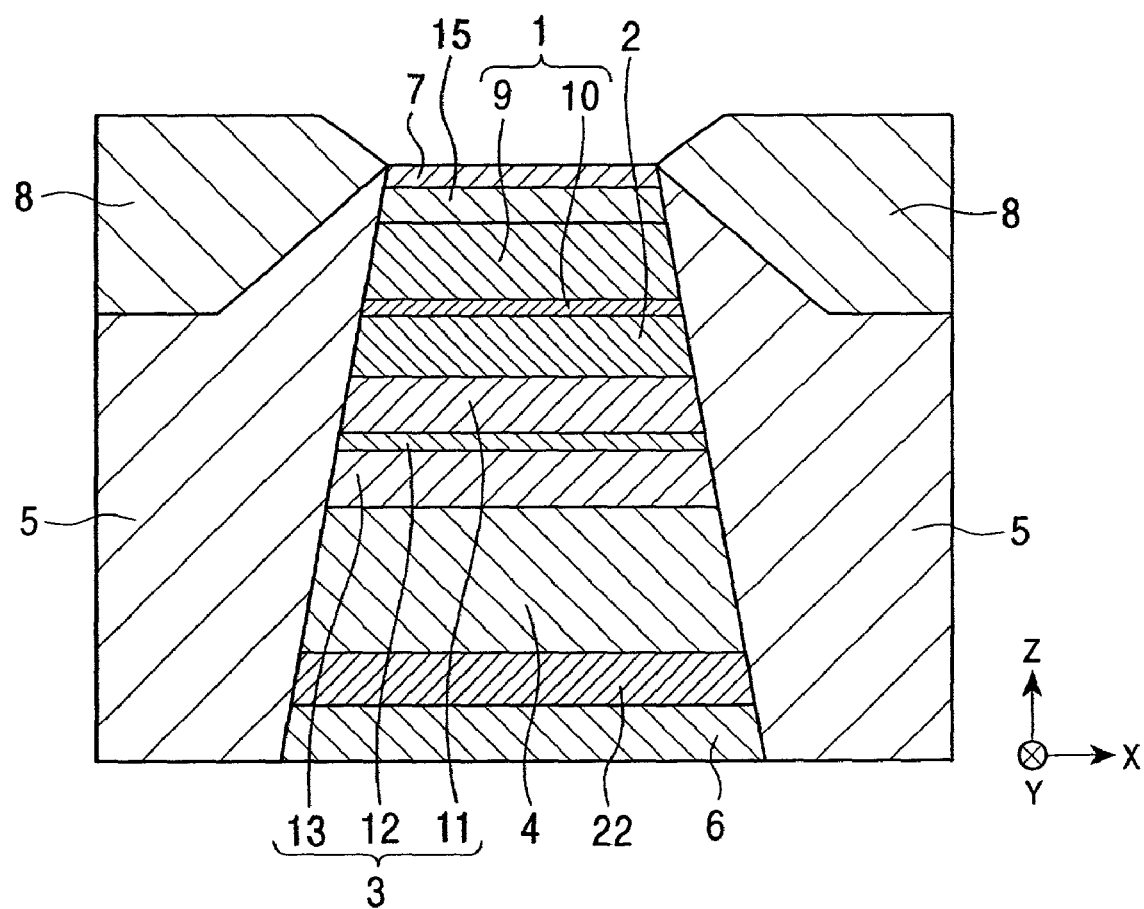
FIG. 1 is a cross-sectional view showing the structure of a magnetic sensing element (single spin-valve magnetoresistive element) according to a first embodiment of the present invention, viewed from the face opposing a recording medium.

FIG. 1 is a cross-sectional view from the face opposing a recording medium showing an overall structure of a magnetic sensing element (single spin-valve magnetoresistive element) according to a first embodiment of the present invention. In FIG. 1, only the central portion of the element extending in the X direction is illustrated in cross section.

This single spin-valve magnetoresistive element is mounted at the trailing end of a floating slider installed in a hard disk device to detect magnetic fields recorded on a hard disk, for example. A magnetic recording medium such as a hard disk moves in the Z direction and the leakage magnetic field from the magnetic recording medium is in the Y direction.

Referring to FIG. 1, an underlayer 6 composed of a nonmagnetic material containing at least one element selected from Ta, Hf, Nb, Zr, Ti, Mo, and W is formed. The underlayer 6 is illustrated in FIG. 1 as the bottommost layer. A seed layer 22, an antiferromagnetic layer 4, a pinned magnetic layer 3, a nonmagnetic interlayer 2, and a free magnetic layer 1 are deposited on the underlayer 6.

The antiferromagnetic layer 4 deposited on the seed layer 22 is preferably composed of an antiferromagnetic material containing X and Mn, wherein X is at least one element selected from Pt, Pd, Ir, Rh, Ru, and Os.

X—Mn alloys containing platinum group metals are excellent as antiferromagnetic materials because they exhibit superior corrosion resistance and high blocking temperatures and can generate large exchange coupling magnetic fields (Hex). Platinum (Pt) is especially preferable among the platinum group elements. For example, a binary PtMn alloy may be used.

In the this embodiment, the antiferromagnetic layer 4 may be composed of an antiferromagnetic material containing X, X', and Mn, wherein X' is at least one element selected from Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

Preferably, an element or elements which form a solid solution by entering the interstices in the space lattice constituted from X and Mn (an interstitial solid solution) or by partially replacing the lattice points in the crystal lattice constituted from X and Mn (a substitutional solid solution) are used as X'. Here, the term "solid solution" refers to a solid in which its components are homogeneously mixed over wide ranges.

The X—Mn—X' alloy as the interstitial or substitutional solid solution has a larger lattice constant compared with that of the X—Mn alloy. As a result, the difference between the lattice constant of the antiferromagnetic layer 4 and that of the pinned magnetic layer 3 can be made wider so as to allow the interface structure between the antiferromagnetic layer 4 and the pinned magnetic layer 3 to enter a non-coherent state. Herein, the term "non-coherent state" refers to a state in which the atoms constituting the antiferromagnetic layer 4 and the atoms constituting the pinned magnetic layer 3 do not exhibit one-to-one correspondence at the interface between the antiferromagnetic layer 4 and the pinned magnetic layer 3.

When an element or elements which form a substitutional solid solution is used as X', an excessive X' content deteriorates the antiferromagnetic property and reduces the magnitude of the exchange coupling magnetic field generated at the interface with the pinned magnetic layer 3. Moreover, in the present invention, X' is preferably at least one inert rare gas element selected from Ne, Ar, Kr, and Xe which forms an interstitial solid solution. Since rare gas elements are inert, these gases barely affect the antiferromagnetic characteristics even when they are contained in the layers. For example, Ar, which is frequently used as a sputtering gas in sputtering apparatuses, can readily enter the layer by simply optimizing the gas pressure.

When a gaseous element or elements are used as X', it is difficult for the layer to contain a large amount of the element X'. However, these rare gases can remarkably increase the exchange coupling magnetic field generated by annealing even in a small amount.

In this embodiment, the X' content is preferably 0.2 to 10 atomic percent and more preferably, 0.5 to 5 atomic percent. X is preferably Pt, since use of a Pt—Mn—X' alloy is preferred in the present invention.

In this embodiment, the X content or the X+X' content in the antiferromagnetic layer 4 is preferably in the range of 45 to 60 atomic percent, and more preferably, 49 to 56.5 atomic percent. In this manner, the interface with the pinned magnetic layer 3 is put into a non-coherent state during deposition, and the antiferromagnetic layer 4 can achieve an adequate order transformation by annealing.

The pinned magnetic layer 3 formed on the antiferromagnetic layer 4 is constituted of three sublayers (triple-layer structure).

The pinned magnetic layer 3 is constituted of a first magnetic sublayer 11, an intermediate sublayer 12, and a second magnetic sublayer 13. The first magnetic sublayer 11 is magnetized in the direction antiparallel to the magnetization direction of the second magnetic sublayer 13 by the exchange coupling magnetic field between the pinned magnetic layer 3 and the antiferromagnetic layer 4 and by the antiferromagnetic exchange coupling magnetic field generated via the intermediate sublayer 12 (Ruderman-Kittel-Kasuya-Yosida interaction, or RKKY interaction). This antiparallel state, which is known as a synthetic ferrimagnetic coupling state, can stabilize the magnetization of the pinned magnetic layer 3 and increase the apparent exchange coupling magnetic field generated at the interface between the pinned magnetic layer 3 and the antiferromagnetic layer 4.

The thickness of the first magnetic sublayer 11 is approximately 20 Å, for example. The thickness of the intermediate sublayer 12 is approximately 8 Å, and the thickness of the second magnetic sublayer 13 is approximately 15 Å, for example.

The pinned magnetic layer 3 may be formed as, for example, a single layer or a composite of magnetic layers instead of the triple-layer ferrimagnetic structure. The first and second magnetic sublayers 11 and 13 are formed of a magnetic material such as Co, a NiFe alloy, a CoFe alloy, or a CoFeNi alloy. The intermediate sublayer 12 is composed of a nonmagnetic conductive material such as Ru, Rh, Ir, Cr, Re, or Cu, for example.

The nonmagnetic interlayer 2 formed on the pinned magnetic layer 3 is composed of Cu, for example. When the magnetic sensing element of the present invention is applied to a tunneling magnetoresistive element (TMR element) utilizing the tunneling effect, the nonmagnetic interlayer 2 is composed of an insulating material such as $Al_2O_3$, for example.

A free magnetic layer 1 constituted of two sublayers is disposed on the nonmagnetic interlayer 2.

The free magnetic layer 1 is constituted of a NiFe alloy sublayer 9 and a Co sublayer 10. As shown in FIG. 1, the Co sublayer 10 comes into contact with the nonmagnetic interlayer 2 to prevent diffusion of metal elements at the interface with the nonmagnetic interlayer 2 and to increase the rate of change in resistance ΔR/R.

The NiFe alloy sublayer 9 contains 80 atomic percent of Ni and 20 atomic percent of Fe, for example. The thickness of the NiFe alloy sublayer 9 is approximately 45 Å and the thickness of the Co sublayer 10 is approximately 5 Å, for example. The sublayer 9 and the sublayer 10 may be formed of a CoFe alloy or a CoFeNi alloy. The free magnetic layer 1 may have a triple layer ferrimagnetic structure similar to the pinned magnetic layer 3.

A back layer 15 formed of a metal material or nonmagnetic metal material such as Cu, Au, or Ag is formed on the free magnetic layer 1. The thickness of the back layer 15 is approximately 12 to 20 Å, for example.

A protective layer 7 is formed on the back layer 15. The protective layer 7 is preferably made of Ta and is preferably provided with an oxidized sublayer on its surface.

With the back layer 15, the mean free path of the +spin (spin-up) electrons contributing to the magnetoresistive effect can be extended, and a large rate of change in resistance can be achieved in the spin-valve magnetic element due to a so-called spin filter effect, thus meeting the demand for higher density recording. However, formation of the back layer 15 is not essential.

In the first embodiment shown in FIG. 1, hard bias layers 5 and electrode layers 8 are formed at the two sides of the composite which includes layers from the underlayer 6 to the protective layer 7. The longitudinal bias magnetic field from the hard bias layers 5 magnetizes the free magnetic layer 1 in the track width direction (the X direction in the drawing).

The hard bias layers 5 are composed of a cobalt-platinum (Co—Pt) alloy, a cobalt-chromium-platinum (Co—Cr—Pt) alloy, or the like, for example. The electrode layers 8 are composed of α-Ta, Au, Cr, Cu, Rh, Ir, Ru, or W, for example. Note that in the above-described tunneling magnetoresistive element or a magnetic sensing element operating in the current-perpendicular-to-plane (CPP) mode, one of the electrode layers 8 is formed above the free magnetic layer 1 and the other is formed below the antiferromagnetic layer 4.

In preparation of the spin-valve thin film magnetic element shown in FIG. 1, the layers are sequentially deposited from the underlayer 6 up to the protective layer 7 to form a composite, and the composite is annealed so as to generate the exchange coupling magnetic field at the interface between the antiferromagnetic layer 4 and the pinned magnetic layer 3. During annealing, the magnetization of the pinned magnetic layer 3 can be pinned in the Y direction in the drawing by applying a magnetic field in the Y direction. Note that in the embodiment shown in FIG. 1, the magnetization of one of the first magnetic sublayer 11 and second magnetic sublayer 13 is pinned in the Y direction and that of the other sublayer is pinned in the direction opposite to the Y direction since the pinned magnetic layer 3 has a ferrimagnetic structure.

In the first embodiment shown in FIG. 1, the seed layer 22 is disposed under the antiferromagnetic layer 4. In this embodiment, the seed layer 22 is nonmagnetic and is composed of Cr and α wherein α is at least one element selected from Fe, Ni, and Co. In particular, the seed layer 22 is preferably formed of a NiCr alloy or a NiFeCr alloy.

In the present invention, the composition of the seed layer 22 is preferably represented by the formula $(Ni_{100-x} Fe_x)$—Cr, wherein the atomic ratio x is preferably 0%≦x≦70, more preferably, 0%≦x≦50, and most preferably, 0%≦x≦30. This composition is preferred since, at excessive Fe contents, the crystal orientation of the seed layer 22 readily becomes cubic body-centered. This composition also improves crystal orientation and increases the crystal grain size, the change in conductivity, and the rate of change in resistance of the antiferromagnetic layer 4. Yet more preferably, the atomic ratio x is 20.

In the invention, the Cr content of the seed layer 22 is in the range of 35 to 60 atomic percent so as to increase the surface energy of the seed layer 22. As a result, the surface of the seed layer 22 can be activated, and the wettability can be improved compared to the related art.

At a Cr content in the seed layer 22 of less than 35 atomic percent, the wettability is degraded. At a Cr content exceeding 60 atomic percent, although the seed layer 22 exhibits excellent wettability and the structure thereof can be formed as the single phase face-centered cubic structure (fcc structure) by reducing the thickness, such a thin seed layer 22 does not sufficiently function as the seed layer due to insufficient {111} orientation. Thus, the upper limit of the Cr content in the present invention is 60 atomic percent.

In the present invention, the crystal structure of the seed layer 22 has the face-centered (fcc) structure.

Figure 6:
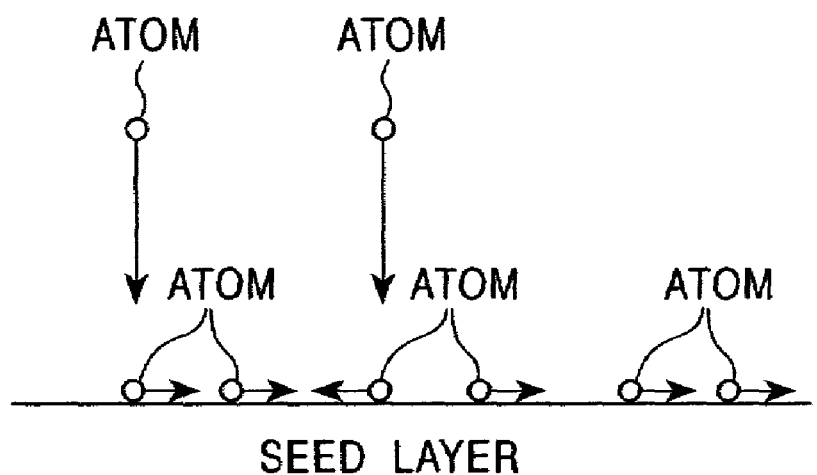
FIG. 6 is a schematic diagram showing a state of atoms constituting the antiferromagnetic layer, the atoms being sputtered to the surface of a seed layer having excellent wettability.

As is explained above with reference to FIG. 6, by improving the wettability, atoms constituting the antiferromagnetic layer 4 can sufficiently move on the surface of the seed layer 22 during sputter-deposition of the antiferromagnetic layer 4. Moreover, since the surface of the seed layer 22 has the face-centered cubic structure, the crystal orientation of the antiferromagnetic layer 4 in the direction parallel to the layer surface (parallel to the X-Y plane) becomes strongly {111} oriented, thereby forming the closest packed surface.

Moreover, because of the antiferromagnetic layer 4 having the {111} orientation, the layers formed thereon will each have the {111} orientation in the direction parallel to the layer surface (the X direction in the drawing), thereby making the closest packed surfaces.

In the layers formed above the seed layer 22 of the present invention, because the surface of the seed layer 22 exhibits excellent wettability and has the face-centered cubic structure, large crystal grains can be formed across the layers. Such crystal grains also grow large in a direction parallel to the layer surface, i.e., a direction parallel to the X-Y plane. In the present invention, the crystal grain size in the direction parallel to the layer surface is preferably 100 Å or more, more preferably, 150 Å or more, and most preferably, 170 Å or more to improve electrical conductivity.

The seed layer 22 of the invention has the single phase of the face-centered cubic structure despite a large Cr content in the range of 35 to 60 atomic percent. This is because the thickness of the seed layer 22 is small. By reducing the thickness of the seed layer 22, the seed layer 22 readily enters a metastable state instead of the equilibrium state of the bulk, thereby forming the face-centered cubic structure.

In the present invention, the thickness of the seed layer 22 is controlled to be in the range of 10 to 200 Å when the Cr content of the seed layer 22 is in the range of 35 to 60 atomic percent.

At a thickness of less than 10 Å, the seed layer 22 can have the face-centered cubic structure but with insufficient {111} orientation. As a result, the layers formed on the seed layer 22 will have insufficient {111} orientation in the direction parallel to the layer surface (the X direction in the drawing), thereby failing to form the closest packed surfaces.

At a thickness exceeding 200 Å, the seed layer 22 has a mixture of the face-centered cubic structure and the body-centered cubic structure even if the Cr content is set at 35 atomic percent, which is the lowest content allowed in the present invention. This is confirmed through the experiments described below.

The thickness of the seed layer 22 needs to be reduced as the Cr content increases. The larger the Cr content, the smaller the thickness needs to be in order to achieve a metastable state and yield the face-centered cubic structure. This is also confirmed through the experiments described below.

In the present invention, the thickness of the seed layer 22 is preferably in the range of 10 to 80 Å when the Cr content is in the range of 35 to 60 atomic percent. In this manner, the crystal structure of the seed layer 22 can be readily formed as the single phase of the face-centered cubic structure. More preferably, the thickness of the seed layer 22 is in the range of 10 to 60 Å. In this manner, the seed layer 22 can be reliably formed as the single phase of the face-centered cubic structure.

At a thickness of not more than 80 Å, and more preferably, not less than 60 Å, the shunt loss of the sensing current flowing to the seed layer 22 can be reduced.

The underlayer 6, which is composed of Ta or the like and disposed under the seed layer 22 as shown in FIG. 1, also promotes formation of the fcc structure in the seed layer 22.

In order to form a seed layer 22 having the single phase of the fcc structure, sputter-deposition conditions during deposition of the seed layer 22 need to be optimized. Merely adjusting the composition and the thickness of the seed layer 22 as above is not sufficient to properly form the single phase of the face-centered cubic structure in the seed layer 22.

For example, in the present invention, the substrate is preferably maintained at a temperature in the range of 20 to 100° C., the distance between the substrate and the target is preferably 40 to 80 mm, and the pressure of the Ar gas is preferably in the range of 0.5 to 3 mTorr (0.067 to 0.4 Pa) during sputter-deposition of the seed layer 22. In this manner, the crystal structure of the seed layer 22 can be properly cubic face-centered.

The higher the temperature of the substrate, the more likely the mixed structure of the body-centered cubic structure and the face-centered cubic structure is formed in the seed layer 22 having a high Cr content. To avoid such a mixed structure, the temperature of the substrate during the sputter-deposition is maintained low as above. High gas pressures also result in generation of the mixed structure of the face-centered cubic structure and the body-centered cubic structure in the seed layer 22 having a high Cr content. Thus, the Ar gas pressure during the sputter-deposition is maintained low as described above.

In the above-described invention, the Cr content of the seed layer 22 can be increased to the range of 35 to 60 atomic percent while properly maintaining the face-centered cubic structure. As a result, each of the layers deposited on the seed layer 22 has the {111} orientation in the direction parallel to the layer surface, and the average crystal grain size in a direction parallel to the layer surface can be increased.

In this manner, an increase in resistance of the spin-valve thin film element and diffusion between layers can be prevented. The resistance to the electromigration can be enhanced and the current carrying reliability can be improved.

The present invention improves the rate of change in resistance $\Delta R/R$ and the change in conductivity $\Delta G$. Thermal noise can also be reduced.

According to the present invention, the soft magnetic property of the free magnetic layer 1 constituting the spin-valve thin film magnetic element can be improved. In particular, the crystal magnetic anisotropy energy K during magnetization rotation on the surface of the free magnetic layer 1 can be reduced. As a result, the coercive force Hc in proportion to the crystal magnetic anisotropy energy K at the layer surface can be reduced, and the magnetization rotation of the free magnetic layer 1 in response to the external magnetic field can be improved. The single spin-valve thin film element of the present invention thus exhibits improved sensitivity.

According to the present invention, a single spin-valve thin film element which can sufficiently withstand high-density sensing current which is required to read higher density recordings in the near future can be manufactured.

The preferable Cr content range and thickness of the seed layer 22 of the present invention will now be described.

In the present invention, the Cr content of the seed layer 22 is preferably in the range of 40 to 60 atomic percent, and the thickness of the seed layer 22 is preferably in the range of 10 to 170 Å. The higher the Cr content, the thinner the seed layer 22 must be to prevent generation of the mixed structure of the fcc and bcc structures.

The experiments described in later sections show that, in this manner, the seed layer 22 will have improved wettability and the face-centered cubic structure. The rate of change in resistance $\Delta R/R$ and the change in conductivity $\Delta G$ will be further improved, the average grain size of the pinned magnetic layer 3, the nonmagnetic interlayer 2, and the free magnetic layer 1 in the planar direction can be further increased, and the thermal resistance can be further enhanced.

In the present invention, the Cr content of the seed layer 22 is more preferably in the range of 45 to 60 atomic percent. The thickness of the seed layer 22 is more preferably in the range of 10 to 130 Å. The higher the Cr content, the thinner the seed layer 22 must be to prevent formation of the mixed structure of the bcc and fcc structures.

The experiments described in later sections show that, in this manner, the seed layer 22 will have further improved wettability and the face-centered cubic structure. The rate of change in resistance ΔR/R and the change in conductivity ΔG will be further improved, the average grain size of the pinned magnetic layer 3, the nonmagnetic interlayer 2, and the free magnetic layer 1 in the planar direction can be further increased, and the thermal resistance can be further enhanced.

In the present invention, the Cr content of the seed layer 22 is more preferably in the range of 40 to 50 atomic percent, and the thickness of the seed layer 22 is more preferably in the range of 10 to 170 Å. The higher the Cr content, the thinner the seed layer 22 must be to prevent generation of the mixed structure of the fcc and bcc structures. The experiments described in later sections show that the rate of change in resistance peaks at a Cr content of approximately 45 atomic percent. Thus, at a Cr content in the range of 40 to 50 atomic percent, the rate of change in resistance ΔR/R and the change in conductivity ΔG can be further improved, the average crystal grain size of the pinned magnetic layer 3, the nonmagnetic interlayer 2, and the free magnetic layer 1 in the planar direction can be further increased, and the thermal resistance temperature can be higher.

In this embodiment, the seed layer 22 preferably has a Cr content in the range of 45 to 55 atomic percent and a thickness in the range of 10 to 130 Å. The experiments described in the later sections show that, in this manner, the rate of change in resistance ΔR/R and the change in conductivity ΔG can be further improved, the average crystal grain size of the pinned magnetic layer 3, the nonmagnetic interlayer 2, and the free magnetic layer 1 in the planar direction can be further increased, and the thermal resistance temperature can be higher.

At any of the above-described preferable ranges of the Cr content, the thickness of the seed layer 22 is preferably in the range of 10 to 80 Å.

At a thickness of 80 Å and at a Cr content of 55 atomic percent or less, the seed layer 22 having the single phase of the face-centered cubic structure can be reliably formed.

Accordingly, at a Cr content in the range of 40 to 50 atomic percent or 45 to 55 atomic percent, the seed layer 22 having the single-phase fcc structure can be reliably formed by adjusting seed layer 22 to a thickness in the range of 10 to 80 Å.

Moreover, at a Cr content in the range of 40 to 60 atomic percent or 45 to 60 atomic percent, the seed layer 22 having the single-phase fcc structure can be reliably formed by adjusting seed layer 22 to a thickness in the range of 10 to 80 Å.

More preferably, at any Cr content described above, the thickness of the seed layer 22 is in the range of 10 to 60 Å.

When the thickness of the seed layer 22 is 60 Å, the seed layer 22 having the single-phase fcc structure can be reliably formed at a Cr content of 60 atomic percent or less.

In the present invention, the Cr content is 60 atomic percent at most. Thus, the seed layer 22 having the single phase face-centered cubic structure can be reliably formed at a thickness in the range of 10 to 60 Å.

Moreover, at a thickness of 80 Å or less, and more preferably, 60 Å or less, the shunt loss of the sensing current flowing to the seed layer 22 can be adequately controlled, and the output can be increased thereby.

Second Embodiment

Figure 2:
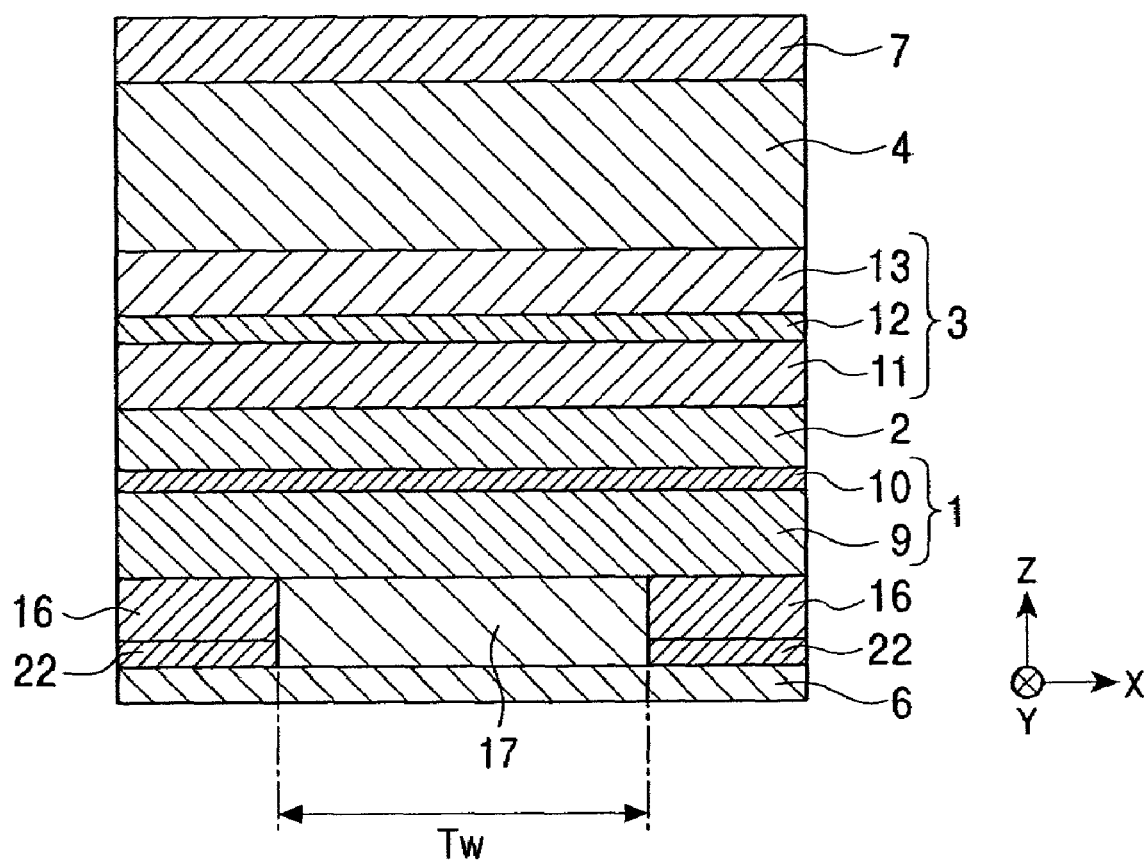
FIG. 2 is a cross-sectional view showing the structure of a magnetic sensing element (single spin-valve magnetoresistive element) according to a second embodiment of the present invention, viewed from the face opposing a recording medium.

FIG. 2 is a cross-sectional view partially showing the structure of a spin-valve thin film element according to a second embodiment of the present invention.

In the spin-valve thin film element shown in FIG. 2, a pair of seed layers 22 separated from each other in the track width direction, i.e., the X direction in the drawing, by the gap corresponding to the track width Tw is formed on an underlayer 6. Exchange bias layers 16 are formed on the seed layers 22.

The gap between the seed layers 22 and the exchange bias layers 16 is filled with an insulating layer 17 composed of an insulating material such as $SiO_2$ or $Al_2O_3$.

A free magnetic layer 1 is formed on the exchange bias layers 16 and the insulating layer 17.

The exchange bias layers 16 are preferably formed with an X—Mn alloy or an X—Mn—X' alloy. The definitions of X and X' are the same as in the first embodiment. The X content or the X+X' content is preferably in the range of 45 to 60 atomic percent, and more preferably, 49 to 56.5 atomic percent.

Two side portions of the free magnetic layer 1 are magnetized in the X direction in the drawing by the exchange coupling magnetic field with the exchange bias layers 16 and are put into a single-magnetic-domain state. The central portion of the free magnetic layer 1 corresponding to the track width Tw is adequately magnetized in the X direction in the drawing to an extent responsive to an external magnetic field.

As shown in FIG. 2, a nonmagnetic interlayer 2 is formed on the free magnetic layer 1, and a pinned magnetic layer 3 is formed on the nonmagnetic interlayer 2. An antiferromagnetic layer 4 and a protective layer 7 are formed on the pinned magnetic layer 3.

In the second embodiment, the seed layers 22 are nonmagnetic and are composed of α and Cr wherein α is at least one element selected from Fe, Ni, and Co.

The Cr content of the seed layers 22 is in the range of 35 to 60 atomic percent. The thickness of the seed layers 22 is in the range of 10 to 200 Å. The seed layers 22 have the face-centered cubic (fcc) structure.

The preferable range of the Cr content and the thickness of the seed layer 22 are the same as in the first embodiment in FIG. 1.

In the spin-valve thin film element shown in FIG. 2, the seed layers 22 have a higher Cr content compared to the conventional art while adequately maintaining the face-centered cubic structure. Thus, all layers deposited on the seed layers 22 can adequately have the {111} orientation in the direction parallel to the layer surface, and the average crystal grain size in the direction parallel to the layer surface can be increased.

In this manner, an increase in the resistance of the spin-valve thin film and diffusion between the layers can be prevented. As a result, the resistance to electromigration can be enhanced, and current-carrying reliability can be improved.

According to the present invention, the rate of change in resistance ΔR/R and the change in the conductivity ΔG can be increased, and the thermal noise can be reduced.

In the present invention, the soft magnetic property of the free magnetic layer 1 constituting the spin-valve thin film element can be improved. In particular, the crystal magnetic anisotropy energy K at the surface of the free magnetic layer 1 can be reduced, the coercive force Hc in proportion to the crystal magnetic anisotropy energy K at the layer surface can be reduced, and the magnetization rotation of the free magnetic layer 1 in response to the external magnetic field can be improved. The spin-valve thin film element of the present invention thus exhibits improved sensitivity.

The spin-valve thin film element of the present invention having the above advantages can sufficiently withstand the high-density sensing current required for the higher-density recording in the near future.

Third Embodiment

Figure 3:
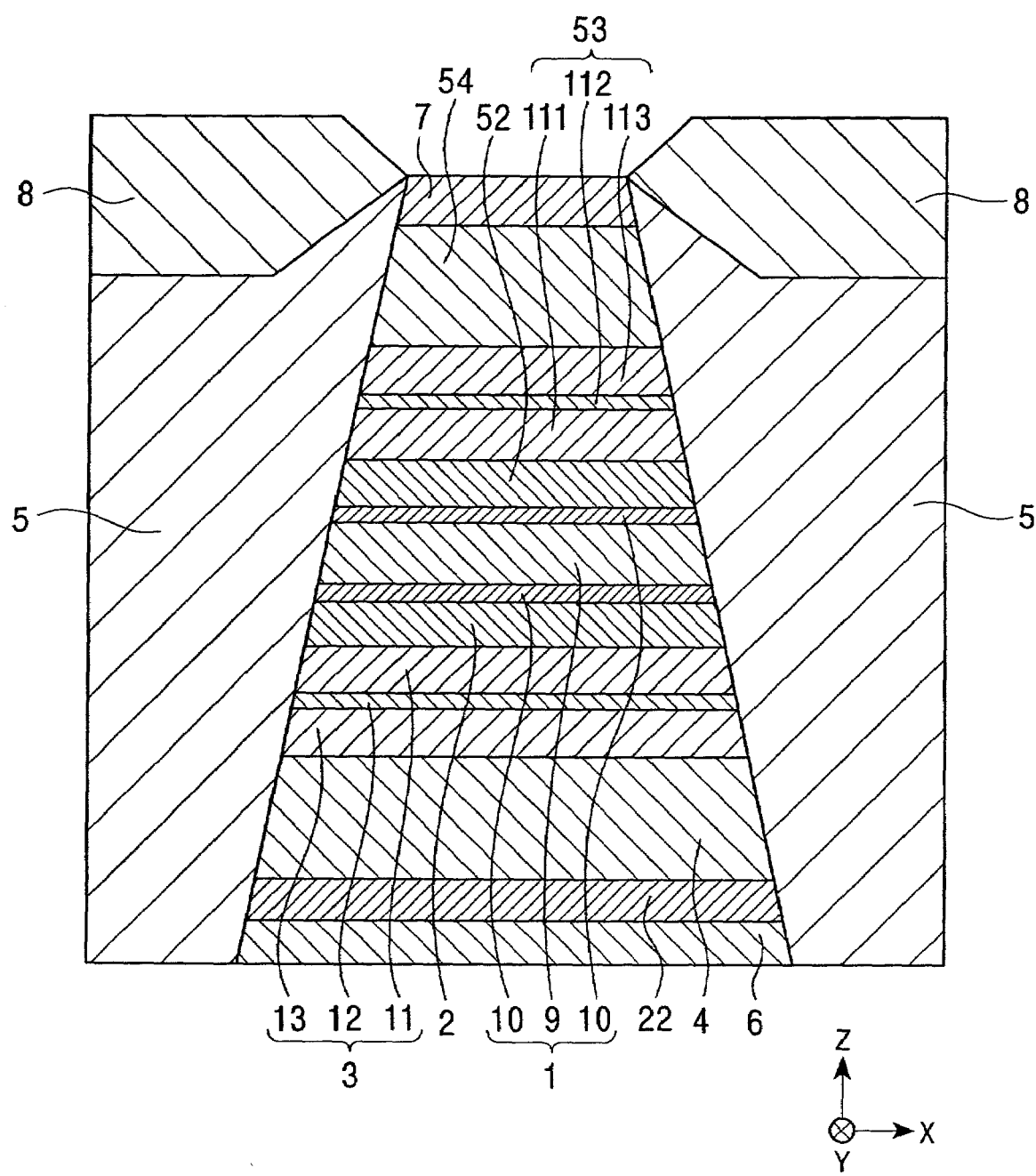
FIG. 3 is a cross-sectional view showing the structure of a magnetic sensing element (dual spin-valve magnetoresistive element) according to a third embodiment of the present invention, viewed from the face opposing a recording medium.

FIG. 3 is a partial cross-sectional view showing the structure of a dual spin-valve thin film element according to a third embodiment of the present invention.

As shown in FIG. 3, an underlayer 6, a seed layer 22, a lower antiferromagnetic layer 4, a lower pinned magnetic layer 3, a lower nonmagnetic interlayer 2, and a free magnetic layer 1 are sequentially deposited in that order. The free magnetic layer 1 is constituted of three sublayers, namely, two Co sublayers 10 and a NiFe alloy sublayer 9. On the free magnetic layer 1, an upper nonmagnetic interlayer 52, an upper pinned magnetic layer 53, and an upper antiferromagnetic layer 54, and a protective layer 7 are sequentially deposited. The upper pinned magnetic layer 53 contains layers similar to that of the lower pinned magnetic layer 13. That is: an upper first magnetic sublayer 111, similar in composition and thickness to the first magnetic sublayer 11, an upper intermediate sublayer 112, similar in composition and thickness to the intermediate magnetic sublayer 12, and an upper second magnetic sublayer 113, similar in composition and thickness to the second magnetic sublayer 13.

At the two sides of the composite including layers from the underlayer 6 to the protective layer 7, hard bias layers 5 and electrode layers 8 are formed. The hard bias layers 5 and the electrode layers 8 are composed of the same materials as in the first embodiment shown in FIG. 1.

In this embodiment, the seed layer 22 is disposed under the lower antiferromagnetic layer 4. The content X or X+X' constituting the antiferromagnetic layer 4 is preferably in the range of 45 to 60 atomic percent, and more preferably, 49 to 56.5 atomic percent.

In this embodiment, the seed layer 22 is nonmagnetic and is composed of Cr and α wherein α is at least one element selected from Fe, Ni, and Co.

The Cr content in the seed layer 22 is in the range of 35 to 60 atomic percent. The thickness of the seed layer 22 is in the range of 10 to 200 Å. The seed layer 22 has the face-centered cubic structure.

The preferable ranges of the Cr content and the thickness of the seed layer 22 are the same in the first embodiment shown in FIG. 1.

In the spin-valve thin film element of the third embodiment shown in FIG. 3, the seed layer 22 has a higher Cr content compared to the conventional art while maintaining the face-centered cubic structure. Thus, the layers deposited on the seed layer 22 can have the {111} orientation in a direction parallel to each layer surface, and the average crystal grain size in the direction parallel to the layer surface can be increased.

In this manner, an increase in the resistance of the spin-valve thin film element and diffusion between the layers can be prevented. As a result, the resistance to electromigration can be enhanced, and current-carrying reliability can be improved.

In this embodiment, the rate of change in resistance ΔR/R and the change in the conductivity ΔG can be increased. Thermal noise can be reduced.

In this embodiment, the soft magnetic property of the free magnetic layer 1 constituting the spin-valve thin film element can be improved. In particular, the planar crystal magnetic anisotropy energy K on the surface of the free magnetic layer 1 can be reduced, the coercive force Hc in proportion to the crystal magnetic anisotropy energy K can be reduced, and the magnetization rotation of the free magnetic layer 1 in response to the external magnetic field can be improved. The spin-valve thin film element of the present invention thus exhibits improved sensitivity.

The spin-valve thin film element of the present invention having the above advantages can sufficiently withstand the high-density sensing current required for the higher-density recording in the near future.

Fourth Embodiment

Figure 4:
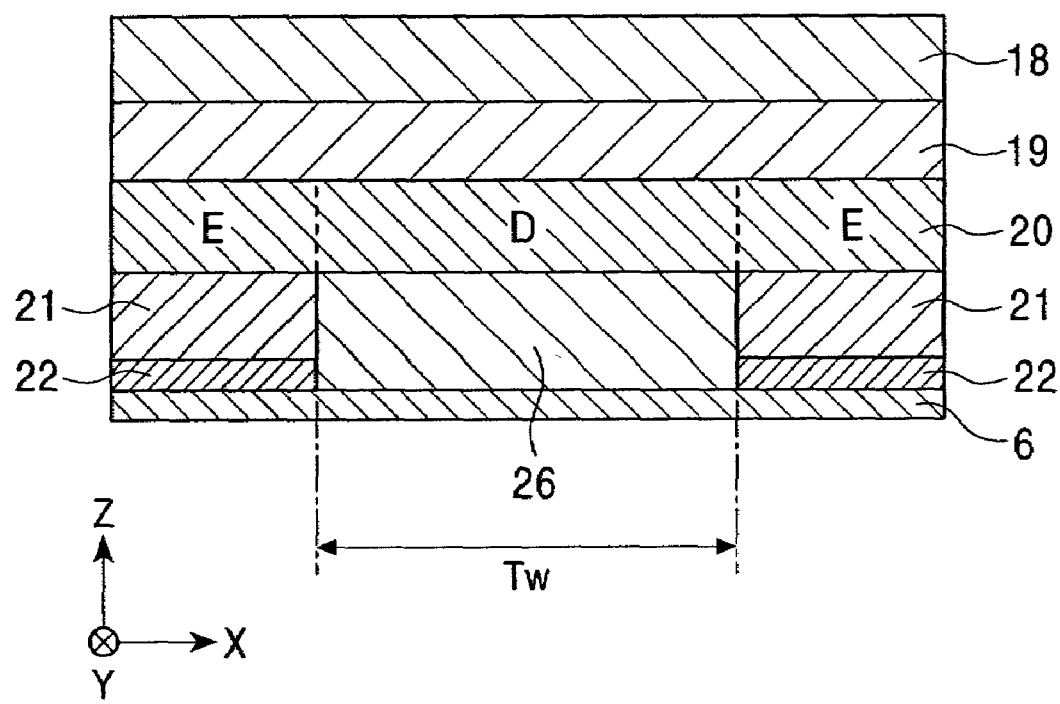
FIG. 4 is a cross-sectional view showing the structure of a magnetic sensing element (AMR magnetoresistive element), viewed from the face opposing a recording medium.
Figure 5:
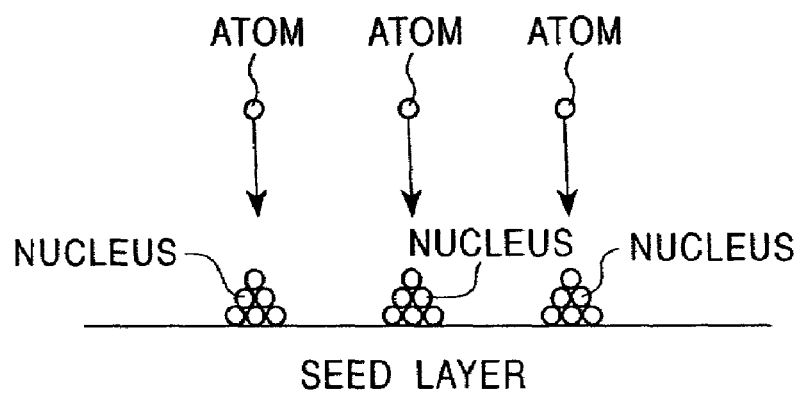
FIG. 5 is a schematic diagram showing a state of atoms constituting an antiferromagnetic layer, the atoms being sputtered to the surface of a seed layer having poor wettability.

FIG. 4 is a partial cross-sectional view of an anisotropic magnetoresistive element (AMR element) according to a fourth embodiment of the present invention taken in a direction parallel to the face opposing a recording medium.

Referring to FIG. 4, a pair of seed layers 22 separated from each other in the track width direction, i.e., the X direction in the drawing, by a gap corresponding to the track width Tw is formed on an underlayer 6. On the seed layers 22, exchange bias layers 21 are formed. The gap between the seed layers 22 and the exchange bias layers 21 is filled with an insulating layer 26 composed of an insulating material such as $SiO_2$ or $Al_2O_3$.

On the exchange bias layers 21 and the insulating layer 26, a magnetoresistive layer (MR layer) 20, a nonmagnetic layer (shunt layer) 19, and a soft magnetic layer (SAL) 18 are deposited.

In the AMR thin film element shown in FIG. 4, the regions E of the magnetoresistive layer 20 in FIG. 4 are put into a single-magnetic-domain state in the X direction by the exchange coupling magnetic field generated at the interfaces between the exchange bias layers 21 and the magnetoresistive layer 20. These regions E magnetize the region D of the magnetoresistive layer 20 shown in FIG. 4 in the X direction in the drawing. The magnetic field which is induced when a sensing current flows in the magnetoresistive layer 20 is applied to the soft magnetic layer 18 in the Y direction. A transverse bias magnetic field is applied to the region D of the magnetoresistive layer 20 in the Y direction by the magnetostatic coupling energy induced by the soft magnetic layer 18. Application of the transverse bias magnetic field to the region D of the magnetoresistive layer 20 which is put into the single-magnetic-domain state in the X direction results in a linear change in resistance in response to the change in magnetic field of the region D of the magnetoresistive layer 20 (the magnetoresistive effect: the H-R effect).

Since the recording medium moves in the Z direction, the resistance in the region D of the magnetoresistive layer 20 changes as the leakage magnetic field is applied in the Y direction in the drawing. Such changes are detected as the changes in voltage.

In this embodiment also, the seed layer 22 is nonmagnetic and is composed of Cr and α wherein α is at least one selected from Fe, Ni, and Co.

The Cr content of the seed layer 22 is in the range of 35 to 60 atomic percent. The thickness of the seed layer 22 is in the range of 10 to 200 Å. The seed layer 22 has the face-centered cubic structure.

The preferable ranges of the Cr content and the thickness of the seed layer 22 are the same as in the first embodiment shown in FIG. 1.

In the AMR thin film element shown in FIG. 4, the seed layers 22 can have a high Cr content while adequately maintaining the face-centered cubic structure. Thus, each of the layers deposited on the seed layers 22 can have the {111} orientation in the direction parallel to the layer surface, and the average crystal grain size in the direction parallel to the layer surface can be increased.

In this manner, an increase in resistance of the AMR thin film element and the diffusion between layers can be prevented. As a result, the resistance to electromigration can be enhanced, and current-carrying reliability can be improved.

Moreover, the rate of change in resistance ΔR/R can be improved, and the change in conductivity ΔG can be increased. The thermal noise can also be reduced.

Furthermore, the soft magnetic property of the magnetoresistive layer 20 constituting the AMR thin film element can be improved. In particular, the crystal magnetic anisotropy energy K during magnetization rotation at the surface of the magnetoresistive layer 20 can be reduced. As a result, the coercive force Hc in proportion to the planar crystal magnetic anisotropy energy K can be reduced, and the magnetization rotation at the magnetoresistive layer 20 in response to the external magnetic field can be improved. The single spin-valve magnetoresistive element of the present invention thus exhibits improved sensitivity.

The AMR thin film element of this embodiment can sufficiently withstand high-density sensing current which is required to read higher density recordings in the near future.

Although all the magnetic sensing elements shown in FIGS. 1 to 4 comprise the underlayer 6, the underlayer 6 is not essential. However, when the underlayer 6 is not formed, the seed layer 22 must have an increased thickness; otherwise, the seed layer 22 will not have the proper face-centered cubic structure and {111} orientation.

The thickness of the seed layer 22 should not be less than 10 Å; however, if the underlayer 6 is not formed, the thickness of the seed layer 22 should not be less than 20 Å, and more preferably, not less than 45 Å. At such a thickness, the seed layer 22 can be formed as the face-centered cubic structure and can have the {111} orientation even when the underlayer 6 is not formed.

Note that in order to reliably make the nonmagnetic interlayer 2 having the face-centered cubic structure and achieve the {111} preferred orientation, the underlayer 6 should be formed. The thickness of the underlayer 6 is, for example, approximately 30 Å. By providing the underlayer 6, the {111} planes will adequately align in the direction parallel to the layer surface of the seed layer 22.

Preferably, n the magnetic sensing elements shown in FIGS. 1 to 4, the crystal boundaries of the antiferromagnetic layer 4 (the exchange bias layers 16 and 21 in FIGS. 2 and 4) and those of the pinned magnetic layer 3 (the free magnetic layer 1 in FIG. 2 and the magnetoresistive layer 20 in FIG. 4) which appear at a cross-section of the magnetic sensing element taken in a direction parallel to the layer thickness direction are at least partly discontinuous at the interface therebetween.

Preferably, in the magnetic sensing elements shown in FIGS. 1 to 4, the crystal boundaries of the antiferromagnetic layer 4 (the exchange bias layers 16 and 21 in FIGS. 2 and 4) and those of the seed layer 22 appearing at a cross-section of the magnetic sensing element taken in a direction parallel to the layer thickness direction are at least partly discontinuous at the interface thereof.

Preferably, in the magnetic sensing elements shown in FIGS. 1 to 4, the crystallographically equivalent planes represented as the {111} planes are preferred to be aligned in the planes parallel to the interface between the antiferromagnetic layer 4 (the exchange bias layers 16 and 21 in FIGS. 2 and 4) and the pinned magnetic layer 3 (the free magnetic layer 1 in FIG. 2 and the magnetoresistive layer 20 in FIG. 4). Moreover, at least some of the crystallographically equivalent axes existing in these crystal planes are preferably directed in different direction between the antiferromagnetic layer 4 and the pinned magnetic layer 3.

Preferably, in the magnetic sensing elements shown in FIGS. 1 to 4, the equivalent crystal planes represented as the {111} planes are preferentially aligned in the planes parallel to the interface between the antiferromagnetic layer 4 (the exchange bias layers 16 and 21 in FIGS. 2 and 4) and the seed layer 22. Moreover, at least some of the equivalent crystal axes existing in these crystal planes are preferably oriented in different direction between the antiferromagnetic layer 4 and the seed layer 22.

With such an alignment, a so-called non-coherent state can be maintained at the interface between the antiferromagnetic layer 4 and the pinned magnetic layer 3 and at the interface between the antiferromagnetic layer 4 and the seed layer 22. Moreover, the disordered lattice of the antiferromagnetic layer 4 transforms to the ordered lattice by annealing; hence, a large exchange coupling magnetic field can be obtained.

In order to obtain the above-described alignment, the surface of the seed layer 22 must show high wettability, and the seed layer 22 must have the fcc structure. Furthermore, the conditions for depositing layers on the seed layer 22 and the composition of the antiferromagnetic layer 4 must be optimized.

As described above, the X or X+X' content of the antiferromagnetic layer 4 is preferably in the range of 45 to 60 atomic percent.

As for the deposition condition, the pressure of the Ar gas used during sputter deposition is controlled to 3 mTorr. The annealing temperature for inducing the exchange coupling magnetic field between the antiferromagnetic layer 4 and the pinned magnetic layer 3 is in the range of 200 to 300° C. The magnetic annealing is performed in a vacuum of $10^{-6}$ Torr or less for 2 hours. The distance between the substrate and the target is 80 mm.

By controlling the composition of the antiferromagnetic layer 4 and the deposition conditions, the interface between the antiferromagnetic layer 4 and the pinned magnetic layer 3 and the interface between the antiferromagnetic layer 4 and the seed layer 22 can be adequately put into a non-coherent state, and a large exchange coupling magnetic field, namely, $1.58 \times 10^4$ (A/m), can be obtained.

Figure 7:
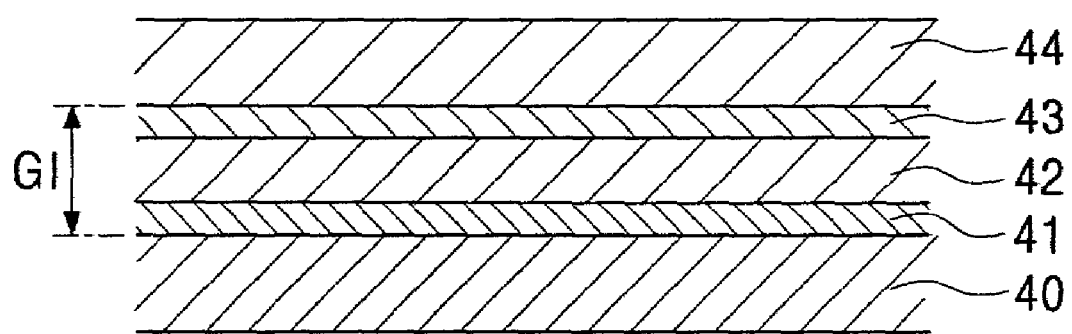
FIG. 7 is a partial cross-sectional view of a thin film magnetic head comprising a magnetic sensing element.

FIG. 7 is a cross-sectional view from the face opposing a recording medium showing the structure of a read head incorporating any one of the magnetic sensing elements shown in FIGS. 1 to 4.

Referring to FIG. 7, a lower gap layer 41 is formed on a lower shield layer 40 composed of a NiFe alloy, for example. On the lower gap layer 41, a magnetic sensing element 42 corresponding to any one of those shown in FIGS. 1 to 4 is formed. An upper gap layer 43 is formed on the magnetic sensing element 42, and an upper shielding layer 44 composed of a NiFe alloy or the like is formed on the upper gap layer 43.

The lower gap layer 41 and the upper gap layer 43 are composed of an insulating material such as $SiO_2$ or $Al_2O_3$ (alumina). As shown in FIG. 7, the length from the bottom face of the lower gap layer 41 to the top face of the upper gap layer 43 is defined as the gap length G1. The smaller the gap length G1, the more compatible the read head is to the higher recording density.

In this invention, a large exchange coupling magnetic field can still be obtained even when the thickness of the antiferromagnetic layer 4 is small. The thickness of the antiferromagnetic layer 4 is, for example, 70 Å or more. Compared to the related art which required a thickness of approximately 300 Å, the antiferromagnetic layer 4 of the invention is remarkably thin. Thus, the thin film magnetic head of the present invention with a narrow gap can meet the demand for a high recording density.

Note that an inductive head for writing may be formed on the upper shield layer 44.

The magnetic sensing element of the present invention can be applied to a magnetic sensor as well as magnetic head installed in a hard disk device.

Figure 8:
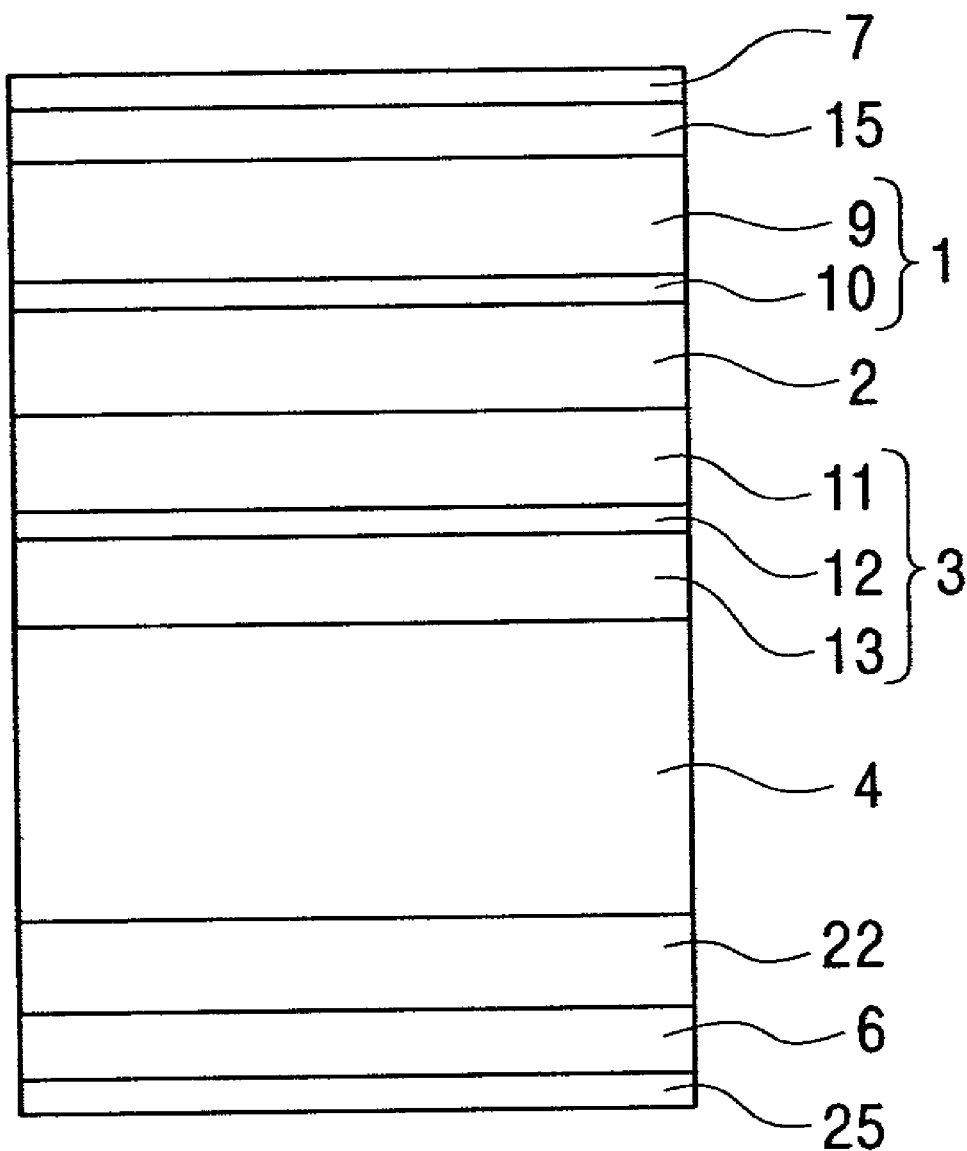
FIG. 8 is a diagram for explaining a step of a method for making a magnetic sensing element of the present invention.

A method for making the magnetic sensing element of the present invention will now be described with reference to FIG. 8.

First, an underlayer 6 is formed on a substrate 25. The underlayer 6 is preferably composed of at least one element selected from Ta, Hf, Nb, Zr, Ti, Mo, and W. The underlayer 6 helps form the face-centered cubic structure in a seed layer 22 which is to be formed on the underlayer 6. Moreover, the underlayer 6 improves the {111} preferred orientation of the seed layer 22.

Next, the seed layer 22, is deposited on the underlayer 6 by sputtering. In the sputter deposition, a NiFeCr or NiCr target is used.

The Cr content in the NiFeCr or NiCr target is in the range of approximately 35 to approximately 60 atomic percent taking into account the deviation between the target composition and the layer composition.

Alternatively, a plurality of targets each composed of an element constituting NiFeCr or NiCr may be used. For NiFeCr, one target may contain two elements. To be more specific, in forming the seed layer 22 composed of NiFeCr, a target composed of NiFe and another target composed of Cr are prepared.

Using the above-described targets, the seed layer 22 is sputter-deposited on the underlayer 6.

The temperature of the substrate 25 during sputter-deposition of the seed layer 22 is preferably in the range of 20 to 100° C. The distance between the substrate 25 and the target is preferably in the range of 40 to 80 mm. The pressure of the Ar gas introduced during the sputter deposition is preferably 0.5 to 3 mTorr (0.067 to 0.4 Pa). Under these conditions, a seed layer 22 having the face-centered cubic structure can be adequately formed.

In sputter-depositing the seed layer 22 using a plurality of targets each composed of an element or elements constituting the seed layer 22, for example, sputter-depositing the seed layer 22 using two targets, namely, a NiFe target and a Cr target, power supplied to the targets is adjusted so that the Cr content of the seed layer 22 is in the range of 35 to 60 atomic percent.

In this invention, the seed layer 22 is sputter-deposited to a thickness in the range of 10 to 200 Å. However, as will be illustrated in a graph below, the thickness of the seed layer 22 must be reduced as the Cr content in the seed layer 22 increases so as to prevent formation of the mixed structure of the bcc and fcc structure in the seed layer 22.

In this invention, preferably, the Cr content of the seed layer 22 is in the range of 40 to 60 atomic percent, and the thickness of the seed layer 22 is in the range of 10 to 170 Å so as to prevent formation of the mixed structure of the bcc and fcc structure in the seed layer 22.

Alternatively, the Cr content of the seed layer 22 may be in the range of 45 to 60 atomic percent, and the thickness of the seed layer 22 may be in the range of 10 to 130 Å so as to prevent formation of the mixed structure of the bcc and fcc structure in the seed layer 22.

Alternatively, in the present invention, the Cr content of the seed layer 22 may be in the range of 40 to 55 atomic percent, and the thickness of the seed layer 22 may be in the range of 10 to 170 Å so as to prevent formation of the mixed structure of the bcc and fcc structure in the seed layer 22.

Alternatively, in the present invention, the Cr content of the seed layer 22 may be in the range of 45 to 55 atomic percent, and the thickness of the seed layer 22 may be in the range of 10 to 130 Å so as to prevent formation of the mixed structure of the bcc and fcc structure in the seed layer 22.

In this invention, the thickness of the seed layer 22 is preferably 80 Å or less, and more preferably, 60 Å or less for any Cr content described above. At such a thickness, the seed layer 22 having only the face-centered cubic structure can be reliably formed, and the shunt loss of the sensing current can be adequately reduced.

In this invention, the composition of the seed layer 22 is represented by $(Ni_{100-x}Fe_x)$—Cr, wherein the atomic ratio x is preferably 0≦x≦70, more preferably 0≦x≦50, and most preferably 0≦x≦30. Since the body-centered structure is readily formed in the seed layer 22 at an excessive Fe content, the composition of the seed layer 22 is limited as above. Moreover, at this composition, the crystal orientation of the antiferromagnetic layer formed thereon is improved, and increase in the crystal grain size, the change in conductivity, and the rate of change in resistance can be expected. Yet more preferably, the atomic ratio X is 20.

Next, an antiferromagnetic layer 4 is deposited on the seed layer 22 by sputtering.

In this invention, the antiferromagnetic layer 4 is preferably deposited by sputtering using an antiferromagnetic material containing Mn and X wherein X is at least one of Pt, Pd, Ir, Rh, Ru, and Os.

Alternatively, in the invention, the antiferromagnetic layer 4 may be deposited by sputtering using an X—Mn—X' alloy wherein X' is at least one element selected from Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb, and rare-earth elements.

Preferably, the X or X+X' content is in the range of 45 to 60 atomic percent.

On the antiferromagnetic layer 4, a pinned magnetic layer 3, a nonmagnetic interlayer 2, a free magnetic layer 1, a back layer 15, and a protective layer 7 are deposited.

As described above, since the Cr content of the seed layer 22 is high, i.e., 35 atomic percent or more, the seed layer 22 exhibits improved wettability. Moreover, since the seed layer 22 has the face-centered cubic structure, the {111} planes can adequately align in the antiferromagnetic layer 4 in a direction parallel to the layer surface. As a result, each of the layers deposited on the antiferromagnetic layer 4 having the {111} orientation will also have {111} orientation in the direction parallel to the layer surface.

Next, annealing is performed. While the antiferromagnetic layer 4 is preferably made of an X—Mn alloy or an X—Mn—X' alloy, these alloys do not generate the exchange coupling magnetic field at the interface with the pinned magnetic layer 3 unless they are annealed. In the present invention, the exchange coupling magnetic field can be generated at the interface between the antiferromagnetic layer 4 and the pinned magnetic layer 3 by performing annealing. During annealing, a magnetic field in the Y direction in the drawing is applied so as to magnetize the pinned magnetic layer 3 in the Y direction in the drawing.

By annealing, crystal grains growing across a plurality of layers can be formed above the seed layer 22, although no crystal grains grow across the interface between the antiferromagnetic layer 4 and the pinned magnetic layer 3. Particularly, in the present invention, the size of the crystal grain in the direction parallel to the layer surface can be increased to 100 Å or more.

In the above-described method for making the magnetic sensing element of the present invention, the Cr content in the seed layer 22 can be increased by adjusting the Cr content in relation to the thickness while adequately maintaining the face-centered cubic structure; hence, each of the layers deposited on the seed layer 22 can have the {111} orientation in the direction parallel to the layer surface, and the average crystal grain size in the direction parallel to the layer surface can be increased.

In this manner, an increase in resistance of the spin-valve thin film element and the diffusion between layers can be prevented. As a result, resistance to electromigration can be improved, and the current-carrying reliability can be improved.

Moreover, according to the present invention, the rate of change in resistance ΔR/R can be improved, and the change in conductivity ΔG can be increased. The thermal noise can be reduced.

In this invention, the soft magnetic property of the free magnetic layer 1 constituting the spin-valve thin film element can be improved. In particular, the crystal magnetic anisotropy energy K generated during magnetization rotation at the surface of the free magnetic layer 1 can be reduced. As a result, the coercive force Hc in proportion to the crystal magnetic anisotropy energy K at the surface can be reduced, and the magnetization rotation of the free magnetic layer 1 in response to the external magnetic field can be improved. The single spin-valve magnetoresistive element of the present invention thus exhibits improved sensitivity.

According to the present invention, a spin-valve magnetoresistive element which can sufficiently withstand high-density sensing current which is required to read higher density recordings in the near future can be manufactured.

The method for making the seed layer 22 is common to all the magnetic sensing elements shown in FIGS. 2 to 4.

EXAMPLES

In the following Examples, a NiFeCr layer (seed layer) was deposited on a substrate by sputtering. The relationship between the thickness of the NiFeCr layer, the Cr content in the NiFeCr layer, and the crystal structure of the NiFeCr layer was examined.

The atomic ratio of Ni to Fe contained in NiFeCr was set to 8:2.

The temperature of the substrate during the deposition of the NiFeCr layer by sputtering was 30° C., the distance between the substrate and the target was 60 mm, and the pressure of the Ar gas was 1 mTorr (0.13 Pa).

Figure 10:
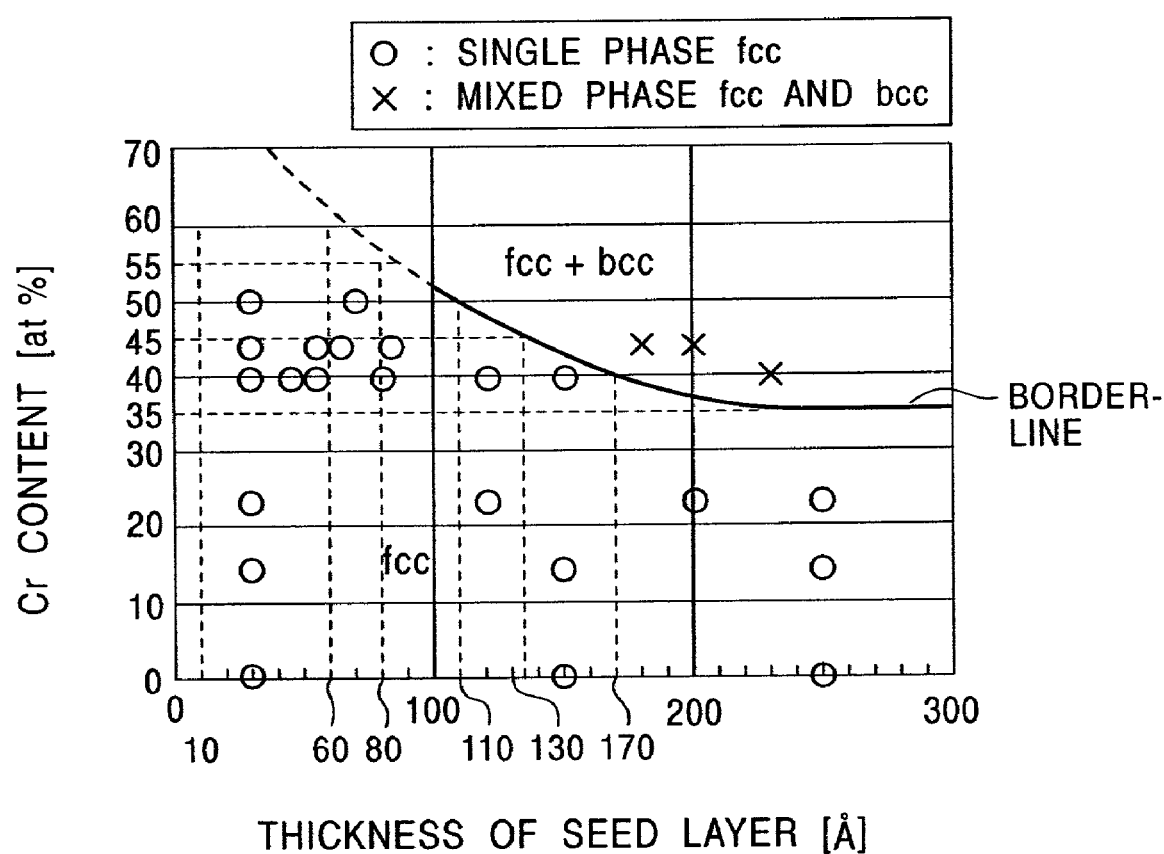
FIG. 10 is a graph showing the relationship between the thickness, the Cr content, and the crystal structure of the seed layer.

The results of the examination are shown in FIG. 10. In the graph, a circular symbol represents the single phase of the face-centered cubic structure (fcc structure) and a cross-like symbol represents the mixed structure of the fcc structure and the body-centered cubic structure (bcc structure).

As can be understood from FIG. 10, in order to improve the wettability by increasing the Cr content and to form a NiFeCr layer having only the fcc structure, the thickness of the NiFeCr layer must be reduced.

In FIG. 10, a borderline was drawn between those combinations of the Cr content and the thickness of the NiFeCr layer capable of forming the NiFeCr layer having the single phase of the fcc structure and those combinations of the Cr content and the thickness of the NiFeCr layer which form a mixed phase of the fcc and bcc structures. Based on this borderline, the combinations of the Cr content and the thickness of the NiFeCr layer capable of improving the wettability and forming the NiFeCr layer having the single phase of the fcc structure were determined.

Figure 9:
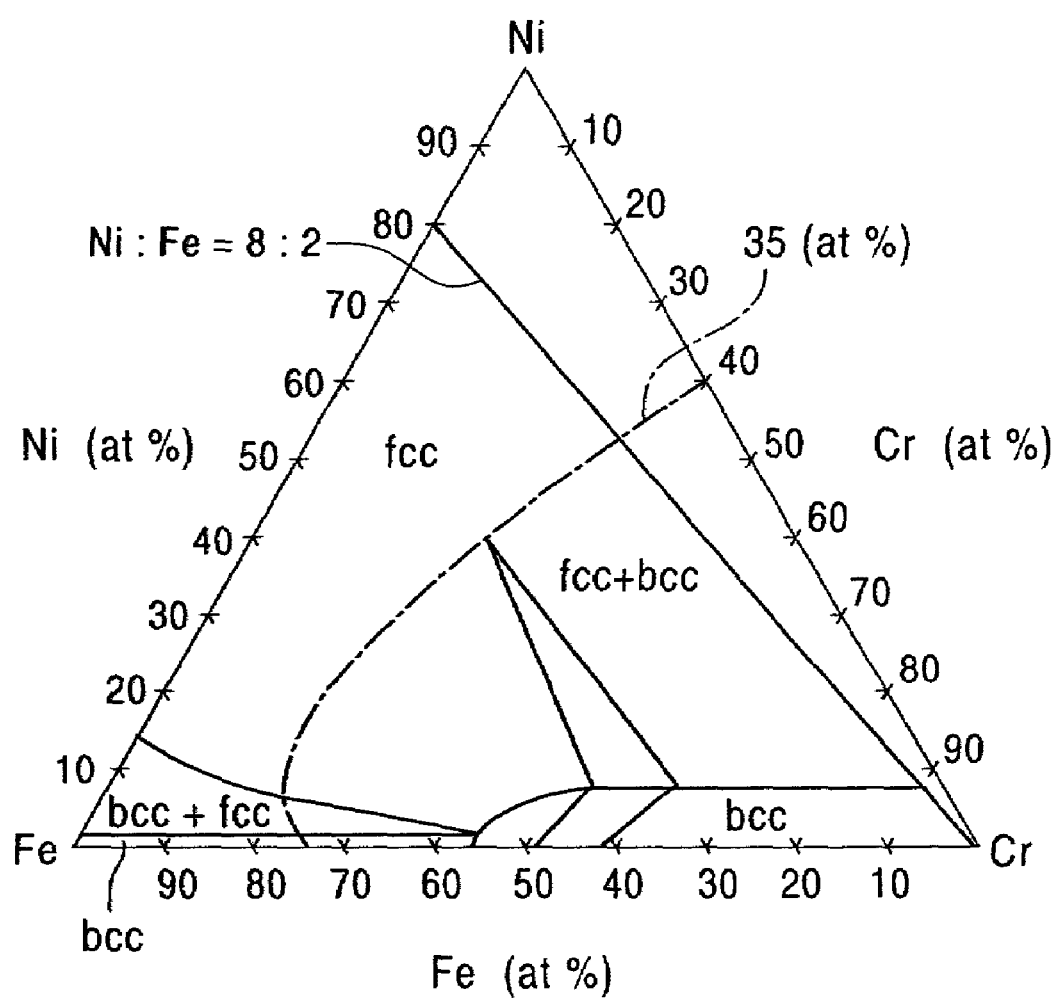
FIG. 9 is a ternary equilibrium showing the relationships between the contents of the individual elements and the crystal structures of a bulk NiFeCr alloy.

Conventionally, the Cr content of the NiFeCr layer was set at 35 atomic percent or less because, as described above with reference to FIG. 9, with a bulk NiFeCr having the atomic ratio of Ni to Fe of 8:2, NiFeCr having the single phase of the fcc structure can be made by limiting the Cr content to 35 atomic percent or less.

However, we found through the experiments that by controlling the thickness of the NiFeCr layer, the NiFeCr layer having the single phase of the fcc can be formed even when the Cr content is 35 atomic percent or more.

In the present invention, the Cr content in the NiFeCr layer is limited to the range of 35 to 60 atomic percent. The upper limit of the Cr content is 60 atomic percent because, at a Cr content exceeding 60 atomic percent, it is difficult make a NiFeCr layer having the single phase of the fcc structure even with a significantly small thickness. Moreover, at a Cr content exceeding 60 atomic percent, the thickness of the NiFeCr layer must be significantly reduced. With such a reduced thickness, it is difficult to achieve the {111} orientation in the NiFeCr layer, and such a NiFeCr layer cannot fully function as the seed layer.

As shown in FIG. 10, the NiFeCr layer having only the fcc structure can be made by adjusting the NiFeCr layer to a thickness of 200 Å or less at a Cr content in the range of 35 to 60 atomic percent.

The lower limit of the thickness of the NiFeCr layer is 10 Å. At a thickness smaller than 10 Å, it is difficult to achieve the {111} orientation in the NiFeCr layer although the crystal structure thereof can be maintained as the single phase of the fcc structure. Accordingly, at such a thickness, the seed layer cannot fully function as the seed layer for forming layers having the {111} orientation.

On the other hand, the thickness of the NiFeCr layer is preferably as small as possible because the shunt loss due to current flowing to the seed layer is large in the NiFeCr layer having a large thickness. In this invention, the preferable range of the thickness of the NiFeCr layer is the range of 10 to 80 Å.

In this manner, the shunt loss can be reduced, and the single phase of the fcc structure can be easily formed at a thickness in the above-described range.

In this invention, the NiFeCr layer can be reliably formed as the single phase of the fcc structure at a Cr content in the range of 35 to 60 atomic percent if the thickness thereof is controlled to a thickness in the range of 10 to 60 Å. Moreover, the shunt loss can be reduced at a thickness of 60 Å or less.

Next, using a seed layer composed of NiFeCr, a magnetic sensing element (single spin-valve thin film element) having the following layer structure was prepared, from the bottom: a Si substrate; $Al_2O_3$ 1,000 Å in thickness; a Ta underlayer; a seed layer; a PtMn antiferromagnetic layer 170 Å in thickness; a pinned magnetic layer [a $Co_{90}Fe_{10}$ sublayer 17 Å in thickness, a Ru sublayer 9 Å in thickness, and a $Co_{90}Fe_{10}$ sublayer 22 Å in thickness]; a nonmagnetic intermediate layer Cu 21 Å in thickness; a free magnetic layer [a $Co_{90}Fe_{10}$ sublayer 10 Å in thickness and a $Ni_{80}Fe_{20}$ sublayer 14 Å in thickness]; a Cu back layer 10 Å in thickness; and a Ta layer 15 Å in thickness.

Using the above layer structure, six test pieces of magnetic sensing elements differing in the thickness and in the Cr content of the NiFeCr seed layer were prepared. The atomic ratio of Ni to Fe in NiFeCr was set to 8:2 for all of the test pieces. Also, a magnetic sensing element having the above-described layer structure having a NiFe seed layer was prepared. The structure of the Ta underlayer and the seed layer of each sample piece is shown in Table 1 below.

each of the layers formed on the seed layer achieves the {111} preferred orientation in the direction parallel to the layer surface. The rate of change in resistance peaked at a Cr content of approximately 45 atomic percent. Further increases in the Cr content did not improve but rather decreased the rate of change in resistance. This is because at a high Cr content, although the single phase of the fcc structure can be formed by reducing the thickness according to FIG. 10, the seed layer has an insufficient {111} orientation. Thus, each layer formed on such a seed layer cannot have a sufficient {111} orientation.

Next, using Samples 1 to 6, the relationship between the Cr content of the seed layer and the change in conductivity ΔG was examined. The results are shown in FIG. 12.

Figure 12:
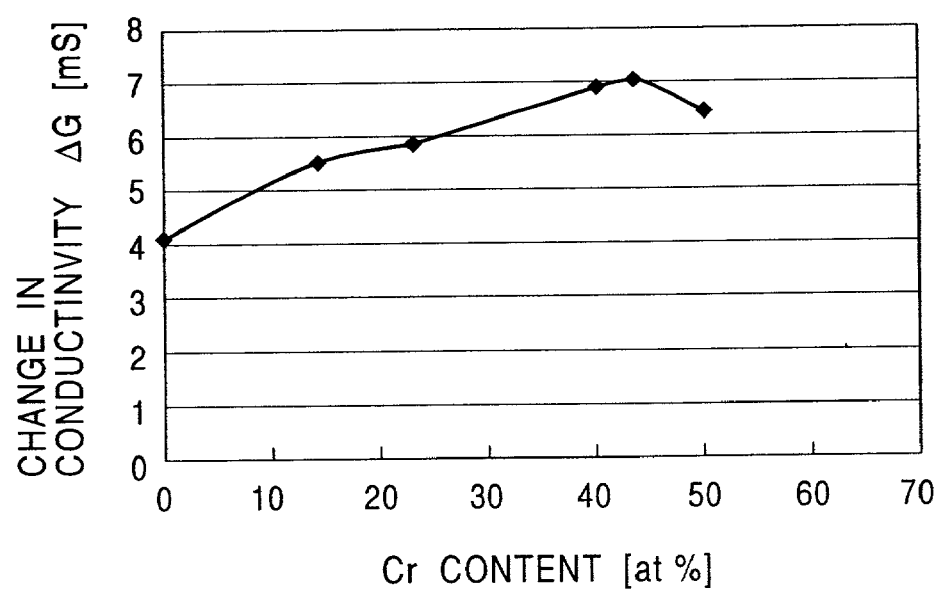
FIG. 12 is a graph showing the relationship between the Cr content of the seed layer and the change in the conductivity ΔG.

As shown in FIG. 12, the change in conductivity increased with the Cr content of the seed layer. As with the rate of change in resistance, the change in conductivity also peaked at a Cr content of approximately 45 atomic percent. Further increase in the Cr content did not improve but rather decreased the change in conductivity. The reason for this is the same as that described in relation with the rate of change in resistance.

Next, using Samples 1 to 6, the relationship between the Cr content of the seed layer and the average crystal grain size (Å) in the planar direction of the pinned magnetic layer,

TABLE 1

| Sample No. | Underlayer/ Seed Layer | Cr Content [at. %] | Rate of Change in Resistance ΔR/R [%] | Change in Conductivity Δ[mS] (= [$10^{-3} \Omega^{-1}$]) | Crystal Structure of Seed Layer | Average Grain Size in the planar (transverse) direction of Pinned Magnetic Layer/Nonmagnetic Intermediate Layer/ Free Magnetic Layer [Å] | Heat Resistance [° C.] |
|---|---|---|---|---|---|---|---|
| 1 | Ta (30 Å)/ NiFe (30 Å) | 0 | 9.28 | 4.12 | fcc | 161 | 320 |
| 2 | Ta (30 Å)/ NiFeCr (30 Å) | 13.9 | 10.85 | 5.48 | fcc | 170 | 330 |
| 3 | Ta (30 Å)/ NiFeCr (30 Å) | 23.1 | 11.51 | 5.84 | fcc | 179 | 343 |
| 4 | Ta (30 Å)/ NiFeCr (45 Å) | 39.4 | 12.72 | 6.87 | fcc | 201 | 358 |
| 5 | Ta (30 Å)/ NiFeCr (55 Å) | 43.6 | 12.94 | 6.99 | fcc | 205 | 361 |
| 6 | Ta (30 Å)/ NiFeCr (70 Å) | 50.2 | 11.9 | 6.60 | fcc | 185 | 356 |
| 7 | NiFeCr (55 Å) | 39.4 | 12.89 | 6.8 | fcc | 209 | 370 |
| 8 | NiFeCr (65 Å) | 43.6 | 12.96 | 7.12 | fcc | 212 | 375 |

Referring to Table 1, in Sample 1, a NiFe layer having a thickness of 30 Å was formed on the Ta layer having a thickness of 30 Å. In Samples 2 to 6, NiFeCr layers of different thicknesses and Cr contents were formed on Ta layers having a thickness of 30 Å. In Samples 7 and 8, no Ta underlayer was formed, and NiFeCr layers having different thicknesses and Cr contents were formed directly on $Al_2O_3$ layers. Table 1 also shows the rates of change in resistance examined below.

Using Samples 1 to 6 of magnetic sensing elements, the relationship between the Cr content in the seed layer and the rate of change in resistance ΔR/R was examined. The results are shown in FIG. 11.

Figure 11:
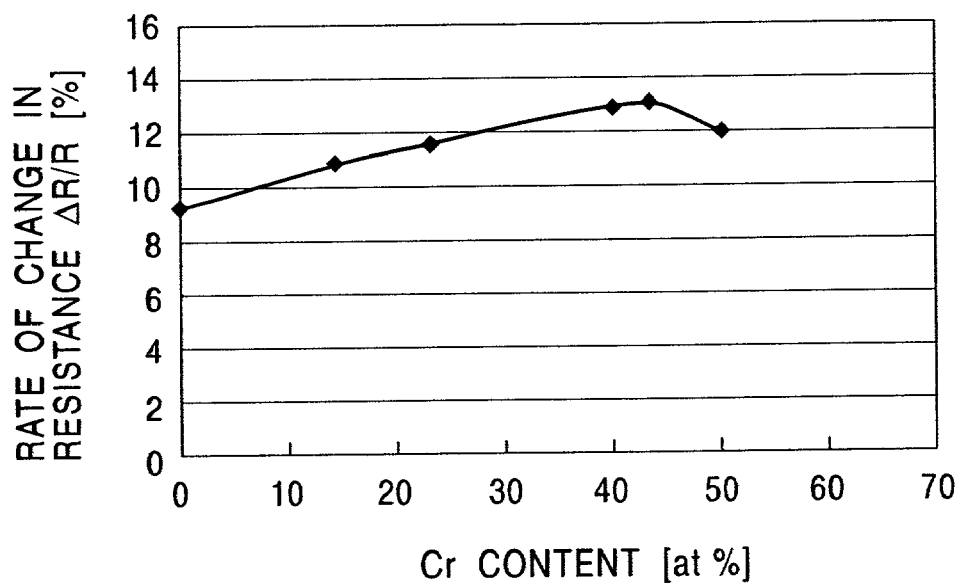
FIG. 11 is a graph showing the relationship between the Cr content of the seed layer and the rate of change in resistance ΔR/R.

As shown in FIG. 11, the rate of change in resistance increased with the Cr content. This is because at a high Cr content, the wettability of the seed layer is improved, and the nonmagnetic intermediate layer, and the free magnetic layer was examined. The results are shown in FIG. 13.

Figure 13:
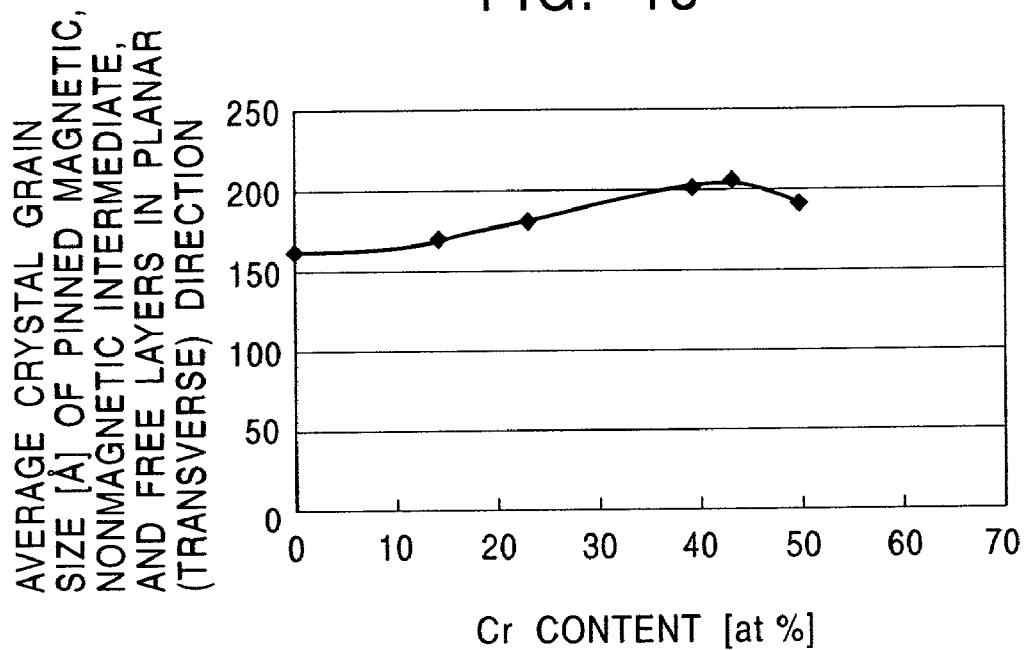
FIG. 13 is a graph showing the relationship between the Cr content of the seed layer and the average crystal grain diameter of a pinned magnetic layer, a nonmagnetic interlayer, and a free magnetic layer in a planar direction.

As shown in FIG. 13, the average crystal grain size increased with the Cr content of the seed layer until the Cr content of the seed layer reached approximately 45 atomic percent. Further increases in the Cr content do not improve but rather decrease the change in conductivity. The reason for this is the same as that described in relation with the rate of change in resistance.

In the present invention, the Cr content of the seed layer is set to the range of 35 to 60 atomic percent. Based on the results shown in FIGS. 11 to 13, at a Cr content in the range of 35 to 60 atomic percent, the rate of change in resistance is approximately 11% or more, the change in conductivity is approximately 6 (mS) or more, and the average crystal grain size is 175 Å or more.

Next, preferable ranges of the Cr content of the seed layer will be explained.

When the Cr content of the seed layer is in the range of 40 to 60 atomic percent, the rate of change in resistance, the change in conductivity, and the average crystal grain size can be increased. As is apparent from FIG. 10, at a Cr content in the range of 40 to 60 atomic percent, the thickness of the seed layer must be in the range of 10 to 170 Å to form the single phase of the fcc structure in the seed layer. At a thickness of the seed layer of 80 Å or less, and more particularly, 10 to 80 Å, the single phase of the fcc structure can be readily formed, and the shunt loss of the sensing current can be reduced.

At a thickness of the seed layer of 60 Å or less, and more particularly, 10 to 60 Å, the single phase of the fcc structure can be reliably formed using any one of the above-described Cr content. The shunt loss of the sensing current can be further reduced.

Next, in the present invention, the rate of change in resistance, the change in conductivity, and the average crystal grain size can be further increased by setting the Cr content of the seed layer to a value in the range of 45 to 60 atomic percent. As is apparent from FIG. 10, the thickness of the seed layer must be in the range of 10 to 130 Å at a Cr content in the range of 45 to 60 atomic percent in order to make the single phase of the fcc structure in the seed layer. At a thickness of the seed layer of 80 Å or less, the single phase of the fcc structure can be readily formed, and the shunt loss of the sensing current can be reduced.

At a thickness of the seed layer of 60 Å or less, and more particularly 10 to 60 Å, the single phase of the fcc structure can be reliably formed in the seed layer at any one of the Cr contents described above. The shunt loss of the sensing current can be further reduced.

In the present invention, the Cr content of the seed layer is preferably in the range of 40 to 50 atomic percent. In this manner, the rate of change in resistance can be set at approximately 13%, the change in conductivity can be set to approximately 7 (mS), and the average crystal grain size can be set to 200 Å or more. As is apparent from FIG. 10, the thickness of the seed layer must be in the range of 10 to 170 Å at a Cr content in the range of 40 to 50 atomic percent in order to form the single phase of the fcc structure in the seed layer.

At such a Cr content, the single phase of the fcc can be reliably formed in the seed layer by setting the thickness of the seed layer to 110 Å or less, more particularly, 10 to 110 Å.

By setting the thickness of the seed layer to 80 Å or less, i.e., 10 to 80 Å, and more preferably, 60 Å or less, i.e., 10 to 60 Å, the single phase of the fcc structure can be reliably formed in the seed layer at any of the above-described Cr contents. At such a small thickness, the shunt loss of the current can be reduced.

In the present invention, the Cr content of the seed layer may be in the range of 45 to 55 atomic percent. At such a Cr content, the rate of change in resistance can be set to approximately 13%, the change in conductivity can be set to 7 (mS), and the average crystal grain size can be set to approximately 200 Å or more. As is apparent from FIG. 10, at a Cr content in the range of 45 to 55 atomic percent, the thickness of the seed layer must be in the range of 10 to 130 Å to make the single phase of the fcc structure in the seed layer.

At such a Cr content, the single phase of the fcc structure can be reliably formed in the seed layer by setting the thickness of the seed layer to 80 Å or less, and more particularly, 10 to 80 Å.

The thickness of the seed layer is most preferably 60 Å or less, more particularly, 10 to 60 Å. At such a thickness, the single phase of the fcc structure can be reliably formed at any of the above-described Cr contents. Moreover, the shunt loss of the current can be reduced due to such a small thickness.

Next, using Samples 3, 4, and 7 in Table 1, the relationship between annealing temperatures and the rate of change in resistance ΔR/R was examined. The results are shown in Table 2.

TABLE 2

| Sample No. | Underlayer/ Seed layer | Cr Content [at. %] | Rate of Change in Resistance ΔR/R (ΔR/R at 290° C. = 1) | | | | |
|---|---|---|---|---|---|---|---|
| | | | Annealed at 290° C. | Annealed at 330° C. | Annealed at 350° C. | Annealed at 370° C. | Annealed at 400° C. |
| 3 | Ta (30 Å)/ NiFeCr (30 Å) | 23.1 | 1 | 0.99 | 0.93 | 0.77 | 0.51 |
| 4 | Ta (30 Å)/ NiFeCr (45 Å) | 39.4 | 1 | 0.98 | 0.97 | 0.92 | 0.78 |
| 7 | NiFeCr (55 Å) | 39.4 | 1 | 1 | 0.99 | 0.95 | 0.63 |

In the experiment, annealing was performed while applying a magnetic field of 790 k(A/m) in the same direction as the magnetization direction of the CoFe pinned magnetic layer in contact with a PtMn antiferromagnetic layer at temperatures shown in Table 2, namely, 290° C., 330° C., 350° C., 370° C., and 400° C. maintained for one hour.

In Table 2, the rate of change in resistance is described in terms of the ratio of the rate of change in resistance at each of the annealing temperatures normalized by the rate of change in resistance at an annealing temperature of 290° C.

Figure 14:
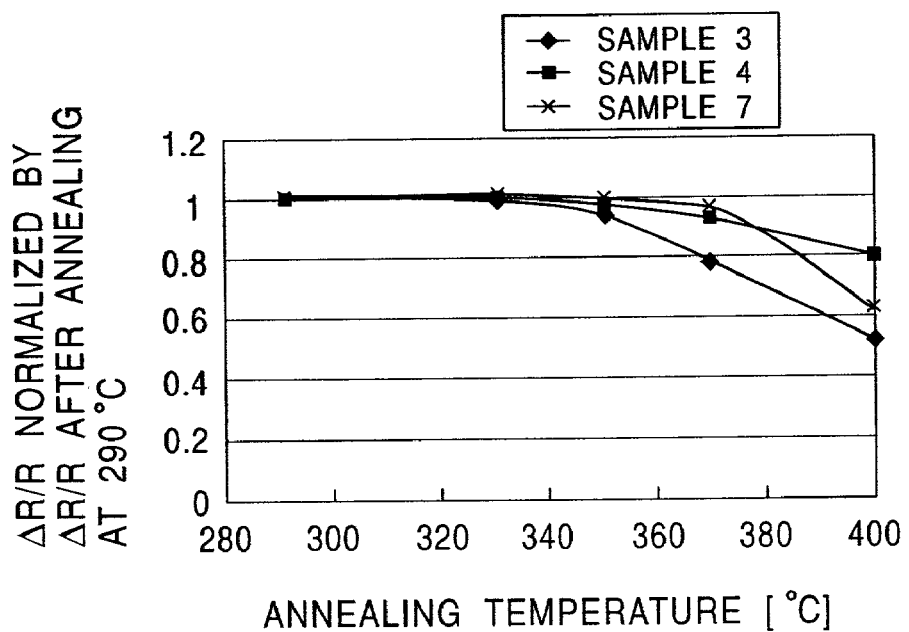
FIG. 14 is a graph showing the relationship between annealing temperatures and rates of change in resistance ΔR/R normalized by the rate of change in resistance ΔR/R after annealing at a temperature of 290° C., examined by using three samples including seed layers having different Cr contents.

Based on Table 2, a graph in FIG. 14 was plotted. As shown in FIG. 14, the rate of change in resistance tends to decrease as the annealing temperature increases. Such a decrease in the rate of change in resistance is due to diffusion between layers. In order to prevent diffusion between layers caused by annealing, each of the layers must have the {111} orientation in the direction parallel to the layer surface.

In Sample 3, the rate of change in resistance remarkably decreased at temperatures of approximately 340° C. or more. This is because the Cr content in the seed layer of Sample 3 is low, namely, 23.1 atomic percent (refer to Table 2).

At such a low Cr content, the wettability of the surface of the seed layer is degraded, and the seed layer is no longer capable of adequately forming the layers having the {111} preferred orientations in the direction parallel to the layer surface, resulting in the diffusion between the layers during high-temperature annealing.

Figure 15:
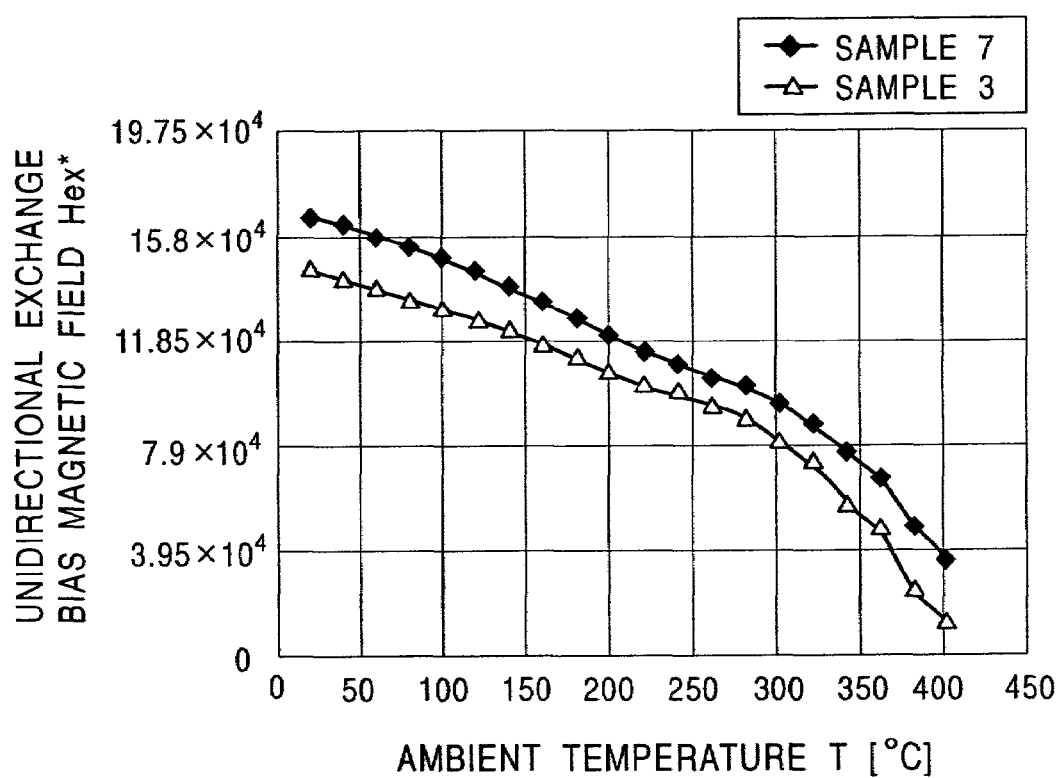
FIG. 15 is a graph showing the relationship between ambient temperatures and unidirectional exchange bias magnetic fields examined by using two samples including seed layers having different Cr contents.

Using Samples 3 and 7, the relationship between ambient temperatures and unidirectional exchange bias magnetic fields in the pined magnetic layer were examined. The results are shown in FIG. 15. Here, the unidirectional exchange bias magnetic field Hex* is the magnitude of the external magnetic field when the rate of change in resistance ΔR/R is half the maximum value. The unidirectional exchange bias magnetic field includes the exchange coupling magnetic field generated between the pinned magnetic layer and the antiferromagnetic layer and the coupling magnetic field generated between the CoFe sublayers constituting the pinned magnetic layer having the synthetic ferrimagnetic structure as a result of the RKKY interaction. The larger the unidirectional exchange bias magnetic field, the easier the pinning of the magnetization of the pinned magnetic layer in a specific direction.

As shown in FIG. 15, the magnetic sensing element of Sample 7 always exhibited larger unidirectional exchange bias magnetic fields compared to Sample 3. Sample 7 having a seed layer containing 39.4 atomic percent of Cr was superior to Sample 3 having a seed layer containing 23.1 atomic percent of Cr in heat resistance and in thermally stabilizing pinning of the pinned magnetic layer.

In both Samples 7 and 3, the unidirectional exchange bias magnetic field decreased as the ambient temperature increased.

Next, while defining the magnitude of the unidirectional exchange bias magnetic field at room temperature (25° C.) as 1, the ratios of the unidirectional exchange bias magnetic fields at various ambient temperatures relative to the above-described unidirectional exchange bias magnetic field at room temperature were examined. The results are shown in FIG. 16.

Figure 16:
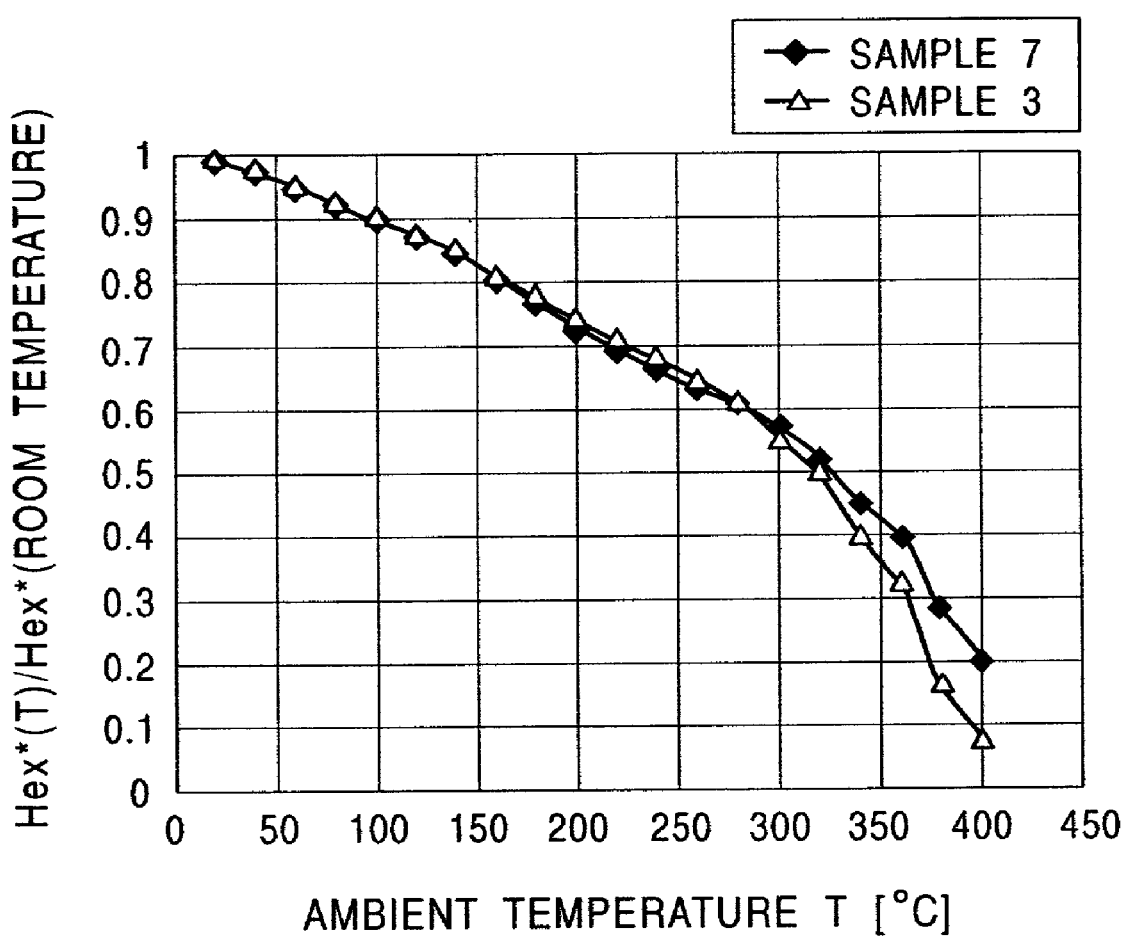
FIG. 16 is a graph showing the relationship between ambient temperatures and Hex*/Hex*(room temperature) examined by using the same two samples as in FIG. 15.

As shown in FIG. 16, Hex*/Hex*(room temperature) of Samples 3 and 7 showed similar behavior until the ambient temperature reached approximately 300° C.

At an ambient temperature exceeding approximately 320° C., Hex*/Hex*(room temperature) of Sample 7 was higher than that of Sample 3. In other words, Sample 7 was superior to Sample 3 since a rapid decrease in the unidirectional exchange bias magnetic field was prevented. Sample 7 exhibited superior thermal resistance and was capable of thermally stabilizing the pinning of the pinned magnetic layer in higher ambient temperatures.

As described above, Sample 7 having a larger Cr content maintained superior thermal stability of the unidirectional exchange bias magnetic field compared to Sample 3 having a smaller Cr content. This is because at a large Cr content, the wettability of the surface of the seed layer can be improved, the crystal grain size in the direction parallel to the layer surface in each of the layers formed on the seed layer can be increased, and the magnitude of the crystal magnetic anisotropy energy $K_{AF}$ of the antiferromagnetic layer can be increased, thereby raising the blocking temperature.

Figure 17:
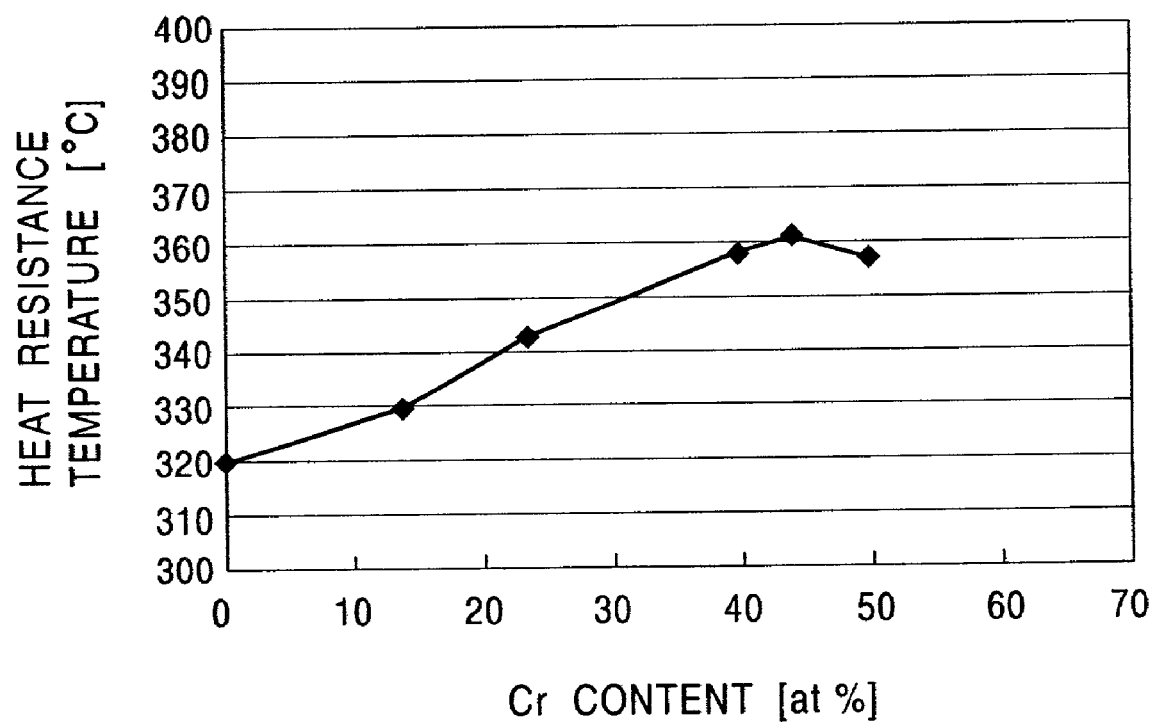
FIG. 17 is a graph showing the Cr content of the seed layer and heat resistance temperatures.
Figure 18:
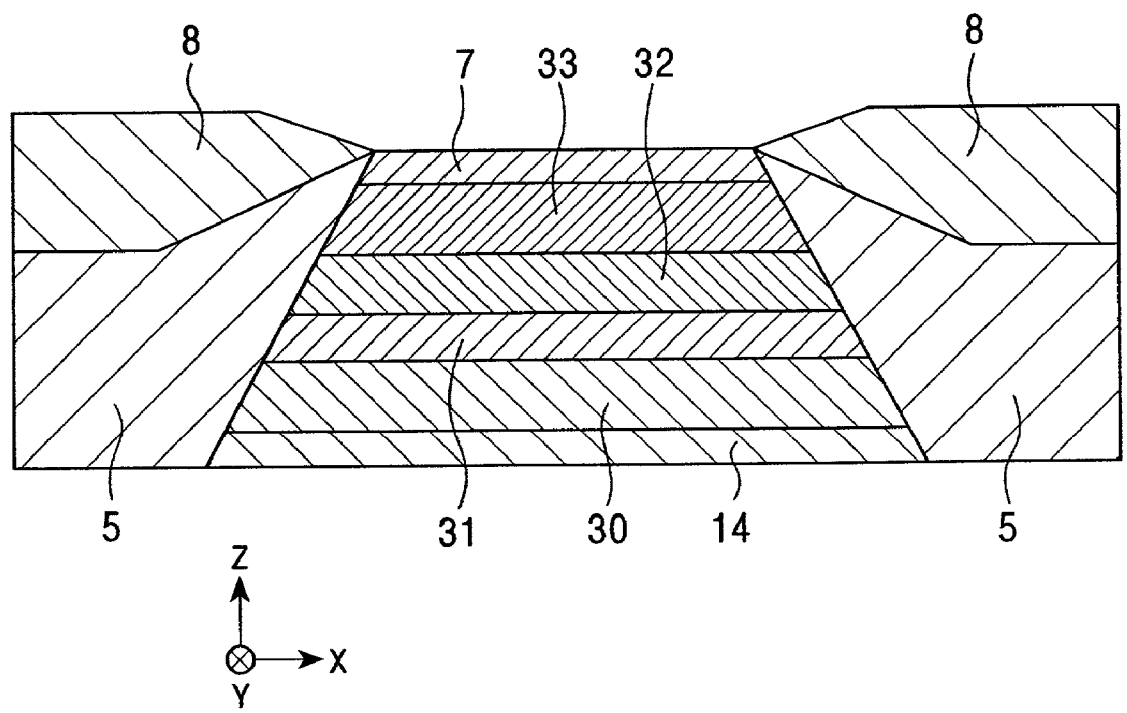
FIG. 18 is a partial cross-sectional view of a magnetic sensing element of the related art, viewed from the face opposing a recording medium.

FIG. 17 shows results of the experiments for examining the relationship between the Cr content in the seed layer and the heat resistance temperature. Herein, the heat resistance temperature is defined as an annealing temperature at which the rate of change in resistance deteriorated to 0.95 from 1 which is the rate of change in resistance at an annealing temperature of 290° C. The experiments were performed using Samples 1 to 6 in Table 1.

As shown in FIG. 17, the heat resistance temperature increased with the Cr content of the seed layer although a slight decrease was observed at a Cr content of 50 atomic percent or more. In the present invention, the Cr content of the seed layer is limited to the range of 35 to 60 atomic percent; accordingly, the heat resistance temperature can be 350° C. or more in the present invention. Thus, the heat resistance temperature and thus current-carrying reliability can be improved by setting the Cr content to the above-described range. Note that in this case also, the thickness of the seed layer should be controlled according to FIG. 10 so that the single phase of the fcc structure is formed in the seed layer.

As shown in FIG. 17, the more preferable range of the Cr content is 40 to 50 atomic percent since the heat resistance temperature can be improved to approximately 360° C.

Next, Samples 7 and 8 having no Ta underlayers were examined.

As shown in Table 1, Sample 7 was the same as Sample 4 in the Cr content of the seed layer. The seed layer of Sample 7 had a thickness 10 Å larger than that of Sample 4.

Referring to Table 1, no significant differences were observed in the rate of change in resistance, the change in conductivity, the average crystal grain size, and the heat resistance temperature between Samples 7 and 4, although Sample 7 with no Ta underlayer performed slightly better than Sample 4.

Referring to Table 1, Sample 8 was the same as Sample 5 in the Cr content of the seed layer. The seed layer of Sample 8 had a thickness 10 Å larger than that of Sample 5.

Referring to Table 1, no significant differences were observed in the rate of change in resistance, the change in conductivity, the average crystal grain size, and the heat resistance temperature between Samples 8 and 5, although Sample 8 with no Ta underlayer performed slightly better than Sample 5.

Although the Ta underlayer is preferably formed to improve the {111} orientation of the seed layer formed thereon, Samples 7 and 8 with no Ta underlayer also exhibited satisfactory results in the rate of change in resistance, etc. This is because the thickness of the seed layer was made larger than the case when the Ta underlayer is formed to reduce the influence of the base layer to the surface of the seed layer. Moreover, the shunt loss of the sensing current which would otherwise flow into the Ta underlayer was prevented.

In this respect, in the case where no Ta underlayer is formed, the thickness of the seed layer is preferably larger but within the range described in reference with FIG. 10 required to form the single phase of the fcc structure in the seed layer.

The crystal structure of the seed layer is not determined merely by the Cr content and the layer thickness. Especially, the sputtering conditions are important. Even if the Cr content and the layer thickness satisfy the ranges capable of making the fcc structure according to FIG. 10, the crystal structure of the seed layer may not always be formed as the single phase of the fcc structure.

As described earlier, the temperature of the substrate during the deposition of the seed layer by sputtering is preferably adjusted to a temperature in the range of 20 to 100° C., the distance between the substrate and the target is preferably in the range of 40 to 80 mm, and the pressure of the Ar gas introduced during deposition by sputtering is preferably in the range of 0.5 to 3 mTorr (0.067 to 0.4 Pa).

Fifth Embodiment

Figure 19:
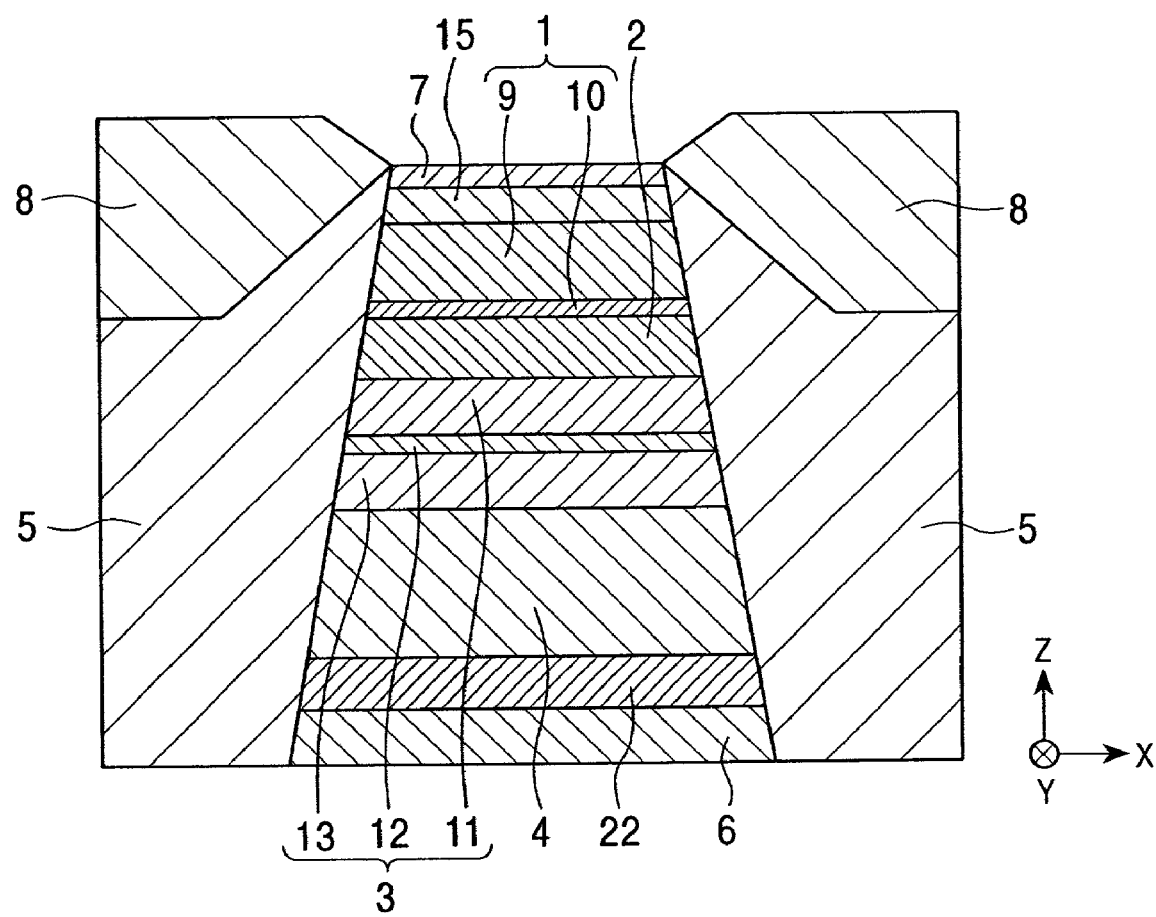
FIG. 19 is a cross-sectional view showing the structure of a magnetic sensing element (single spin-valve magnetoresistive element) according to a fifth embodiment of the present invention, viewed from the face opposing a recording medium.

FIG. 19 is a cross-sectional view from the face opposing a recording medium showing an overall structure of a magnetic sensing element (single spin-valve magnetoresistive element) according to a fifth embodiment of the present invention. In FIG. 19, only the central portion of the element extending in the X direction is illustrated in cross section.

The single spin-valve magnetoresistive element is mounted at the trailing end of a floating slider installed in a hard disk device to detect magnetic fields recorded on a hard disk, for example. A magnetic recording medium such as a hard disk moves in the Z direction and the leakage magnetic field from the magnetic recording medium is in the Y direction.

Referring to FIG. 19, an underlayer 6 composed of a nonmagnetic material containing at least one element selected from Ta, Hf, Nb, Zr, Ti, Mo, and W is formed. The underlayer 6 is illustrated in FIG. 19 as the bottommost layer. A seed layer 22, an antiferromagnetic layer 4, a pinned magnetic layer 3, a nonmagnetic interlayer 2, and a free magnetic layer 1 are deposited on the underlayer 6.

The antiferromagnetic layer 4 deposited on the seed layer 22 is preferably composed of an antiferromagnetic material containing X and Mn, wherein X is at least one element selected from Pt, Pd, Ir, Rh, Ru, and Os.

X—Mn alloys containing platinum group metals are excellent as antiferromagnetic materials because they exhibit superior corrosion resistance and high blocking temperatures and can generate large exchange coupling magnetic fields (Hex). Platinum (Pt) is especially preferable among the platinum group elements. For example, a binary PtMn alloy may be used.

In this embodiment, the antiferromagnetic layer 4 may be composed of an antiferromagnetic material containing X, X', and Mn, wherein X' is at least one element selected from Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

Preferably, an element or elements which form a solid solution by entering the interstices in the space lattice constituted from X and Mn (an interstitial solid solution) or by replacing some of the lattice points in the crystal lattice constituted from X and Mn (a substitutional solid solution) are used as X'. Here, the term "solid solution" refers to a solid in which components are uniformly mixed over wide ranges.

The X—Mn—X' alloy as the interstitial or substitutional solid solution has a larger lattice constant compared with that of the X—Mn alloy. As a result, the difference between the lattice constant of the antiferromagnetic layer 4 and that of the pinned magnetic layer 3 can be made wider so as to allow the interface structure between the antiferromagnetic layer 4 and the pinned magnetic layer 3 to enter a non-coherent state. Herein, the term "non-coherent state" refers to a state in which the atoms constituting the antiferromagnetic layer 4 and the atoms constituting the pinned magnetic layer 3 do not exhibit one-to-one correspondence at the interface between the antiferromagnetic layer 4 and the pinned magnetic layer 3.

When an element or elements which form a substitutional solid solution is used as X', an excessive X' content deteriorates the antiferromagnetic property and reduces the magnitude of the exchange coupling magnetic field generated at the interface with the pinned magnetic layer 3. Moreover, in the present invention, X' is preferably at least one inert rare gas element selected from Ne, Ar, Kr, and Xe which forms an interstitial solid solution. Since rare gas elements are inert, these gases barely affect the antiferromagnetic characteristics even when they are contained in the layers. For example, Ar, which is frequently used as a sputtering gas in sputtering apparatuses, can readily enter the layer simply by optimizing the gas pressure.

When a gaseous element or elements are used as X', it is difficult for the layer to contain a large amount of the element X'. However, these rare gases can remarkably increase the exchange coupling magnetic field generated by annealing even in a small amount.

In the present invention, the X' content is preferably 0.2 to 10 atomic percent and more preferably, 0.5 to 5 atomic percent. X is preferably Pt, since use of a Pt—Mn—X' alloy is preferred in the present invention.

In the present invention, the X content or the X+X' content in the antiferromagnetic layer 4 is preferably in the range of 45 to 60 atomic percent, and more preferably, 49 to 56.5 atomic percent. In this manner, the interface with the pinned magnetic layer 3 is put into a non-coherent state during deposition, and the antiferromagnetic layer 4 can achieve an adequate order transformation by annealing.

The pinned magnetic layer 3 formed on the antiferromagnetic layer 4 is constituted of three sublayers (triple-layer structure).

The pinned magnetic layer 3 is constituted of a first Co sublayer 11, a Ru sublayer 12, and a second Co sublayer 13. The first Co sublayer 11 is magnetized in a direction antiparallel to the magnetization direction of the second Co sublayer 13 by the exchange coupling magnetic field between the pinned magnetic layer 3 and the antiferromagnetic layer 4 and by the antiferromagnetic exchange coupling magnetic field generated via the Ru sublayer 12 (RKKY interaction). This antiparallel state, which is known as a synthetic ferrimagnetic coupling state, can stabilize the magnetization of the pinned magnetic layer 3 and increase the apparent exchange coupling magnetic field generated at the interface between the pinned magnetic layer 3 and the antiferromagnetic layer 4.

The thickness of the first Co sublayer 11 is approximately 20 Å, for example. The thickness of the Ru sublayer 12 is approximately 8 Å, and the thickness of the second Co sublayer 13 is approximately 15 Å, for example.

The pinned magnetic layer 3 may be formed as, for example, a single layer or a composite of magnetic layers instead of the triple layer structure. Each of the first Co sublayer 11, the Ru sublayer 12, and the second Co sublayer may be composed of a material other than the above-described magnetic material. For example, a NiFe alloy, a CoFe alloy, or CoFeNi alloy may be used to form the sublayer 11 and the sublayer 12. The sublayer 12 may be composed of Rh, Ir, Cr, Re, or Cu, for example.

The nonmagnetic interlayer 2 formed on the pinned magnetic layer 3 is composed of Cu, for example. When the magnetic sensing element of this embodiment is applied to a tunneling magnetoresistive element (TMR element) utilizing the tunneling effect, the nonmagnetic interlayer 2 is composed of an insulating material such as $Al_2O_3$, for example.

A free magnetic layer 1 constituted of two sublayers is disposed on the nonmagnetic interlayer 2.

The free magnetic layer 1 is constituted of a NiFe alloy sublayer 9 and a Co sublayer 10. As shown in FIG. 19, the Co sublayer 10 comes into contact with the nonmagnetic interlayer 2 to prevent diffusion of metal elements at the interface with the nonmagnetic interlayer 2 and to increase the rate of change in resistance $\Delta R/R$.

The NiFe alloy sublayer 9 contains 80 atomic percent of Ni and 20 atomic percent of Fe, for example. The thickness of the NiFe alloy sublayer 9 is approximately 45 Å and the thickness of the Co sublayer 10 is approximately 5 Å, for example. The sublayer 10 may be formed of a CoFe alloy or a CoFeNi alloy.

A back layer 15 formed of a metal material or nonmagnetic metal material such as Cu, Au, and Ag is formed on the free magnetic layer 1. The thickness of the back layer 15 is approximately 12 to 20 Å, for *example*.

A protective layer 7 is formed on the back layer 15. The protective layer 7 is preferably made of Ta and is preferably provided with an oxidized sublayer on its surface.

With the back layer 15, the mean free path of the +spin (spin-up) electrons contributing to the magnetoresistive effect can be extended, and a large rate of change in resistance can be achieved in the spin-valve magnetic element due to a so-called spin filter effect, thus meeting the demand for higher density recording.

In the embodiment shown in FIG. 19, hard bias layers 5 and electrode layers 8 are formed at the two sides of the composite which includes layers from the underlayer 6 to the protective layer 7. The bias magnetic field from the hard bias layers 5 magnetizes the free magnetic layer 1 in the track width direction (the X direction in the drawing).

The hard bias layers 5 are composed of a cobalt-platinum (Co—Pt) alloy, a cobalt-chromium-platinum (Co—Cr—Pt) alloy, or the like, for example. The electrode layers 8 are composed of α-Ta, Au, Cr, Cu, or W, for example. Note that when this embodiment is applied to the above-described tunneling magnetoresistive element, one of the electrode layers 8 is formed above the free magnetic layer 1 and the other is formed below the antiferromagnetic layer 4.

In preparation of the spin-valve thin film magnetic element shown in FIG. 19, the layers are sequentially deposited from the underlayer 6 up to the protective layer 7 to form a composite, and the composite is annealed so as to generate the exchange coupling magnetic field at the interface between the antiferromagnetic layer 4 and the pinned magnetic layer 3. During annealing, the magnetization of the pinned magnetic layer 3 can be pinned in the Y direction in the drawing by applying a magnetic field in the Y direction. Note that in this embodiment shown in FIG. 19, the magnetization of one of the sublayers 11 and 13 is pinned in the Y direction and that of the other sublayer is pinned in the direction opposite to the Y direction since the pinned magnetic layer 3 has the ferrimagnetic structure.

In the embodiment shown in FIG. 19, the seed layer 22 is disposed under the antiferromagnetic layer 4. In this embodiment, the seed layer 22 is either nonmagnetic or partially ferromagnetic and is composed of Cr and α wherein α is at least one element selected from Fe, Ni, and Co. In particular, the seed layer 22 is preferably formed of a NiCr alloy or a NiFeCr alloy.

In this embodiment, the composition of the seed layer 22 is preferably represented by the formula $(Ni_{100-x}Fe_x)$—Cr, wherein the content x in terms of atomic percent is preferably $0\% \leq x \leq 70$, more preferably, $0\% \leq x \leq 50$, and most preferably, $0\% \leq x \leq 30$. This composition is preferred since, at high Fe contents, the seed layer 22 is likely to have the body-centered cubic structure. This composition also improves crystal orientation and increases the crystal grain size, the change in conductivity, and the rate of change in resistance of the antiferromagnetic layer 4. Yet more preferably, x is 20.

In this embodiment, the Cr content at the interface between the antiferromagnetic layer 4 and the seed layer 22 is 40 atomic percent or more. Whereas the Cr content has been limited to not more than 40 atomic percent in the related art, the Cr content at the interface with the antiferromagnetic layer 4 is set to 40 atomic percent or more in the present invention so as to increase the surface energy at the interface, activate the interface, and improve the wettability.

Moreover, the seed layer 22 at the interface with the antiferromagnetic layer 4 has the fcc structure.

As is explained above with reference to FIG. 6, by improving the wettability, atoms constituting the antiferromagnetic layer 4 can sufficiently move on the surface of the seed layer 22 during sputter-deposition of the antiferromagnetic layer 4. Moreover, since the surface of the seed layer 22 has the fcc structure, the crystal orientation of the antiferromagnetic layer 4 in the direction parallel to the layer surface (parallel to the X-Y plane) becomes strongly {111} oriented, thereby forming the closest packed surface.

Moreover, because the antiferromagnetic layer 4 has the {111} orientation, each layer formed thereon will have the {111} orientation in the direction parallel to the layer surface (the X direction in the drawing), thereby making the closest packed surfaces.

In the layers formed above the seed layer 22 of the present invention, because the surface of the seed layer 22 exhibits excellent wettability and has the face-centered cubic structure, large crystal grains can be formed across the layers. Such crystal grains also grow large in a direction parallel to the layer surface, i.e., a direction parallel to the X-Y plane. In the present invention, the crystal grain size in the direction parallel to the layer surface is preferably 100 Å or more and more preferably, 150 Å or more to improve electrical conductivity.

In this embodiment, the Cr content at the interface between the seed layer 22 and the antiferromagnetic layer 4 is 40 atomic percent or more and this interface has the face-centered cubic structure. In order to form such an interface, the Cr content at the lower portion of the seed layer 22 (the portion remote from the antiferromagnetic layer 4) needs to be smaller than the Cr content at the surface of the seed layer 22 so as to securely form the fcc structure in the lower portion of the seed layer 22. When the fcc structure is firmly formed in the lower portion of the seed layer 22, no body-centered cubic structure is formed even if the Cr content at the surface of the seed layer 22 is increased to 40 atomic percent or more, thereby forming the surface having only the face-centered cubic structure.

The analysis of the composition of the seed layer 22 of the present invention reveals that the seed layer 22 has a composition gradient. That is, the seed layer 22 has a region in which the Cr content gradually increases toward the antiferromagnetic layer 4, and the Cr content at the surface (top face) of the seed layer 22 is higher than the Cr content at the face opposite to this surface, i.e., the bottom face of the seed layer 22.

Figure 24:
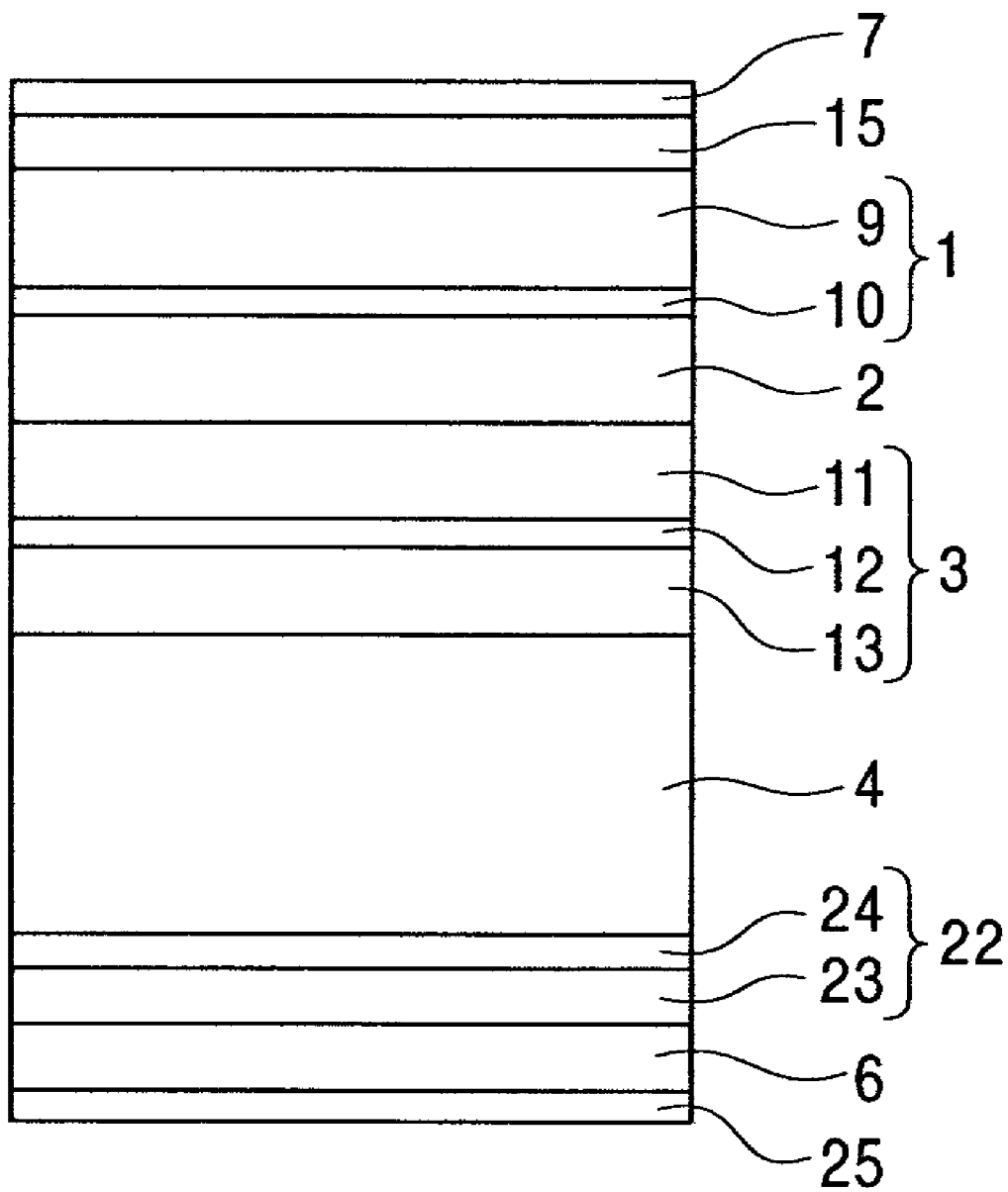
FIG. 24 is a diagram for explaining a step of a method for making a magnetic sensing element of the present invention.

In order to yield such a surface state and composition gradient in the seed layer 22, the manufacture method needs to be devised. A general method for making the seed layer 22 will be explained below with reference to FIG. 24. FIG. 24 is a schematic diagram showing the structure of the composite including layers from the underlayer 6 to the protective layer 7 viewed from the face opposing the recording medium.

Referring to FIG. 24, an underlayer 6 is formed on a substrate 25. The underlayer 6 is preferably composed of at least one element selected from Ta, Hf, Nb, Zr, Ti, Mo, and W. Formation of the underlayer 6 helps form the face-centered cubic structure in a seed layer 22 which is to be formed on the underlayer 6. Moreover, the underlayer 6 improves the {111} preferred orientation of the seed layer 22.

Next, a lower sublayer 23 of the seed layer 22 is deposited on the underlayer 6 by sputtering.

The lower sublayer 23 is preferably sputter-deposited using a NiFeCr alloy or a NiCr alloy having a Cr content in the range of 20 to 45 atomic percent. The thickness of the lower sublayer 23 is in the range of 20 to 60 Å.

At a Cr content of the lower sublayer 23 of 20 to 45 atomic percent, the single phase of the fcc structure can be formed in the lower sublayer 23. The thickness of the lower sublayer 23 should be sufficiently large to adequately form the fcc structure and achieve the {111} orientation and is thus set to a thickness of 20 Å or more. At an excessively large thickness, however, the amount of sensing current flowing to the lower sublayer 23 increases; hence the shunt loss of the sensing current is increased. In this manufacture method, the Cr content of the lower sublayer 23 may be in the range of 40 to 45 atomic percent. However, at such a large Cr content, the probability of the bcc structure admixing in the fcc structure is strong. Thus, at high Cr contents, the thickness of the lower sublayer 23 should be sufficiently small and deposition conditions should be controlled as below to prevent the formation of the bcc structure. At a small deposition thickness, the energy is not so high even at a Cr content of 40 atomic percent or more, whereas such a high Cr content readily induces the bcc structure in the bulk; hence, the lower sublayer 23 can be put into a metastable state and can have the single phase of the fcc structure. Accordingly, in this embodiment, the thickness of the lower sublayer 23 is limited to not more than 60 Å so as to form the single phase of the fcc structure in the lower sublayer 23.

Moreover, the underlayer 6 composed of Ta and disposed under the lower sublayer 23 helps make the single phase of the fcc structure in the lower sublayer 23.

In this embodiment, the Cr content of the lower sublayer 23 is preferably in the range of 20 to 40 atomic percent to reliably make the lower sublayer 23 having the fcc structure.

The thickness of the lower sublayer 23 is preferably in the range of 20 to 40 Å to reliably make the lower sublayer 23 having the fcc structure and to reduce the shunt loss of the sensing current.

In this embodiment, the lower sublayer 23 may be formed of a NiFe alloy. In such a case also, the thickness of the lower sublayer 23 is preferably in the range of 20 to 60 Å, and more preferably, 20 to 40 Å. Since no chromium is contained in the NiFe alloy, the lower sublayer 23 having the single phase of the fcc structure can be reliably manufactured.

The temperature of the substrate 25 during the deposition of the lower sublayer 23 by sputtering is preferably in the range of 20 to 100° C., the distance between the target and the substrate 25 is preferably 40 to 80 mm, and the pressure of the Ar gas introduced during deposition by sputtering is preferably in the range of 0.5 to 3 mTorr (0.067 to 0.4 Pa). In this manner, the lower sublayer 23 having the fcc structure can be adequately made.

On the lower sublayer 23, an upper sublayer 24 composed of a NiFeCr alloy or a NiCr alloy having a Cr content in the range of 40 to 70 atomic percent is deposited by sputtering. The Cr content of the upper sublayer 24 is higher than that of the lower sublayer 23. The thickness of the upper sublayer 24 is in the range of 3 to 20 Å.

As described above, the thickness of the upper sublayer 24, i.e., 3 to 20 Å, is substantially smaller than that of the lower sublayer 23. At such a thickness, the upper sublayer 24 can be formed to have the same crystal structure as that of the lower sublayer 23 by the influence of the crystal structure of the lower sublayer 23. Although a Cr content of 40 atomic percent of more forms a mixed structure of the fcc and bcc structures as a bulk at an equilibrium state, the upper sublayer 24 of this embodiment instead readily enters a metastable state because the upper sublayer 24 is sputter-deposited to such a small thickness.

Because of the above behavior, the upper sublayer 24 has the single phase of the fcc structure without the bcc structure even when the Cr content thereof is high, i.e., 40 atomic percent or more.

The Cr content of the upper sublayer 24 is preferably in the range of 45 to 60 atomic percent to suitably improve the wettability of the surface of the upper sublayer 24.

In this invention, the composition of each of the lower sublayer 23 and the upper sublayer 24 is preferably represented by $(Ni_{100-x}Fe_x)$—Cr, wherein content x in terms of atomic percent is preferably 0%x%70, more preferably, 0%x%50, and most preferably, 0%x%30. At an excessively large Fe content, the lower sublayer 23 and the upper sublayer 24 tend to have the body-centered cubic structure. Moreover, according to this composition, the crystal orientation of the antiferromagnetic layer 4 can be improved, and the crystal grain size, the change in conductivity, and the rate of change in resistance can be increased. Most preferably, the content x in terms of atomic percent is 20.

In the present invention, the thickness of the upper sublayer 24 is preferably in the range of 5 to 10 Å to reliably make the upper sublayer 24 having the single phase of the fcc structure.

The temperature of the substrate 25 during the deposition of the lower sublayer 23 by sputtering is preferably in the range of 20 to 100 ° C., the distance between the target and the substrate 25 is preferably 40 to 80 mm, and the pressure of the Ar gas introduced during deposition by sputtering is preferably in the range of 0.5 to 3 mTorr (0.067 to 0.4 Pa). In this manner, the upper sublayer 24 having the fcc structure can be adequately made.

Next, an antiferromagnetic layer 4 is deposited on the upper sublayer 24 by sputtering.

In this invention, the antiferromagnetic layer 4 is preferably deposited by sputtering using an antiferromagnetic material containing Mn and X, wherein X is at least one element selected from Pt, Pd, Ir, Rh, Ru, and Os.

Alternatively, the antiferromagnetic layer 4 may be deposited by sputtering using an X—Mn—X' alloy, wherein X' is at least one element selected from Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb, and rare-earth elements.

In this embodiment, the content X or X+X' is preferably in the range of 45 to 60 atomic percent.

On the antiferromagnetic layer 4, a pinned magnetic layer 3, a nonmagnetic interlayer 2, a free magnetic layer 1, a back layer 15, and a protective layer 7 are deposited.

As described above, the surface of the upper sublayer 24 exhibits excellent wettability as a result of a high Cr content of 40 atomic percent or more and has the fcc structure. Thus, the antiferromagnetic layer 4 can have the {111} orientation in the direction parallel to the layer surface. Moreover, because the antiferromagnetic layer 4 has the {111} orientation, each layer formed on the antiferromagnetic layer 4 can have an adequate {111} orientation in the direction parallel to the layer surface.

Next, annealing is performed. The antiferromagnetic layer 4 is preferably formed of the above-described X—Mn or X—Mn—X' alloy. In using these antiferromagnetic materials, the exchange coupling magnetic field is not generated at the surface with the pinned magnetic layer 3 unless they are annealed. In this invention, annealing is performed to generate the exchange coupling magnetic field at the interface between the antiferromagnetic layer 4 and the pinned magnetic layer 3. During annealing, a magnetic field in the Y direction in the drawing is applied to pin the magnetization of the pinned magnetic layer 3 in the Y direction.

By annealing, large crystal grains grow across the layers formed on the seed layer 22. Particularly, in this embodiment, the size of the crystal grain in the direction parallel to the surface can be increase to 100 Å or more.

Moreover, the interface between the lower sublayer 23 and the upper sublayer 24 would no longer be recognizable after annealing because of diffusion between the lower sublayer 23 and the upper sublayer 24. Accordingly, the seed layer 22 appears as if it is formed of a single layer.

The analysis of the composition of the seed layer 22 after annealing reveals that, as a result of diffusion between the lower sublayer 23 and the upper sublayer 24, the composition gradient can be observed at the portion of the seed layer 22 where the interface used to locate. As a result, the seed layer 22 has a region in which the Cr content increases toward the antiferromagnetic layer 4. Moreover, because the top face of the upper sublayer 24 shown in FIG. 24 corresponds to the top face of the seed layer 22 shown in FIG. 19 and the bottom face of the lower sublayer 23 shown in FIG. 24 corresponds to the bottom face of the seed layer 22 shown in FIG. 19, the Cr content of the top face of the seed layer 22 is larger than the Cr content of the bottom face of the seed layer 22.

Figure 25:
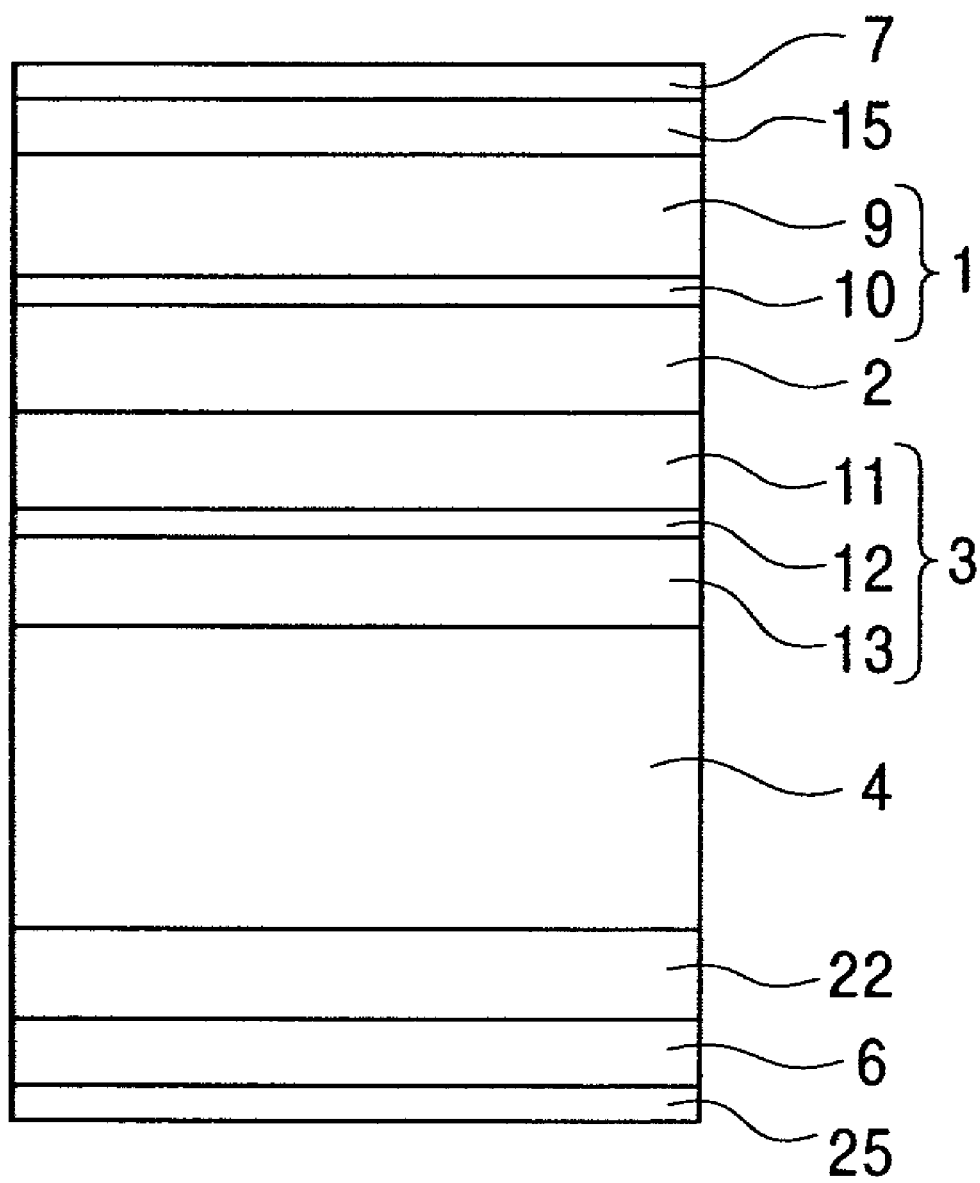
FIG. 25 is a diagram for explaining a step of another method for making a magnetic sensing element of the present invention.

The seed layer 22 may be formed by another method described below. This method is mainly described with reference to FIG. 25. FIG. 25 is a schematic diagram of a composite including layers from an underlayer 6 to a protective layer 7 viewed from the side opposing the recording medium.

Referring to FIG. 25, an underlayer 6 is first deposited by sputtering on a substrate 25, and a seed layer 22 is deposited by sputtering on the underlayer 6. The seed layer 22 is deposited by sputtering using a NiFeCr alloy or a NiCr alloy.

The composition of the seed layer 22 is preferably represented by $(Ni_{100-x}Fe_x)$—Cr, wherein the content x in terms of atomic percent is preferably 0%≦x≦70, more preferably 0%≦x≦50, and most preferably 0%≦x≦30.

In this method, two targets are used during the deposition by sputtering. In case of making the seed layer 22 with a NiFeCr alloy, a NiFe alloy target and a Cr target are prepared, for example.

At an early stage of deposition of the seed layer 22 on the underlayer 6, power supply to these two targets are controlled so that the Cr content at the bottom face of the seed layer 22 is in the range of 20 to 45 atomic percent. The power supply to the Cr target is gradually increased in order to deposit chromium in an increased amount as the thickness of the seed layer 22 increases. After the thickness of the seed layer 22 reached a thickness in the range of 23 to 80 Å, the power supply to these two targets is adjusted so that the Cr content at the surface of the seed layer 22 is in the range of 40 to 70 atomic percent.

The Cr content of the seed layer 22 deposited as above is analyzed. The analysis shows that the Cr content gradually increases from the bottom face toward the top face of the seed layer 22.

As described above, because the Cr content in the seed layer 22 at the early stage of deposition is small, the deposited seed layer 22 adequately has the fcc structure. This structure helps maintain the fcc structure even when the Cr content is increased as deposition proceeds. Thus, the surface of the seed layer 22 adequately maintains the fcc structure while having a high Cr content in the range of 40 to 70 atomic percent. With the surface having such a high Cr content, the seed layer 22 can exhibit improved wettability compared to the related art.

Next, an antiferromagnetic layer 4, a pinned magnetic layer 3, a nonmagnetic interlayer 2, a free magnetic layer 1, a back layer 15, and a protective layer 7 are deposited to form a composite. The composite is annealed to induce the exchange coupling magnetic field at the interface between the antiferromagnetic layer 4 and the pinned magnetic layer 3.

During the step shown in FIG. 25, the thickness of the seed layer 22 is preferably in the range of 25 to 50 Å to form a seed layer 22 having a single-phase fcc structure and to reduce the shunt loss of the sensing current flowing to the seed layer 22.

While the seed layer 22 is deposited by sputtering to a thickness in the range of 23 to 80 Å as above, power supplied to the targets is preferably adjusted such that the Cr content in the region from the bottom face up to 75% of the total thickness of the seed layer 22 is 45 atomic percent or less, and more preferably, 40 atomic percent or less.

In other words, the Cr content is low in the predominant portion of the seed layer 22 but is high, i.e., in the range of 40 to 75 atomic percent, at the region near the surface. In this manner, the entire seed layer 22 can adequately maintain the fcc structure.

The thickness of the seed layer 22 here is preferably in the range of 25 to 50 Å.

The temperature of the substrate during the deposition of the seed layer by puttering is preferably adjusted to a temperature in the range of 20 to 100° C., the distance between the substrate and the target is preferably in the range of 40 to 80 mm, and the pressure of the Ar gas introduced during deposition by sputtering is preferably in the range of 0.5 to 3 mTorr (0.067 to 0.4 Pa).

The Cr content of the seed layer 22 shown in FIG. 19 at the interface with the antiferromagnetic layer 4 is preferably in the range of 40 to 70 atomic percent. This range is the same as that of the upper sublayer 24 shown in FIG. 24. At such a Cr content, the wettability of the surface of the seed layer 22 can be further improved.

In the present invention, the Cr content at the surface of the seed layer 22 is more preferably in the range of 45 to 60 atomic percent. This range of Cr content corresponds to the preferable range of the Cr content in the upper sublayer 24 of FIG. 24. At such a Cr content, the wettability of the surface of the seed layer 22 can be further improved.

In this embodiment, the Cr content at the face opposite to the interface with the antiferromagnetic layer 4 (the bottom face of the seed layer 22) is preferably in the range of 20 to 45 atomic percent. This range of the Cr content corresponds to the Cr content range of the lower sublayer 23 shown in FIG. 24. At such a Cr content, the bottom face of the seed layer 22 can properly have the fcc structure.

The Cr content at the bottom face of the seed layer 22 is more preferably in the range of 20 to 40 atomic percent. This Cr content range corresponds to the preferable Cr content range of the lower sublayer 23 shown in FIG. 24. At such a Cr content, the bottom face of the seed layer 22 can reliably have the fcc structure.

The thickness of the seed layer 22 is preferably in the range of 23 to 80 Å. This thickness corresponds to the total thickness of the lower sublayer 23 and the upper sublayer 24 in FIG. 24. As described above, the thickness of the lower sublayer 23 in FIG. 24 is preferably in the range of 20 to 60 Å; such a thickness of the lower sublayer 23 corresponds to 75% of the total thickness of the seed layer 22. In the composition analysis of the seed layer 22 in FIG. 19, the Cr content in the region from the bottom face of the seed layer 22 up to 75% of the total thickness of the seed layer 22 is preferably in the range of 20 to 45 atomic percent, and more preferably, 40 atomic percent or less. Only the surface region has a high Cr content of 40 to 70 atomic percent, and more preferably, 45 atomic percent or less.

At such a thickness, the seed layer 22 can adequately have the fcc structure and the shunt loss of the sensing current to the seed layer 22 can be reduced.

In this invention, the thickness of the seed layer 22 is preferably in the range of 25 to 50 Å. This thickness corresponds to the total of the preferable thicknesses of the lower sublayer 23 and the upper sublayer 24. At such a thickness, the seed layer 22 can reliably have the face-centered cubic structure and the shunt loss of the sensing current to the seed layer 22 can be further reduced.

In this invention, the Cr content at the surface of the seed layer 22 can be made increased while adequately maintaining the fcc structure in the seed layer 22. As a result, each layer deposited on the seed layer 22 can have a sufficient {111} orientation in the direction parallel to the layer surface, and the average crystal grain size of the crystal grains in the direction parallel to the layer surface can be increased.

As a result, an increase in the resistance of the spin-valve thin film element and diffusion between layers can be prevented. Moreover, the resistance to electromigration and current-carrying reliability can be improved.

Furthermore, according to the present invention, the rate of change in resistance $\Delta R/R$ and change in conductivity $\Delta G$ can be increased, and thermal noise can be reduced.

In this invention, the soft magnetic property of the free magnetic layer 1 constituting the spin-valve thin film element can be improved. In particular, the coercive force Hc of the free magnetic layer 1 can be reduced, and the crystal magnetic anisotropy energy K at the surface in proportion to the coercive force Hc can be minimized. Thus, the magnetization rotation of the free magnetic layer 1 in response to the external magnetic field can be improved. The single spin-valve thin film element of the present invention thus exhibits improved sensitivity.

According to the present invention, a single spin-valve thin film element which can sufficiently withstand high-density sensing current which is required to read higher density recordings in the near future can be manufactured.

Sixth Embodiment

Figure 20:
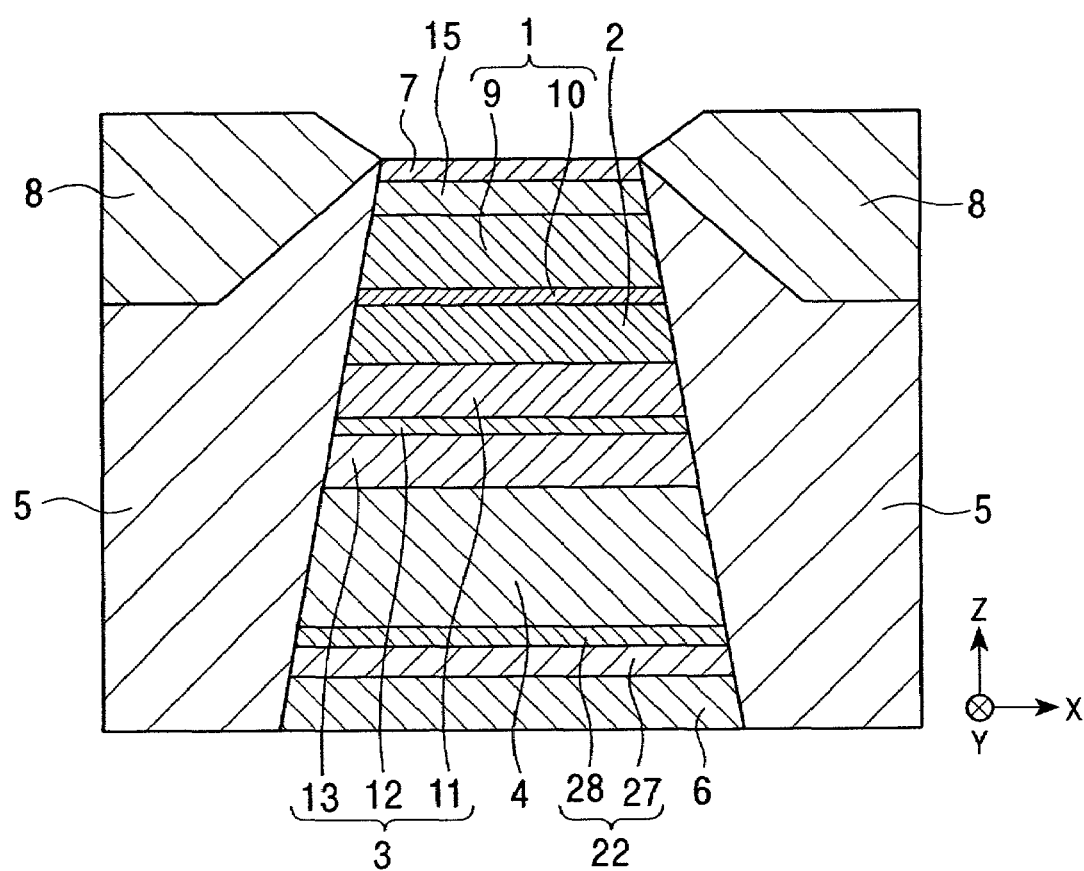
FIG. 20 is a cross-sectional view showing the structure of a magnetic sensing element (single spin-valve magnetoresistive element) according to a sixth embodiment of the present invention, viewed from the face opposing a recording medium.

FIG. 20 shows the structure of a spin-valve thin film element according to a sixth embodiment of the present invention. FIG. 20 is a partial cross-sectional view of the spin-valve thin film element taken in the direction parallel to the face opposing a recording medium.

The spin-valve thin film element of the sixth embodiment shown in FIG. 20 differs from that of FIG. 19 in the structure of the seed layer 22. In FIG. 20, the seed layer 22 has a double-layer structure comprising a lower sublayer 27 and an upper sublayer 28. The upper sublayer 28 is nonmagnetic, and the lower sublayer 27 is either nonmagnetic or partially ferromagnetic. Each of the lower and upper sublayers 27 and 28 contains Cr and α, wherein α is at least one element selected from Fe, Ni, and Co. The lower sublayer 27 and the upper sublayer 28 are preferably made from a NiCr alloy or a NiFe alloy.

The composition of each of the lower sublayer 27 and the upper sublayer 28 is preferably expressed by $(Ni_{100-x}Fe_x)$—Cr, wherein the content x in terms of atomic percent is preferably $0 \le x \le 70$, more preferably, $0 \le x \le 50$, and most preferably, $0 \le x \le 30$. This composition is preferred since, at high Fe contents, the lower sublayer 27 and the upper sublayer 28 are likely have the body-centered cubic structure. This composition also improves crystal orientation and increases the crystal grain size, the change in conductivity, and the rate of change in resistance of the antiferromagnetic layer 4. Yet more preferably, x is 20.

In this embodiment, the Cr content of the upper sublayer 28 is 40 atomic percent or more which is larger than the Cr content of the lower sublayer 27. The surface of the upper sublayer 28, i.e., the surface of the seed layer 22, has the face-centered cubic structure.

The thickness of the upper sublayer 28 is smaller than the thickness of the lower sublayer 27.

In this invention, the lower sublayer 27 having a smaller Cr content and a larger thickness properly maintains the fcc structure. In contrast, the upper sublayer 28 formed on the lower sublayer 27 has a high Cr content of 40 atomic percent and a small thickness; hence, the crystal structure of the upper sublayer 28 affected by the crystal structure of the lower sublayer 27 becomes cubic face-centered, thereby improving the wettability of the surface of the upper sublayer 28.

One of the methods for forming the seed layer 22 shown in FIG. 20 is the same as that described with reference to FIG. 24. According to the description relating to FIG. 24, the interface between the lower sublayer 23 and the upper sublayer 24 would no longer be recognizable after annealing because of diffusion at the interface therebetween. However, no significant diffusion occurs at a low annealing temperature or for a short annealing time, and, thus, the interface between the lower sublayer 27 and the upper sublayer 28 in FIG. 20 can be recognized. When an antiferromagnetic material, such as FeMn and IrMn, which generates an exchange coupling magnetic field at the interface with the pinned magnetic layer 3 without annealing is used to form the antiferromagnetic layer 4, the interface between the lower sublayer 27 and the upper sublayer 28 is distinctively recognizable since no annealing causing diffusion is required.

In this invention, the Cr content of the upper sublayer 28 is preferably in the range of 40 to 70 atomic percent. At such a Cr content, the upper sublayer 28 shown in FIG. 20 can properly have the fcc structure, and the wettability of the surface of the upper sublayer 28 can be improved.

In this invention, the Cr content of the upper sublayer 28 is more preferably in the range of 45 to 60 atomic percent. At such a Cr content, the upper sublayer 28 having the single phase of the fcc structure can be reliably formed, and the wettability of the surface of the upper sublayer 28 can be further improved.

In this invention, the Cr content of the lower sublayer 27 is preferably in the range of 20 to 45 atomic percent. At such a Cr content, the lower sublayer 27 having the single phase of the fcc structure can be reliably formed. However, at a Cr content exceeding 40 atomic percent, the thickness of the lower sublayer 27 needs to be adjusted as below to prevent formation of the bcc structure.

The Cr content of the lower sublayer 27 is more preferably in the range of 20 to 40 atomic percent to reliably form the lower sublayer 27 having the fcc structure.

The thickness of the upper sublayer 28 is preferably in the range of 3 to 20 Å to adequately form the upper sublayer 28 having the fcc structure.

The thickness of the upper sublayer 28 is more preferably in the range of 5 to 10 Å to reliably form the upper sublayer 28 having the fcc structure.

In this embodiment, the thickness of the lower sublayer 27 is preferably in the range of 20 to 60 Å to form the fcc structure in the lower sublayer 27 and to reduce the shunt loss of the sensing current flowing to the lower sublayer 27.

When the Cr content of the lower sublayer 27 is in the range of 40 to 45 atomic percent, the bcc structure is readily formed in the lower sublayer 27 having a large thickness. Thus, the thickness of the lower sublayer 27 needs to be reduced to maintain the single-phase fcc structure. In this embodiment, the single-phase fcc structure can be maintained in the lower sublayer 27 at a thickness of the lower sublayer 27 of 60 Å or less.

In this embodiment, the thickness of the lower sublayer 27 is more preferably in the range of 20 to 40 Å to reliably form the single-phase fcc structure in the lower sublayer 27 and to reduce the shunt loss of the sensing current flowing to the lower sublayer 27.

In this invention, at least one intermediate sublayer may be formed between the lower sublayer 27 and the upper sublayer 28. The intermediate sublayer is preferably either nonmagnetic or partially ferromagnetic and preferably contains Cr and α, wherein α is at least one element selected from Fe, Ni, and Co. In particular, a NiFeCr alloy, a NiCr alloy, or a NiFe alloy may be used.

The intermediate sublayer preferably has the face-centered cubic structure. The Cr content of the intermediate sublayer, if any, is preferably smaller than the Cr content of the upper sublayer 28. When the Cr content of the intermediate sublayer is approximately the same as that of the upper sublayer 28, the total thickness of the layers having high Cr contents, namely, the upper sublayer 28 and the intermediate sublayer, increases. At such an increased thickness, the effect of the crystal structure of the lower sublayer 27 on the crystal structure of the upper sublayer 28 diminishes, and the bcc structure would be formed along with the fcc structure. The Cr content of the intermediate sublayer is, for example, adjusted to be smaller than the Cr content of the upper sublayer 28 but larger than the Cr content of the lower sublayer 27.

In this embodiment, the lower sublayer 27 may be formed with a NiFe alloy. Since chromium (Cr) is not contained in the lower sublayer 27, the single-phase fcc structure can be reliably formed in the lower sublayer 27.

In the spin-valve thin film element shown in FIG. 20, the Cr content at the surface of the seed layer 22 can be increased, and the fcc structure can be adequately maintained in the seed layer 22. Thus, each layer deposited on the seed layer 22 can be adequately {111} oriented in the direction parallel to the layer surface, and the average crystal grain size of the crystal grains in the direction parallel to the layer surface can be increased.

As a result, an increase in the resistance of the spin-valve thin film element and diffusion between layers can be prevented. Moreover, the resistance to electromigration and the current-carrying reliability can be improved.

Furthermore, according to the present invention, the rate of change in resistance ΔR/R and change in conductivity ΔG can be increased, and thermal noise can be reduced.

In this invention, the soft magnetic property of the free magnetic layer 1 constituting the spin-valve thin film element can be improved. In particular, the coercive force can be reduced, and the planar crystal magnetic anisotropy energy K at the surface in proportion to the coercive force Hc can be reduced, and the magnetization rotation of the free magnetic layer 1 in response to the external magnetic field can be improved. The single spin-valve thin film element of the present invention thus exhibits improved sensitivity.

According to the present invention, a single spin-valve thin film element which can sufficiently withstand high-density sensing current which is required to read higher density recordings in the near future can be manufactured.

Seventh Embodiment

Figure 21:
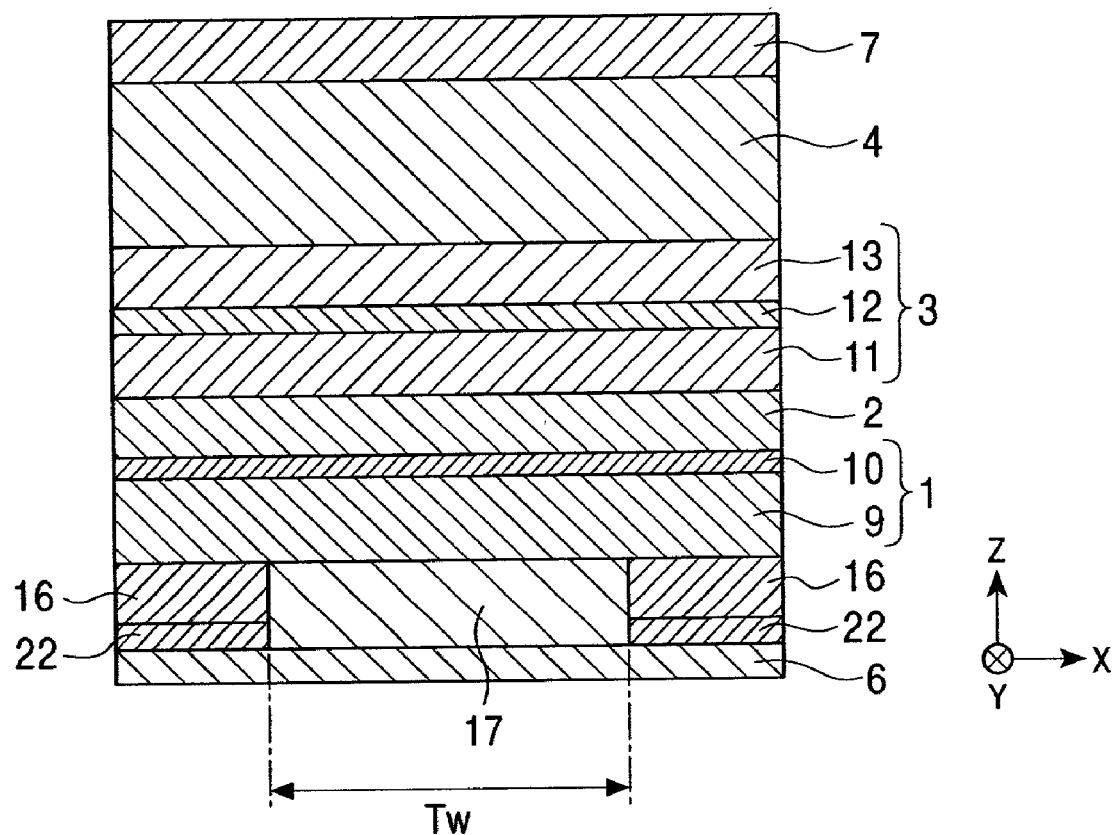
FIG. 21 is a cross-sectional view showing the structure of a magnetic sensing element (single spin-valve magnetoresistive element) according to a seventh embodiment of the present invention, viewed from the face opposing a recording medium.

FIG. 21 is a partial cross-sectional view showing the structure of a spin-valve thin film element according to a seventh embodiment of the present invention.

In the spin-valve thin film element of the seventh embodiment shown in FIG. 21, a pair of seed layers 22 separated from each other in the track width direction (the X direction in the drawing) by a gap corresponding to the track width Tw therebetween is formed on an underlayer 6. On the seed layers 22, exchange bias layers 16 are formed.

The gap between the seed layers 22 and the exchange bias layers 16 are filled with an insulating layer 17 composed of an insulating material such as $SiO_2$ or $Al_2O_3$.

A free magnetic layer 1 is formed on the exchange bias layers 16 and the insulating layer 17.

The exchange bias layers 16 are preferably formed with an X—Mn alloy or an X—Mn—X' alloy. The X content or the X+X' content is preferably in the range of 45 to 60 atomic percent, and more preferably, 49 to 56.5 atomic percent.

Two side portions of the free magnetic layer 1 are magnetized in the X direction in the drawing by the exchange coupling magnetic field with the exchange bias layers 16 and are put into a single-magnetic-domain state. The central portion of the free magnetic layer 1 corresponding to the track width Tw is adequately magnetized in the X direction in the drawing to an extent responsive to an external magnetic field.

As shown in FIG. 21, a nonmagnetic interlayer 2 is formed on the free magnetic layer 1, and a pinned magnetic layer 3 is formed on the nonmagnetic interlayer 2. An antiferromagnetic layer 4 and a protective layer 7 are formed on the pinned magnetic layer 3.

In this embodiment also, the seed layers 22 are either nonmagnetic or partially ferromagnetic and contain α and Cr wherein α is at least one element selected from Fe, Ni, and Co.

Each of the seed layers 22 has a region in which the Cr content gradually increases toward the exchange bias layer 16.

Moreover, the Cr content of the seed layer 22 at the interface with the exchange bias layer 16 is 40 atomic percent or more, which is larger than the Cr content at the opposite face of the seed layer 22. The seed layer 22 has the face-centered cubic structure at the interface with the exchange bias layer 16.

Alternatively, as in FIG. 20, the seed layer 22 may be constituted of an upper sublayer and a lower sublayer containing Cr and α, wherein α is at least one element selected from Fe, Ni, and Co. The upper sublayer has a Cr content of 40 atomic percent or more at the interface with the exchange bias layer 16, and this interface has the fcc structure. The Cr content of the upper sublayer is larger than the Cr content of the lower sublayer. The thickness of the upper sublayer is smaller than that of the lower sublayer.

In the spin-valve thin film element shown in FIG. 21, the seed layer 22 has a larger Cr content compared to the conventional art while adequately maintaining the face-centered cubic structure. Thus, each of the layers deposited on the seed layer 22 can have the {111} orientation in the direction parallel to layer surface, and the average crystal grain size in the direction parallel to the layer surface can be increased.

In this manner, an increase in the resistance of the spin-valve thin film and diffusion between the layers can be prevented. As a result, the resistance to electromigration can be enhanced, and current-carrying reliability can be improved.

In the present invention, the rate of change in resistance $\Delta R/R$ and the change in the conductivity $\Delta G$ can be increased. Thermal noise can be reduced.

In the present invention, the soft magnetic property of the free magnetic layer 1 constituting the spin-valve thin film element can be improved. In particular, the coercive force Hc can be reduced, and the crystal magnetic anisotropy energy K in proportion to the coercive force Hc can be reduced. Thus, the magnetization rotation at the free magnetic layer 1 in response to the external magnetic field can be improved. The spin-valve thin film element of the present invention thus exhibits improved sensitivity.

The spin-valve thin film element of the present invention having the above advantages can sufficiently withstand the high-density sensing current required for the higher-density recording in the near future.

The seed layers 22 shown in FIG. 21 can be made by the same method as those described above with reference to FIGS. 24 and 25.

Eighth Embodiment

Figure 22:
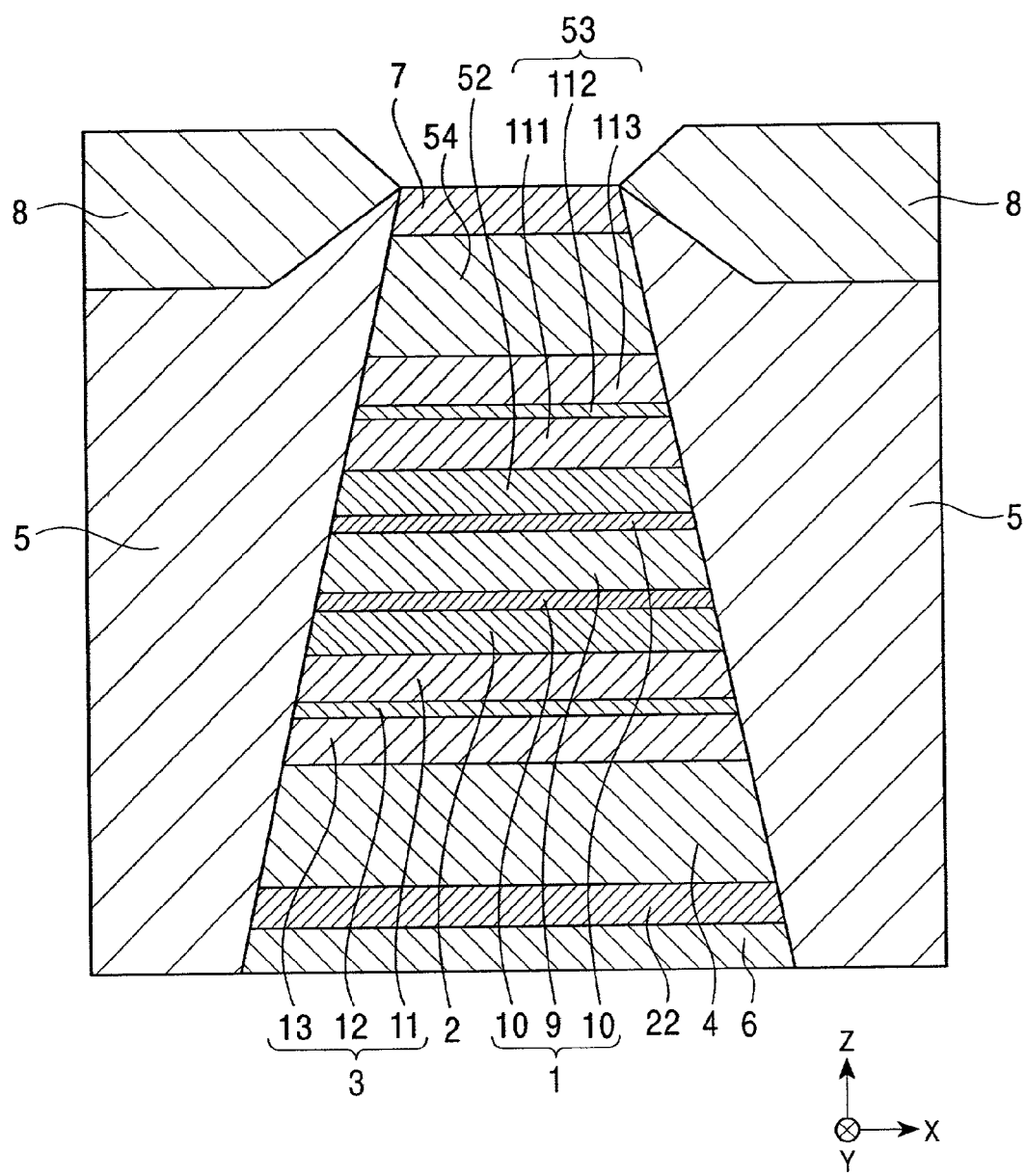
FIG. 22 is a cross-sectional view showing the structure of a magnetic sensing element (dual spin-valve magnetoresistive element) according to an eighth embodiment of the present invention, viewed from the face opposing a recording medium.

FIG. 22 is a cross-sectional view partially showing the structure of a dual spin-valve thin film element according to an eighth embodiment of the present invention.

As shown in FIG. 22, an underlayer 6, a seed layer 22, a lower antiferromagnetic layer 4, a lower pinned magnetic layer 3, a lower nonmagnetic interlayer 2, and a free magnetic layer 1 are sequentially deposited in that order. The free magnetic layer 1 is constituted of three sublayers, namely, two Co sublayers 10 and a NiFe alloy sublayer 9. On the free magnetic layer 1, an upper nonmagnetic interlayer 52, an upper pinned magnetic layer 53, and an upper antiferromagnetic layer 54, and a protective layer 7 are sequentially deposited. The upper pinned magnetic layer 53 has similar layers as that of the upper magnetic layer shown in FIG. 3.

At the two sides of the composite including layers from the underlayer 6 to the protective layer 7, hard bias layers 5 and electrode layers 8 are formed. The hard bias layers 5 and the electrode layers 8 are composed of the same materials as those described in the first embodiment shown in FIG. 1.

In this embodiment, the seed layer 22 is disposed under the lower antiferromagnetic layer 4. The content X or X+X' constituting the antiferromagnetic layer 4 is preferably in the range of 45 to 60 atomic percent, and more preferably, 49 to 56.5 atomic percent.

In this embodiment also, the seed layer 22 is either nonmagnetic or partially ferromagnetic and contains Cr and α wherein α is at least one element selected from Fe, Ni, and Co.

The seed layer 22 has a region in which the Cr content gradually increases toward the antiferromagnetic layer 4.

Moreover, the Cr content of the seed layer 22 at the interface with the antiferromagnetic layer 4 is 40 atomic percent or more, which is larger than the Cr content at the opposite side of the seed layer 22. The seed layer 22 has the face-centered cubic structure at the interface with the antiferromagnetic layer 4.

Alternatively, as in FIG. 20, the seed layer 22 may be constituted of an upper sublayer and a lower sublayer containing Cr and α, wherein α is at least one element selected from Fe, Ni, and Co. The Cr content of the upper sublayer at the interface with the antiferromagnetic layer 4 is 40 atomic percent or more, and the upper sublayer has the fcc structure at this interface. The Cr content of the upper sublayer is larger than the Cr content of the lower sublayer. The thickness of the upper sublayer is smaller than that of the lower sublayer.

In the spin-valve thin film element shown in FIG. 22, the seed layer 22 has a larger Cr content compared to the conventional art while adequately maintaining the face-centered cubic structure. Thus, each of the layers deposited on the seed layer 22 can have the {111} orientation in the direction parallel to layer surface, and the average crystal grain size of the crystal grains in the direction parallel to the layer surface can be increased.

In this manner, an increase in the resistance of the spin-valve thin film and diffusion between the layers can be prevented. As a result, the resistance to electromigration can be enhanced, and current-carrying reliability can be improved.

In the present invention, the rate of change in resistance $\Delta R/R$ and the change in the conductivity $\Delta G$ can be increased. Thermal noise can be reduced.

In the present invention, the soft magnetic property of the free magnetic layer 1 constituting the spin-valve thin film element can be improved. In particular, the coercive force Hc of the free magnetic layer 1 can be reduced, and the crystal magnetic anisotropy energy K at the surface in proportion to the coercive force Hc can be minimized. Thus, the magnetization rotation of the free magnetic layer 1 in response to the external magnetic field can be improved. The single spin-valve thin film element of the present invention thus exhibits improved sensitivity.

The spin-valve thin film element of the present invention having the above advantages can sufficiently withstand the high-density sensing current required for the higher-density recording in the near future.

Ninth Embodiment

Figure 23:
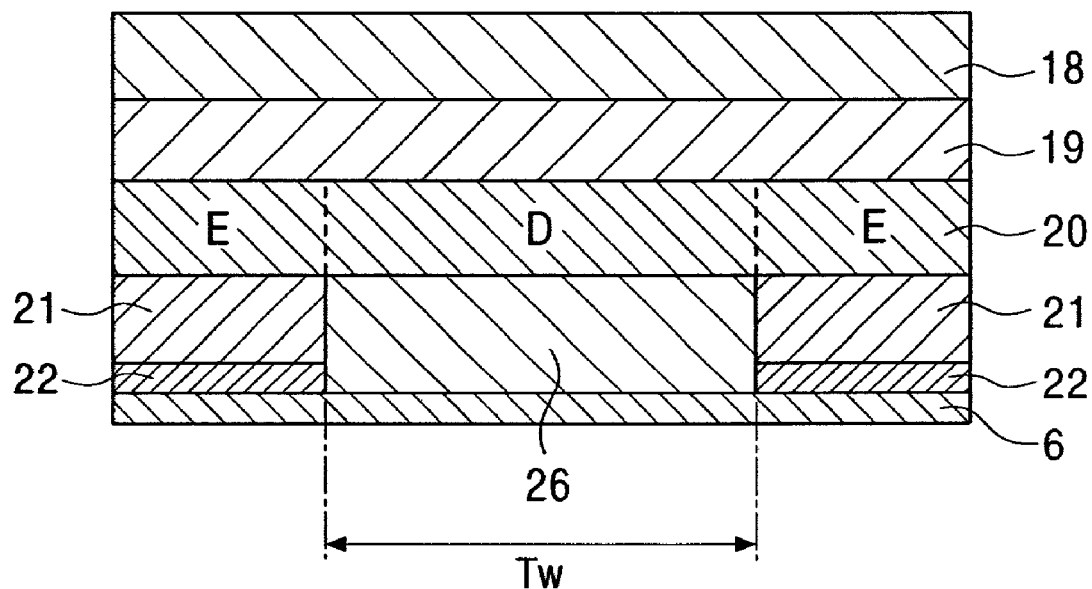
FIG. 23 is a cross-sectional view showing the structure of a magnetic sensing element (AMR magnetoresistive element) according to a ninth embodiment of the present invention, viewed from the face opposing a recording medium.

FIG. 23 is a partial cross-sectional view of an anisotropic magnetoresistive element (AMR element) according to a ninth embodiment. The cross-section is taken in the direction parallel to the face opposing a recording medium.

Referring to FIG. 23, a pair of seed layers 22 separated from each other in the track width direction (the X direction) by a gap corresponding to the track width therebetween is formed on an underlayer 6. Exchange bias layers 21 are formed on the seed layers 22. The gap between the seed layers 22 and the exchange bias layers 21 is filled with an insulating layer 26 composed of an insulating material such as $SiO_2$ or $Al_2O_3$.

On the exchange bias layers 21 and the insulating layer 26, a magnetoresistive layer (MR layer) 20, a nonmagnetic layer (shunt layer) 19, and a soft magnetic layer (SAL) 18 are deposited.

In the AMR thin film element shown in FIG. 23, the regions E of the magnetoresistive layer 20 in FIG. 23 are put into a single-magnetic-domain state in the X direction by the exchange coupling magnetic field generated at the interfaces between the exchange bias layers 21 and the magnetoresistive layer 20. These regions E magnetize the region D of the magnetoresistive layer 20 shown in FIG. 23 in the X direction in the drawing. The magnetic field which is induced when a sensing current flows in the magnetoresistive layer 20 is applied to the soft magnetic layer 18 in the Y direction. A transverse bias magnetic field is applied to the region D of the magnetoresistive layer 20 in the Y direction by the magnetostatic coupling energy induced by the soft magnetic layer 18. Application of the transverse bias magnetic field to the region D of the magnetoresistive layer 20 which is put into the single-magnetic-domain state in the X direction results in a linear change in resistance in response to the change in magnetic field of the region D of the magnetoresistive layer 20 (the magnetoresistive effect: the H-R effect).

Since the recording medium moves in the Z direction, the resistance in the region D of the magnetoresistive layer 20 changes as the leakage magnetic field is applied in the Y direction in the drawing. Such changes are detected as the changes in voltage.

In this embodiment also, the seed layer 22 is either nonmagnetic or partially ferromagnetic and is composed of Cr and a wherein a is at least one selected from Fe, Ni, and Co.

Each of the seed layers 22 has a region in which the Cr content gradually increases towards the exchange bias layer 21.

The Cr content of the seed layer 22 at the interface with the exchange bias layer 21 is 40 atomic percent or more, which is larger than the Cr content at the opposite face of the seed layer 22. The seed layer 22 has the face-centered cubic structure at the interface with the exchange bias layer 21.

Alternatively, as in FIG. 20, the seed layer 22 may be constituted of an upper sublayer and a lower sublayer both composed of Cr and α, wherein α is at least one element selected from Fe, Ni, and Co. The Cr content of the upper sublayer at the interface with the exchange bias layer 21 is 40 atomic percent or more, and the upper sublayer has the face-centered cubic structure at the interface with the exchange bias layer 21. The Cr content of the upper sublayer is larger than the Cr content of the lower sublayer. The thickness of the upper sublayer is smaller than that of the lower sublayer.

In the spin-valve thin film element shown in FIG. 23, the seed layer 22 has a larger Cr content compared to the conventional art while adequately maintaining the face-centered cubic structure. Thus, each of the layers deposited on the seed layer 22 can have the {111} orientation in the direction parallel to layer surface, and the average crystal grain size of the crystal grains in the direction parallel to the layer surface can be increased.

In this manner, an increase in the resistance of the spin-valve thin film and diffusion between the layers can be prevented. As a result, the resistance to electromigration can be enhanced, and current-carrying reliability can be improved.

In the present invention, the rate of change in resistance ΔR/R and the change in the conductivity ΔG can be increased. Thermal noise can be reduced.

In the present invention, the soft magnetic property of the magnetoresistive layer 20 constituting the spin-valve thin film element can be improved. In particular, the coercive force can be reduced, and the planar crystal magnetic anisotropy energy K at the surface in proportion to the coercive force Hc can be reduced, and the magnetization rotation of the free magnetic layer 1 in response to the external magnetic field can be improved. The single spin-valve thin film element of the present invention thus exhibits improved sensitivity.

The above AMR thin film element of the present invention having the above advantages can sufficiently withstand the high-density sensing current required for the higher-density recording in the near future.

Note that the seed layers 22 in FIG. 23 can be manufactured as in the description above with reference to FIGS. 24 and 25.

Although all the magnetic sensing element shown in FIGS. 19 to 23 comprise the under layer 6, the underlayer 6 is not essential. When the underlayer 6 is not formed, the seed layer 22 must have an increased thickness; otherwise, the seed layer 22 will not have the proper face-centered cubic structure and {111} preferred orientation.

The thickness of the lower sublayer (the layer 27 in FIG. 20 or the layer 23 in FIG. 24) having a smaller Cr content constituting the seed layer 22 is preferably 20 Å or more. At such a thickness, the lower sublayer achieves the {111} orientation while maintaining the fcc structure even when the underlayer 6 is not provided. Especially when the Cr content of the lower sublayer is in the range of 40 to 45 atomic percent, the {111} preferred orientation in the lower sublayer can be adequately achieved by increasing the thickness of the lower sublayer to 45 Å or more even when no underlayer 6 is provided. Since the shunt loss of the sensing current increases with the thickness, the thickness of the lower sublayer is preferably 100 Å or less. When the Cr content of the lower sublayer is small, i.e., in the range of 0 to 40 atomic percent, the underlayer 6 should be formed in order to secure the {111} preferred orientation in such a thin lower sublayer.

In order to ensure formation of the fcc structure and improve the {111} orientation in the seed layer 22, the underlayer 6 is preferably formed. The thickness of the underlayer 6 is, for example, approximately 30 Å. The underlayer 6 helps make a seed layer 22 having an improved {111} orientation in the direction parallel to the layer surface.

In the magnetic sensing elements shown in FIGS. 19 to 23, the crystal boundaries of the antiferromagnetic layer 4 (the exchange bias layers 16 and 21 in FIGS. 21 and 23) and those of the pinned magnetic layer 3 (the free magnetic layer 1 in FIG. 21 and the magnetoresistive layer 20 in FIG. 23) which appear at a cross-section of the magnetic sensing element taken in a direction parallel to the layer thickness direction are preferably discontinuous at least partly at the interface.

More preferably, in the magnetic sensing elements shown in FIGS. 19 to 23, the crystal boundaries of the antiferromagnetic layer 4 (the exchange bias layers 16 and 21 in FIGS. 21 and 23) and those of the seed layer 22 appearing at a cross-section of the magnetic sensing element taken in a direction parallel to the layer thickness direction are at least partly discontinuous at the interface.

Preferably, in the magnetic sensing elements shown in FIGS. 19 to 23, the equivalent crystal planes represented as the {111} planes are preferentially aligned in the planes parallel to the interface between the antiferromagnetic layer 4 (the exchange bias layers 16 and 21 in FIGS. 21 and 23) and the pinned magnetic layer 3 (the free magnetic layer 1 in FIG. 21 and the magnetoresistive layer 20 in FIG. 23).

More preferably, the equivalent crystal axes existing in these crystal planes are at least partly oriented in different directions between the antiferromagnetic layer 4 and the pinned magnetic layer 3.

Preferably, in the magnetic sensing elements shown in FIGS. 19 to 23, the equivalent crystal planes represented as the {111} planes are preferentially aligned in the planes parallel to the interface between the antiferromagnetic layer 4 (the exchange bias layers 16 and 21 in FIGS. 21 and 23) and the seed layer 22. Moreover, at least part of the crystallographically equivalent axes existing in these crystal planes is preferably oriented in different direction between the antiferromagnetic layer 4 and the seed layer 22.

With such an alignment, the so-called non-coherent state can be maintained at the interface between the antiferromagnetic layer 4 and the pinned magnetic layer 3 and at the interface between the antiferromagnetic layer 4 and the seed layer 22. Moreover, the disordered lattice of the antiferromagnetic layer 4 transforms to the ordered lattice by annealing; hence, a large exchange coupling magnetic field can be obtained.

In order to obtain the above-described alignment, the surface of the seed layer 22 must show high wettability, and the seed layer 22 must have the fcc structure. Furthermore, the deposition conditions of the layers formed on the seed layer 22 and the composition of the antiferromagnetic layer 4 should be adequately adjusted.

As described above, the X or X+X' content of the antiferromagnetic layer 4 is preferably in the range of 45 to 60 atomic percent.

As for the deposition condition, the pressure of the Ar gas used during sputter deposition is 3 mTorr. The annealing temperature for inducing the exchange coupling magnetic field between the antiferromagnetic layer 4 and the pinned magnetic layer 3 is in the range of 200 to 300° C. The magnetic annealing is performed in a vacuum of $10^{-6}$ Torr or less for 2 hours. The distance between the substrate and the target is 80 mm.

By controlling the composition of the antiferromagnetic layer 4 and the deposition conditions, the interface between the antiferromagnetic layer 4 and the pinned magnetic layer 3 and the interface between the antiferromagnetic layer 4 and the seed layer 22 can adequately enter the non-coherent state, and a large exchange coupling magnetic field, namely, $1.58 \times 10^4$ (A/m), can be obtained.

FIG. 7 is a cross-sectional view from the face opposing a recording medium, showing the structure of a read head incorporating any one of the magnetic sensing elements shown in FIGS. 19 to 23.

Referring to FIG. 7, a lower gap layer 41 is formed on a lower shield layer 40 composed of a NiFe alloy, for example. On the lower gap layer 41, a magnetic sensing element 42 corresponding to any one of these shown in FIGS. 19 to 23 is formed. An upper gap layer 43 is formed on the magnetic sensing element 42, and an upper shielding layer 44 composed of a NiFe alloy is formed on the upper gap layer 43.

The lower gap layer 41 and the upper gap layer 43 are composed of an insulating material such as $SiO_2$ or $Al_2O_3$ (alumina). As shown in FIG. 7, the length from the bottom face of the lower gap layer 41 to the upper face of the upper gap layer 43 is defined as the gap length G1. The smaller the gap length G1, the more suitable the read head is for a higher recording density.

In this invention, a large exchange coupling magnetic field can still be obtained even when the thickness of the antiferromagnetic layer 4 is small. The thickness of the antiferromagnetic layer 4 is, for example, 70 Å or more.

Compared to the related art which required the antiferromagnetic layer having a thickness of approximately 300 Å, the antiferromagnetic layer 4 of the invention is remarkably thin. Thus, the thin film magnetic head of the present invention with a narrow gap can meet demand for high recording density.

The magnetic sensing element of the present invention can be applied to a magnetic sensor as well as magnetic head installed in a hard disk device.

What is claimed is:

1. An exchange coupled film comprising:
    a nonmagnetic seed layer comprising α and Cr, α being at least one of Fe, Ni, and Co;
    an antiferromagnetic layer; and
    a ferromagnetic layer,
    the seed layer, the antiferromagnetic layer, and the ferromagnetic layer being deposited in that order from the bottom, magnetization of the ferromagnetic layer being directed in a predetermined direction by an exchange coupling magnetic field produced at an interface between the antiferromagnetic layer and the ferromagnetic layer,
    wherein a Cr content of the seed layer is 35 to 60 atomic percent, a thickness of the seed layer is 10 to 200 Å, and
    wherein a crystal structure of the seed layer is a face-centered cubic structure and substantially a single phase, and wherein a body-centered cubic structure is substantially not present.

2. An exchange coupled film according to claim 1, wherein the Cr content is 40 to 60 atomic percent, and the thickness of the seed layer is 10 to 170 Å.

3. An exchange coupled film according to claim 1, wherein the Cr content is 45 to 60 atomic percent, and the thickness of the seed layer is 10 to 130 Å.

4. An exchange coupled film according to claim 1, wherein the Cr content is 40 to 50 atomic percent, and the thickness of the seed layer is 10 to 170 Å.

5. An exchange coupled film according to claim 1, wherein the Cr content is 45 to 55 atomic percent, and the thickness of the seed layer is 10 to 130 Å.

6. An exchange coupled film according to claim 1, wherein the thickness of the seed layer is at most 80 Å.

7. An exchange coupled film according to claim 1, wherein the thickness of the seed layer is at most 60 Å.

8. An exchange coupled film according to claim 1, wherein the seed layer comprises one of a NiFeCr alloy and a NiCr alloy.

9. An exchange coupled film according to claim 8, wherein the seed layer has a composition represented by $(Ni_{100-x}Fe_x)$—Cr, and the atomic ratio x satisfies the relationship 0≦x≦70.

10. An exchange coupled film according to claim 9, wherein the atomic ratio x satisfies the relationship 0≦x≦50.

11. An exchange coupled film according to claim 10, wherein the atomic ratio x satisfies the relationship 0≦x≦30.

12. An exchange coupled film according to claim 1, further comprising an underlayer formed under the seed layer, the underlayer comprising at least one element selected from the group consisting of Ta, Hf, Nb, Zr, Ti, Mo, and W.

13. An exchange coupled film according to claim 1, wherein the seed layer is formed by sputtering.

14. An exchange coupled film according to claim 1, wherein the average crystal grain size in a direction parallel to a layer surface in each layer formed on the seed layer is at least 100 Å.

15. An exchange coupled film according to claim 14, wherein the average crystal grain size is at least 150 Å.

16. An exchange coupled film according to claim 14, wherein the average crystal grain size is at least 170 Å.

17. An exchange coupled film according to claim 1, wherein grain boundaries formed in the antiferromagnetic layer and grain boundaries formed in the ferromagnetic layer which appear in a cross section of the exchange coupled film parallel to a thickness direction are at least partially discontinuous at the interface between the antiferromagnetic layer and the ferromagnetic layer.

18. An exchange coupled film according to claim 1, wherein grain boundaries formed in the antiferromagnetic layer and grain boundaries formed in the seed layer which appear in a cross section of the exchange coupled film parallel to a thickness direction are at least partially discontinuous at an interface between the antiferromagnetic layer and the seed layer.

19. An exchange coupled film according to claim 1, wherein equivalent crystal planes represented as {111} planes in the antiferromagnetic layer and the ferromagnetic layer are preferentially oriented as crystal planes parallel to the interface between the antiferromagnetic layer and the ferromagnetic layer, and at least some of the equivalent crystal axes in the crystal planes are directed in different directions between the antiferromagnetic layer and the ferromagnetic layer.

20. An exchange coupled film according to claim 1, wherein equivalent crystal planes represented as {111} planes in the antiferromagnetic layer and the seed layer are preferentially oriented as crystal planes parallel to the interface between the antiferromagnetic layer and the seed layer, and at least some of the equivalent crystal axes in the crystal planes are directed in different directions between the antiferromagnetic layer and the seed layer.

21. An exchange coupled film according to claim 1, wherein the antiferromagnetic layer comprises X and Mn, wherein X is at least one element selected from the group consisting of Pt, Pd, Ir, Rh, Ru, and Os.

22. An exchange coupled film according to claim 1, wherein the antiferromagnetic layer comprises an X—Mn—X' alloy, wherein X is at least one element selected from the group consisting of Pt, Pd, Ir, Rh, Ru, and Os and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb, and rare-earth elements.

23. An exchange coupled film according to claim 22, wherein the X—Mn—X' alloy is one of an interstitial solid solution in which atoms of X' enter interstices in a space lattice comprising X and Mn and a substitutional solid solution in which atoms of X' are substituted for some atoms at lattice points of a crystal lattice comprising X and Mn.

24. An exchange coupled film according to claim 21, wherein a X content is 45 to 60 atomic percent.

25. An exchange coupled film according to claim 22, wherein a X+X' content is 45 to 60 atomic percent.

26. An exchange coupled film according to claim 1, wherein the antiferromagnetic layer comprises an X—Mn—X' alloy, wherein X is at least one element selected from the group consisting of Pt, Pd, Ir, Rh, Ru, and Os and X' is at least one element selected from the group consisting of Ne, Ar, Kr, and Xe.

27. An exchange coupled film comprising:
a nonmagnetic seed layer comprising α and Cr, α being at least one of Fe, Ni, and Co;
an antiferromagnetic layer; and
a ferromagnetic layer,
the seed layer, the antiferromagnetic layer, and the ferromagnetic layer being deposited in that order from the bottom, magnetization of the ferromagnetic layer being directed in a predetermined direction by an exchange coupling magnetic field produced at an interface between the antiferromagnetic layer and the ferromagnetic layer,
wherein a Cr content of the seed layer is 35 to 60 atomic percent, a thickness of the seed layer is 10 to 200 Å, and a crystal structure of the seed layer is a face-centered cubic structure, and
wherein grain boundaries formed in the antiferromagnetic layer and grain boundaries formed in the ferromagnetic layer which appear in a cross section of the exchange coupled film parallel to a thickness direction are at least partially discontinuous at the interface between the antiferromagnetic layer and the ferromagnetic layer.

28. An exchange coupled film comprising:
a nonmagnetic seed layer comprising α and Cr, α being at least one of Fe, Ni, and Co;
an antiferromagnetic layer; and
a ferromagnetic layer,
the seed layer, the antiferromagnetic layer, and the ferromagnetic layer being deposited in that order from the bottom, magnetization of the ferromagnetic layer being directed in a predetermined direction by an exchange coupling magnetic field produced at an interface between the antiferromagnetic layer and the ferromagnetic layer,
wherein a Cr content of the seed layer is 35 to 60 atomic percent, a thickness of the seed layer is 10 to 200 Å, and a crystal structure of the seed layer is a face-centered cubic structure, and
wherein grain boundaries formed in the antiferromagnetic layer and grain boundaries formed in the seed layer which appear in a cross section of the exchange coupled film parallel to a thickness direction are at least partially discontinuous at an interface between the antiferromagnetic layer and the seed layer.

29. An exchange coupled film comprising:
a nonmagnetic seed layer comprising α and Cr, α being at least one of Fe, Ni, and Co;
an antiferromagnetic layer; and
a ferromagnetic layer,
the seed layer, the antiferromagnetic layer, and the ferromagnetic layer being deposited in that order from the bottom, magnetization of the ferromagnetic layer being directed in a predetermined direction by an exchange coupling magnetic field produced at an interface between the antiferromagnetic layer and the ferromagnetic layer,
wherein a Cr content of the seed layer is 35 to 60 atomic percent, a thickness of the seed layer is 10 to 200 Å, and a crystal structure of the seed layer is a face-centered cubic structure, and
wherein equivalent crystal planes represented as {111} planes in the antiferromagnetic layer and the ferromagnetic layer are preferentially oriented as crystal planes parallel to the interface between the antiferromagnetic layer and the ferromagnetic layer, and at least some of the equivalent crystal axes in the crystal planes are directed in different directions between the antiferromagnetic layer and the ferromagnetic layer.

30. An exchange coupled film comprising:

a nonmagnetic seed layer comprising α and Cr, α being at least one of Fe, Ni, and Co;

an antiferromagnetic layer; and a ferromagnetic layer, the seed layer, the antiferromagnetic layer, and the ferromagnetic layer being deposited in that order from the bottom, magnetization of the ferromagnetic layer being directed in a predetermined direction by an exchange coupling magnetic field produced at an interface between the antiferromagnetic layer and the ferromagnetic layer, wherein a Cr content of the seed layer is 35 to 60 atomic percent, a thickness of the seed layer is 10 to 200 Å, and a crystal structure of the seed layer is a face-centered cubic structure, and wherein equivalent crystal planes represented as {111} planes in the antiferromagnetic layer and the seed layer are preferentially oriented as crystal planes parallel to the interface between the antiferromagnetic layer and the seed layer, and at least some of the equivalent crystal axes in the crystal planes are directed in different directions between the antiferromagnetic layer and the seed layer.

31. An exchange coupled film comprising:

a nonmagnetic seed layer comprising α and Cr, α being at least one of Fe, Ni, and Co;

an antiferromagnetic layer; and a ferromagnetic layer, the seed layer, the antiferromagnetic layer, and the ferromagnetic layer being deposited in that order from the bottom, magnetization of the ferromagnetic layer being directed in a predetermined direction by an exchange coupling magnetic field produced at an interface between the antiferromagnetic layer and the ferromagnetic layer, wherein a Cr content of the seed layer is 35 to 60 atomic percent, a thickness of the seed layer is 10 to 200 Å, and a crystal structure of the seed layer is a face-centered cubic structure, wherein the antiferromagnetic layer comprises an X—Mn—X' alloy, wherein X is at least one element selected from the group consisting of Pt, Pd, Ir, Rh, Ru, and Os and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb, and rare-earth elements, and wherein the X—Mn—X' alloy is one of an interstitial solid solution in which atoms of X' enter interstices in a space lattice comprising X and Mn and a substitutional solid solution in which atoms of X' are substituted for some atoms at lattice points of a crystal lattice comprising X and Mn.

32. An exchange coupled film comprising:

a nonmagnetic seed layer comprising α and Cr, α being at least one of Fe, Ni, and Co;

an antiferromagnetic layer; and a ferromagnetic layer, the seed layer, the antiferromagnetic layer, and the ferromagnetic layer being deposited in that order from the bottom, magnetization of the ferromagnetic layer being directed in a predetermined direction by an exchange coupling magnetic field produced at an interface between the antiferromagnetic layer and the ferromagnetic layer, wherein a Cr content of the seed layer is 35 to 60 atomic percent, a thickness of the seed layer is 10 to 200 Å, and a crystal structure of the seed layer is a face-centered cubic structure, wherein the antiferromagnetic layer comprises X and Mn, wherein X is at least one element selected from the group consisting of Pt, Pd, Ir, Rh, Ru, and Os, and wherein a X content is 45 to 60 atomic percent.

33. An exchange coupled film comprising:

a nonmagnetic seed layer comprising α and Cr, α being at least one of Fe, Ni, and Co;

an antiferromagnetic layer; and a ferromagnetic layer, the seed layer, the antiferromagnetic layer, and the ferromagnetic layer being deposited in that order from the bottom, magnetization of the ferromagnetic layer being directed in a predetermined direction by an exchange coupling magnetic field produced at an interface between the antiferromagnetic layer and the ferromagnetic layer, wherein a Cr content of the seed layer is 35 to 60 atomic percent, a thickness of the seed layer is 10 to 200 Å, and a crystal structure of the seed layer is a face-centered cubic structure, wherein the antiferromagnetic layer comprises an X—Mn—X' alloy, wherein X is at least one element selected from the group consisting of Pt, Pd, Ir, Rh, Ru, and Os and X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb, and rare-earth elements, and wherein a X+X' content is 45 to 60 atomic percent.

* * * * *

UNITED STATES PATENT AND TRADEMARK OFFICE
CERTIFICATE OF CORRECTION

PATENT NO. : 7,050,275 B2
APPLICATION NO. : 10/079292
DATED : May 23, 2006
INVENTOR(S) : Naoya Hasegawa et al.

It is certified that error appears in the above-identified patent and that said Letters Patent is hereby corrected as shown below:

Column 56, in claim 9, line 4, delete "0%x%70" and substitute --$0 \leq x \leq 70$-- in its place.

Column 56, in claim 10, line 3, delete "0%x%50" and substitute --$0 \leq x \leq 50$-- in its place.

Column 56, in claim 11, line 3, delete "0%x%30" and substitute --$0 \leq x \leq 30$-- in its place.

Signed and Sealed this

Ninth Day of January, 2007

JON W. DUDAS
*Director of the United States Patent and Trademark Office*